(12) United States Patent
Patra et al.

(10) Patent No.: US 10,133,183 B2
(45) Date of Patent: Nov. 20, 2018

(54) OPTICAL COMPONENT

(71) Applicant: Carl Zeiss SMT GmbH, Oberkochen (DE)

(72) Inventors: Michael Patra, Oberkochen (DE); Markus Deguenther, Aalen (DE); Paul Buettner, Aalen (DE); Willi Heintel, Aalen (DE); Henner Baitinger, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/257,020

(22) Filed: Sep. 6, 2016

(65) Prior Publication Data

US 2016/0370707 A1 Dec. 22, 2016

Related U.S. Application Data

(63) Continuation of application No. PCT/EP2015/055017, filed on Mar. 11, 2015.

(30) Foreign Application Priority Data

Mar. 14, 2014 (DE) .................... 10 2014 204 818

(51) Int. Cl.
*G03B 27/52* (2006.01)
*G03F 7/20* (2006.01)
(Continued)

(52) U.S. Cl.
CPC ....... *G03F 7/70091* (2013.01); *G02B 5/0891* (2013.01); *G02B 5/09* (2013.01);
(Continued)

(58) Field of Classification Search
CPC ............ G02B 26/0833; G02B 27/0068; G02B 5/0891; G02B 5/09; G02B 21/0032; G02B 26/101; G02B 26/105; G02B 27/0176; G02B 27/141; G02B 7/1821; G02B 2027/0118; G02B 21/0044; G02B 5/0816;
(Continued)

(56) References Cited

U.S. PATENT DOCUMENTS 6,859,515 B2    2/2005  Schultz et al.
2006/0232867 A1 10/2006  Mann et al.
(Continued)

FOREIGN PATENT DOCUMENTS

DE           41 33 108 A1     4/1993
DE    10 2006 056 035 A1     5/2008
(Continued)

OTHER PUBLICATIONS

German Office Action, with translation thereof, for corresponding DE Appl No. 10 2014 204 818.4, dated Jan. 23, 2015.
(Continued)

*Primary Examiner* — Mesfin Asfaw
(74) *Attorney, Agent, or Firm* — Fish & Richardson P.C.

(57) ABSTRACT

An optical component for a projection exposure apparatus includes a multiplicity of variably positionable beam-guiding elements which serve as pupil facets. The optical component can be arranged in the beam path of the projection optical unit.

19 Claims, 42 Drawing Sheets

(51) Int. Cl.
*G02B 5/08* (2006.01)
*G02B 5/09* (2006.01)
*G02B 26/08* (2006.01)
*G02B 27/00* (2006.01)

(52) U.S. Cl.
CPC ..... *G02B 26/0833* (2013.01); *G02B 27/0068* (2013.01); *G03F 7/70116* (2013.01)

(58) Field of Classification Search
CPC ............ G02B 19/0028; G02B 19/0095; G02B 2027/011; G02B 2027/012
See application file for complete search history.

(56) References Cited

U.S. PATENT DOCUMENTS

| | | | |
|---|---|---|---|
| 2008/0123807 A1 | 5/2008 | Warm et al. | |
| 2008/0212059 A1* | 9/2008 | Warm | G03F 7/70083 355/68 |
| 2013/0188163 A1 | 7/2013 | Ruoff et al. | |
| 2014/0111785 A1 | 4/2014 | Hennerkes et al. | |

FOREIGN PATENT DOCUMENTS

| | | |
|---|---|---|
| DE | 10 2009 032 194 A1 | 4/2010 |
| DE | 10 2010 041 623 A1 | 3/2012 |
| DE | 10 2011 078 928 A1 | 1/2013 |
| DE | 10 2012 213 937 A1 | 5/2013 |
| WO | WO 2010/049 076 A2 | 5/2010 |

OTHER PUBLICATIONS

Translation of International Search Report for corresponding PCT Appl No. PCT/EP2015/055017, dated Jun. 24, 2015.

\* cited by examiner

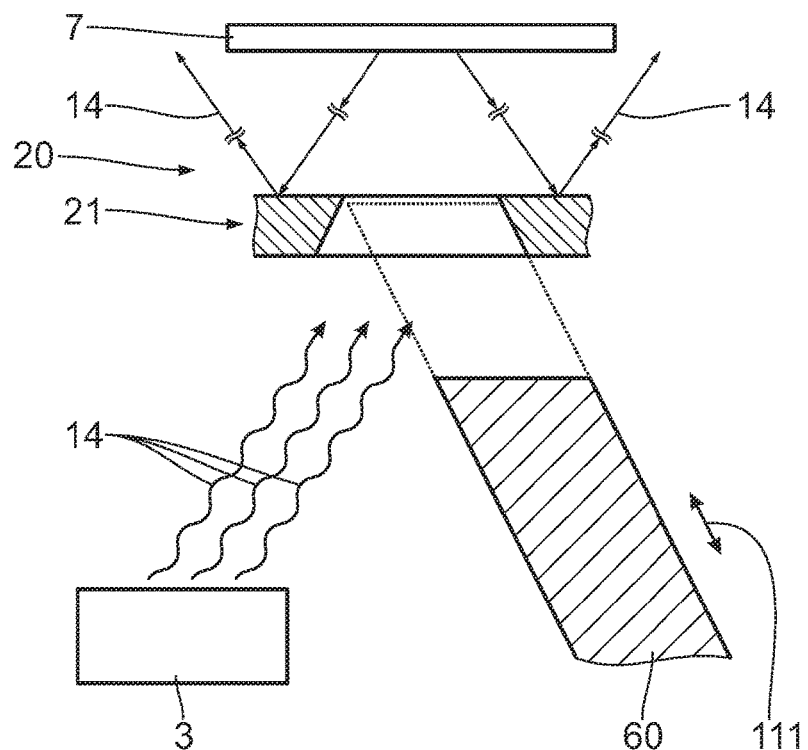
Fig. 48
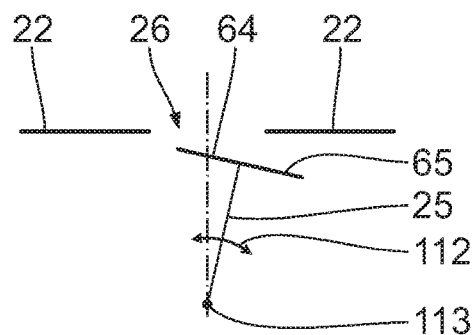 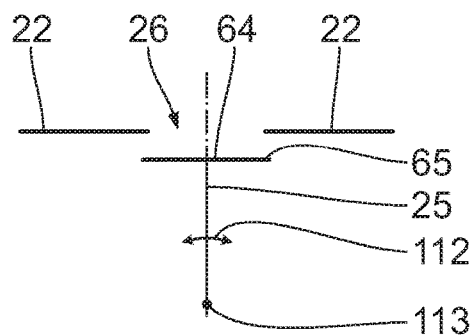
Fig. 49a  Fig. 49b

OPTICAL COMPONENT

CROSS-REFERENCE TO RELATED APPLICATIONS

The present application is a continuation of, and claims benefit under 35 USC 120 to, international application PCT/EP2015/055017, filed Mar. 11, 2015, which claims benefit under 35 USC 119 of German Application No. 10 2014 204 818.4, filed Mar. 14, 2014. The entire disclosure of international application PCT/EP2015/055017 and German Application No. 10 2014 204 818.4 are incorporated by reference herein.

FIELD

The disclosure relates to an optical component for a projection exposure apparatus. The disclosure furthermore relates to a mirror device and a mirror for a projection optical unit. Furthermore, the disclosure relates to an illumination optical unit, an illumination system and a projection optical unit for a projection exposure apparatus, an optical system and a projection exposure apparatus. In addition, the disclosure relates to a method for producing a microstructured or nanostructured component, and such a component.

BACKGROUND

A mirror for illuminating a reticle with a small chief ray angle is known from e.g. DE 10 2010 041 623 A1.

SUMMARY

The present disclosure seeks to improve an optical component, a mirror and a mirror device for a projection exposure apparatus, in particular an EUV projection exposure apparatus.

In particular, the disclosure seeks to provide an optical component in such a way that the imaging of the reticle in the case of an illumination with small chief ray angles, in particular in the case of a perpendicular illumination, is improved. A perpendicular illumination corresponds to a chief ray angle (CRA) of 0°.

In one aspect, the disclosure provides an optical component for a projection exposure apparatus. The optical component includes a multiplicity of variably positionable beam-guiding elements, at least one mechanical guide device, and at least one displaceable positioning element. The displaceable positioning component is guided by the guide device for positioning at least one of the beam-guiding elements in each case. There is a normal direction such that an image of the guide device is in a plane without intersection with a predetermined circular ring area in the case of a perpendicular projection along this normal direction. At least one beam-guiding element is assigned to each positioning element in each case. The beam-guiding element is variably positionable via the positioning element. The beam-guiding elements are each displaceable into at least one reflection position in such a way that an image of one of the beam-guiding elements in this reflection position is in each case at least partly overlapping with the predetermined circular ring area in the case of a perpendicular projection along the normal direction The disclosure also provides a mirror device including such a component and a mirror device including a mirror body and at least one beam-guiding element which is able to be placed onto the mirror body.

Moreover, the disclosure provides a mirror, the total reflection surface of which has a changeable embodiment.

The core of the disclosure consists of developing an optical component including a multiplicity of beam-guiding elements in such a way that the latter are variably positionable in each case via a positioning element which is displaceable in a guided manner by way of a guide device. In particular, the beam-guiding elements are each displaceable into at least one reflection position in such a way that an image of the beam-guiding element in this reflection position is at least partly overlapping, in particular completely overlapping, with the predetermined circular ring area in the case of a perpendicular projection along the normal direction.

Preferably, the guide device is embodied in such a way that it does not lead to shadowing of a predetermined circular ring area, at least at small chief ray angles. The circular ring area can also be a circular area, i.e. a circular ring area with an internal radius equaling zero. In particular, the circular area can be provided by the reflection surface of a mirror or by a perimeter around such a reflection surface.

The beam-guiding elements form facet elements in particular; in particular, they form facets of a facet mirror. Below, they are also referred to as facet elements. In particular, the optical component can form a constituent of a pupil facet mirror. The optical component forms a pupil facet mirror in particular, in particular an adjustable pupil facet mirror. As a result of the variable positionability of the beam-guiding elements, a multiplicity of different arrangements of same, i.e. a multiplicity of illumination settings, are possible, without this leading to increased vignetting. As a result of this, the imaging quality of the projection exposure apparatus is improved.

The beam-guiding elements are, in particular, mirrors or grating-like elements, in particular diffraction gratings. In particular, these are optical elements which lead to a beam deflection.

The beam-guiding elements can have a polygonal embodiment, in particular a rectangular embodiment, in particular a square embodiment, a triangular embodiment or a hexagonal embodiment. They can also have a round, in particular circle-shaped embodiment They each have a beam-guiding surface, in particular a reflection surface, in the range of 0.1 mm$^2$ to 100 mm$^2$, in particular in the range of 4 mm$^2$ to 25 mm$^2$. In particular, the beam-guiding surface is substantially smaller than the predetermined circular ring area. In particular, it is at most $1/100$, in particular at most $1/1000$, in particular at most $1/10,000$ of the predetermined circular ring area in each case.

In accordance with an aspect of the disclosure, the number of beam-guiding elements is in the range of 1 to 200, in particular in the range of 15 to 150, in particular in the range of 20 to 100.

In particular, the beam-guiding elements can be EUV mirrors or EUV gratings, i.e. elements for reflecting or diffracting EUV radiation. In the case of the grating this can be, in particular, a so-called blazed grating.

The beam-guiding elements can each be embodied as a microelectromechanical system (MEMS). In particular, they can include a multiplicity of micromirrors. The number of micromirrors per beam-guiding element is, in particular, in the range of 1 to 1000, in particular in the range of 2 to 500, in particular in the range of 4 to 300, in particular in the range of 9 to 150. They can have a plane or curved embodiment.

It is possible that exactly one beam-guiding element is assigned to each positioning element in each case. It is also possible to assign more than one beam-guiding element, in particular at least two, in particular at least three, in particular at least four beam-guiding elements to some or all of the positioning elements. The number of beam-guiding elements per positioning element can also vary. In particular, it is possible to arrange a single beam-guiding element on some of the positioning elements in each case, while other positioning elements each have assigned to them two, three or more beam-guiding elements.

The beam-guiding elements can be fixedly connected to the respectively assigned positioning element. This simplifies production. However, they can also be connected to the positioning element in an adjustable, in particular displaceable manner. This leads to an increased flexibility in the arrangement of the beam-guiding elements. In particular, the beam-guiding elements can be arranged at the respective positioning element in a displaceable manner, in particular in a rotatable and/or swivelable manner. In particular, they can be arranged at the respective positioning element in a manner displaceable by an actuator system, in particular in a rotatable and/or swivelable manner.

In particular, it is possible to arrange the beam-guiding elements in such a way that two beam-guiding elements in each case are arranged in a point-symmetrical manner in relation to a central axis of the optical component. In particular, it is possible in each case to assign a single, common positioning element to these two elements. In particular, the central axis can be aligned in the direction of the normal or define this direction. In particular, the central axis can be an axis of symmetry of the mechanical guide device, in particular of the optical component.

In particular, the guide device is embodied as a guide rail. In particular, it is embodied as a runner, on which a carriage is displaceable in a guided manner. The carriage can be a constituent of the guide device. It can also be a constituent of the positioning element in each case. The positioning element can also be arranged at a fixed position on the guide device, in particular on the guide rail. In particular, it can be connected to the guide device in such a way that it is stationary relative to the latter in the tangential direction of the guide device. In this case, it can preferably be displaceable across the tangential direction of the guide device and/or be connected to the latter in a manner swivelable relative to the guide device.

In particular, the rail has a profiled embodiment. As a result of this, the stability and/or the precision of the positioning of the carriage, in particular of the positioning element, can be improved. In particular, the rail does not have a circular cross section.

The rail can extend in a single plane. It can also have an aplanar, i.e. three-dimensional embodiment. In particular, it can have a roller-coaster-like embodiment. As a result of this, a further degree of freedom can be achieved for the arrangement of the positioning elements with the beam-guiding elements. In particular, the rail can have a smallest cuboid sleeve, the side lengths of which in each case are at least twice as large as the largest diameter of the cross section of the rail.

The guide device can include one or more guide rails. In particular, it can include at least one outer guide rail and at least one inner guide rail. Here, the outer guide rails are arranged outside of the predetermined circular ring area. Here, the inner guide rails are arranged in the interior of the predetermined circular ring area. In particular, inner guide rails are provided in conjunction with a projection optical unit with a central obscuration. In particular, the circular ring area can be given by the dimensions of a mirror of the projection optical unit, in the region of which the optical component is intended to be arranged. In particular, the guide device is embodied and arranged in this case in such a way that it does not lead to an obscuration of this mirror during the operation of the projection exposure apparatus.

The guide rails can have a circular embodiment. They can be arranged concentrically in relation to one another.

In particular, the guide rails have a dimensionally stable embodiment. In particular, they can be made of metal. They can be cooled via a cooling device.

In accordance with one exemplary embodiment of the disclosure, provision is made for the guide rails to be embodied to be displaceable, in particular rotatable and/or interchangeable as a whole.

Preferably, the positioning element has a rod-shaped embodiment. In particular, it is embodied as a pointer. In particular, it is also referred to as a pointer.

In general, the mechanical component, by which the positioning element is mechanically connected to another optical component of a projection optical unit, in particular to a mirror of the projection optical unit, in particular positioned relative thereto, forms a guide device for this positioning element.

In particular, it has an aspect ratio of at least 3:1, in particular at least 5:1, in particular at least 10:1. In particular, it has a small cross section. This ensures that it only leads to very little shadowing. In particular, the cross section of the positioning element can be less than 1 cm$^2$, in particular less than 1 mm$^2$. It has a width of less than 5 mm, in particular less than 2 mm, in particular of less than 1 mm, in particular in a direction perpendicular to the normal direction.

In particular, the positioning element has a dimensionally stable embodiment. It can have a profiled cross section. As a result, the rigidity thereof can be increased. In particular, it can have an H-shaped, T-shaped or O-shaped cross section.

In particular, the positioning element is embodied in such a way that, in the case of a projection in the normal direction, it has a surface area which is at most as large as the surface area of one of the beam-guiding elements. In particular, the surface area of the positioning element in the case of a projection in the normal direction is less than the surface area of the associated beam-guiding element. In particular, it is at most 0.5 times the size, in particular at most 0.2 times the size, in particular at most 0.1 times the size of the surface area of the associated beam-guiding element.

The positioning element is actuatable in accordance with one aspect of the disclosure. In particular, it is displaceable, in particular slidable relative to the guide device. In particular, it can be slidable via the carriage. In particular, at least one of the beam-guiding elements is respectively displaceable, in particular slidable, in particular slidable in the direction perpendicular to the normal direction, with the aid of the positioning element.

The positioning element is swivelable in accordance with a further aspect of the disclosure. In particular, it is swivelable relative to the guide device. It can be swivelable in a plane perpendicular to the normal direction. It can also be swivelable about an axis which is at an angle or perpendicular to the normal direction. It can also have more than one swiveling degree of freedom.

The positioning element is length-adjustable in accordance with a further aspect of the disclosure. In particular, it can be adjustable, in particular slidable relative to the guide device in a radial direction. The positioning element can be fixedly connected to the guide device in a tangential direction relative to the latter.

The positioning element in each case has one actuator for each degree of freedom in accordance with a further aspect of the disclosure.

In accordance with a further aspect of the disclosure, the beam-guiding element is in each case positionable in precisely one or at least one on-position via the associated positioning element, in which the beam-guiding element is arranged in an at least partly overlapping, in particular completely overlapping manner in relation to the circular ring area. These specifications in each case relate to a perpendicular projection along the normal direction.

In accordance with a further aspect of the disclosure, the beam-guiding element is in each case positionable in precisely one or at least one off position via the associated positioning element, in which position the respectively assigned beam-guiding element is arranged outside or inside of the circular ring area, in particular completely without overlap. To the extent that the circular ring is selected in such a way that it specifies the footprint of the illumination radiation in the projection optical unit, i.e. the region within which illumination radiation used for imaging the reticle on the wafer propagates, in particular level with the optical component relative to the optical axis, this means that the beam-guiding element is arranged outside of the region in the off position and therefore does not lead to obscuration or vignetting.

In accordance with a further aspect of the disclosure, the positioning element is continuously adjustable in at least one degree of freedom, in particular in all degrees of freedom. As an alternative thereto, it can assume only discrete, predetermined positions in one or more, in particular all degrees of freedom.

In accordance with a further aspect of the disclosure, the beam-guiding element is in each case positionable via the associated positioning element with the precision of at least 1 mm, in particular at least 300 μm, in particular at least 100 μm, in particular at least 30 μm, in particular at least 10 μm.

The positioning elements can all have the same length. They can also have different lengths. In particular, they can have the selection of two, three, four, five or more different lengths.

In particular, it is possible that the positioning elements arranged on the guide device have a predetermined sequence of different lengths, in particular alternating lengths.

The positioning elements are individually adjustable in accordance with one aspect of the disclosure. They can also be adjustable in pairs or in groups. In particular, they can be adjustable independently of one another.

The embodiment of the guide device and of the positioning elements and/or the arrangement of the beam-guiding elements at the positioning elements renders possible a very flexible positioning of the beam-guiding elements within the predetermined circular ring-shaped region. In particular, the optical component forms a flexibly adjustable, fractionated mirror. In particular, it forms an adjustable mirror with a fractionated, i.e. non-connected reflection surface.

The adjustability of the beam-guiding elements can be controllable, in particular regulable. In particular, it is variable, in particular controllable, in particular regulable during the operation of the projection exposure apparatus.

In particular, the beam-guiding elements have at least one, in particular at least two positioning degrees of freedom, i.e. degrees of freedom in relation to the positioning thereof relative to the guide device.

The beam-guiding elements have an adjustable orientation in accordance with a further aspect of the disclosure. In particular, they are rotatable and/or swivelable at each predetermined positioning. They each have at least one, in particular at least two corresponding degrees of freedom, in particular rotational degrees of freedom or translational degrees of freedom. Hence, the beam-guiding effect of the beam-guiding elements is adaptable to different positionings.

In particular, the beam-guiding elements have at least one, in particular at least two orientation degrees of freedom, i.e. degrees of freedom in relation to the orientation thereof, in particular relative to the normal direction.

In particular, the orientation thereof is in each case adjustable in such a way that they each forward a beam incident thereon during the operation of the projection exposure apparatus to an object field in an object field plane. A radiation angle distribution, i.e. an illumination setting, for illuminating the reticle is predetermined by the arrangement of the beam-guiding elements with such an orientation.

A mirror device according to the disclosure for a projection optical unit includes a mirror with at least one reflection surface, in particular precisely one reflection surface, in particular a closed, i.e. simply connected reflection surface, and an optical component in accordance with the preceding description.

A mirror device according to the disclosure can also include a mirror with at least one reflection surface, in particular a closed, i.e. simply connected reflection surface, and at least one beam-guiding element which is placeable onto the mirror. The beam-guiding element is variably positionable, in particular displaceable, in particular slidable or movable, in particular relative to the reflection surface. It can be connected to the reflection surface by way of an actuator system and be displaceable relative to the reflection surface.

In accordance with one aspect of the disclosure, the beam-guiding elements have, in particular, an actuator system which is mechanically connected to the reflection surface of the mirror.

In particular, the mirror serves as a constituent of the projection optical unit. In particular, it can form the first mirror $M_1$ or the second mirror $M_2$ in the beam path of the projection optical unit. Here, the mirrors of the projection optical unit are counted along the beam path of the projection optical unit, proceeding from the reticle.

In particular, the optical component is arranged relative to the mirror in such a way that the beam-guiding elements of same are arranged in a contact-free manner in relation to the reflection surface of the mirror. In particular, the beam-guiding elements are arrangeable at a small distance from the reflection surface of the mirror. The distance between the beam-guiding elements in the reflection position thereof or in the reflection positions thereof, in particular in all reflection positions thereof, and the reflection surface of the mirror is, in particular, at most 10 cm, in particular at most 3 cm, in particular at most 1 cm, in particular at most 3 mm, in particular at most 1 mm. Here, the distance specifies, in particular, the distance in the direction of the normal of the reflection surface of the mirror.

Shadowing effects can be reduced by a small distance between the beam-guiding elements and the reflection surface of the mirror.

In particular, the beam-guiding elements can be interchangeable. This is possible, in particular, in the embodiment with beam-guiding elements which are placeable on the mirror body.

The beam-guiding elements which are placeable on the mirror body can form pupil facets.

The beam-guiding elements are fixable at the mirror in accordance with one aspect of the disclosure. In particular, they can have holding elements which can engage in holding devices at the mirror fitting therewith. In particular, they can have protrusions, in particular rod-like protrusions, which can be inserted, in particular clamped, in bores in the mirror body. In other words, the rod-shaped protrusions form holding pins. The holding pins can have a resilient embodiment.

In accordance with a further aspect of the disclosure, the placeable beam-guiding elements can be fastened magnetically to the mirror. In particular, it is possible for permanent magnets to be arranged on the rear side of the mirror, i.e. on the side of the mirror opposite to the reflection surface, via which magnets the placeable beam-guiding elements are affixable on the reflection surface.

In particular, the beam-guiding elements are placeable on the reflection surface of the mirror.

In particular, the magnets on the rear side of the mirror are fixedly connected to the mirror body. They can also be slidable and/or interchangeable.

In particular, the placeable beam-guiding elements have a beam-guiding surface, in particular a reflection surface which corresponds to the surface of the beam-guiding elements of the optical component described above.

In accordance with a further aspect of the disclosure, the totality of the beam-guiding elements in the case of a perpendicular projection along the normal direction has a surface area, the ratio of which to the reflection surface of the mirror is at most 1:10, in particular at most 1:30, in particular at most 1:100, in particular at most 1:300, in particular at most 1:1000. The ratio of the surface area of the totality of the beam-guiding elements to the reflection surface of the mirror is also referred to as fill factor. This specification relates, in particular, to the totality of the beam-guiding elements which are situated in a reflection position. In this case, it is possible to ignore beam-guiding elements which do not overlap with the reflection surface of the mirror in the case of a perpendicular projection along the normal direction.

Preferably, the corresponding surface area of all positioning elements is at most half, in particular at most 1/10, in particular at most 1/30, in particular at most 1/100 of the area of the totality of the beam-guiding elements. What can be achieved hereby is that the beam-guiding elements and, in particular, the positioning elements lead to very low vignetting.

A further aspect of the disclosure relates to a mirror for a projection optical unit of a projection exposure apparatus, including an overall reflection surface, the topography of which has a changeable embodiment.

In particular, the overall reflection surface can be adjustable, at least in regions. In particular, it can be composed from a multiplicity of displaceable individual mirrors.

The individual mirrors can each have a planar reflection surface. They can also have a curved reflection surface. In particular, it is possible to predetermine a form of the overall reflection surface of the mirror and to embody the individual mirrors in such a way that they each have an individual mirror reflection surface which corresponds to a portion of this overall reflection surface.

In particular, the individual mirrors each have at least one, in particular at least two swiveling degrees of freedom. In particular, the swivelability of the individual mirrors can be at least 1 mrad per swiveling degree of freedom. They can also have at least one, in particular at least two translational degrees of freedom. In particular, the linear displaceability of the individual mirrors can be at least 10 µm. In particular, the mirror can be embodied as a multi-mirror array (MMA). In particular, it can be embodied as a microelectromechanical system (MEMS).

Such a mirror increases the flexibility of the projection optical unit.

In accordance with a further aspect of the disclosure, the overall reflection surface of the mirror can also have a flexible, in particular elastic embodiment. In particular, it has a flexible, in particular elastic membrane. In particular, it can be deformed via displaceable elements arranged on the rear side of the mirror, in particular via a matrix-like arrangement of stamps. An advantage of such an embodiment consists of the overall reflection surface having a simply connected, continuous embodiment. In particular, it does not have sharp edges at which diffraction effects could occur.

The disclosure also seeks to improve an illumination optical unit for a projection exposure apparatus. The disclosure provides an illumination optical unit including at least one facet mirror, which has an optical component in accordance with the preceding description. The facet mirror can also be formed by the optical component. In particular, the optical component can form a pupil facet mirror. The number of beam-guiding elements preferably corresponds exactly to the number of provided illumination channels of the illumination optical unit.

The disclosure also seeks to improve an illumination system for a projection exposure apparatus. The disclosure provides an illumination system including an illumination optical unit according to the description above and a radiation source.

In particular, the radiation source can be an EUV radiation source.

The disclosure also seeks to improve a projection optical unit for a projection exposure apparatus.

The disclosure provides a projection optical unit including a mirror device with an optical component in accordance with the description above and/or with a mirror with a changeable overall reflection surface in accordance with the description above.

In accordance with one aspect of the disclosure, the projection optical unit includes a mirror which is formed from a multiplicity of displaceable individual mirrors. In particular, the mirror is an MMA. In particular, this can be a MEMS-MMA.

In accordance with one aspect of the disclosure, the optical component is arranged near the pupil. In particular, it is arranged in such a way that the beam-guiding elements are arranged or arrangeable in the region of a pupil plane. In the case of a curved pupil surface, the beam-guiding elements of the optical component are arranged in the region of this surface in particular. Here, a surface is the to be near to the pupil if D (CR)<0.1 (D(SA)+D(CR)), where D(SA) is the diameter of a sub-aperture of the surface and D(CR) specifies the maximum distance of chief rays of an effective object field imaged by the lens, measured in a reference plane, on the surface.

Further aspects of the disclosure consist of improving an optical system and a projection exposure apparatus. These aspects are achieved by an optical system and projection exposure apparatus including an illumination optical unit or a projection optical unit in accordance with the description above.

The advantages are evident from those of the illumination optical unit or the projection optical unit. In particular, the imaging of a reticle on a wafer will improve as a result of the improved optical quality, in particular on account of the reduced vignetting.

In accordance with one aspect of the disclosure, the optical system includes a mirror device in accordance with the description above, wherein the beam-guiding elements are arranged in the beam path of the illumination optical unit, i.e. upstream of the object field in which a reticle is arranged, while the reflection surface of the mirror is arranged in the beam path of the projection optical unit, i.e. in the beam path between the object field and the image field.

Therefore, the mirror device forms, firstly, a constituent of the illumination optical unit and, secondly, a constituent of the projection optical unit.

Via the optical system, it is possible, in particular, to illuminate the reticle with a large object-side numerical aperture (NAO) and a small chief ray angle (CRA). It holds true in particular that: CRA≤arcsin (NAO), in particular CRA≤arcsin (NAO). Here, preferably, the following applies: CRA≤6°, in particular CRA≤3°, in particular CRA≤2°, in particular CRA≤1°, in particular CRA=0°. In particular, the object-side numerical aperture (NAO) is at least 0.45, in particular at least 0.5, in particular at least 0.6, in particular at least 0.7. The optical system has a reduction of at most 8:1, in particular at most 6:1, preferably at most 4:1.

Further objects of the disclosure are to improve a method for producing a microstructured or nanostructured component and a component produced thus. According to the disclosure, these objects are achieved by virtue of a projection exposure apparatus in accordance with the description above being used for producing the microstructured or nanostructured component. The advantages are evident from those of the projection exposure apparatus.

BRIEF DESCRIPTION OF THE DRAWINGS

Further advantages and details of the disclosure are evident from the description of the exemplary embodiments with reference to the drawings. In the figures:

FIG. 48 shows a further variant of the mirror device with a variably closable passage opening, wherein a linear movement is provided for closing purposes, FIGS. 49a and 49b show a further variant of the mirror device including a passage opening which is variably closable, wherein a swivel movement is provided for closing the passage opening.

DETAILED DESCRIPTION OF EXEMPLARY EMBODIMENTS

Figure 1:
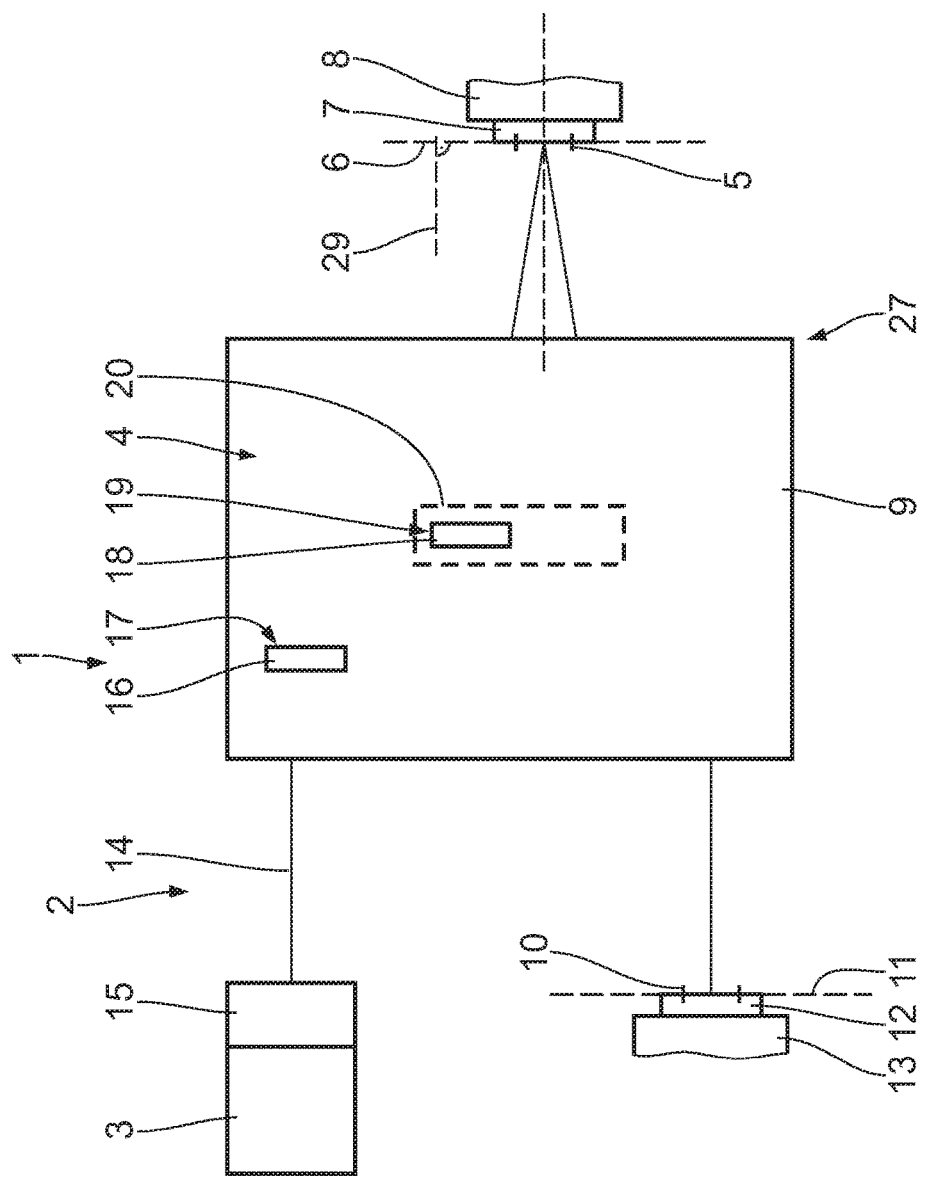
FIG. 1 shows a schematic illustration of the components of an EUV projection exposure apparatus.

FIG. 1 schematically shows the components of a projection exposure apparatus 1 for microlithography in a meridional section. An illumination system 2 of the projection exposure apparatus 1 includes, besides a radiation source 3, an illumination optical unit 4 for the exposure of an object field 5 in an object plane 6. Here, a reticle 7 arranged in the object field 5, which reticle is held by a reticle holder 8 (only depicted in sections here), is exposed.

A projection optical unit 9 serves for imaging the object field 5 into an image field 10 in an image plane 11. A structure on the reticle 7 is imaged on a light-sensitive layer of a wafer 12 held by a wafer holder 13 that is likewise depicted schematically here, the wafer being arranged in the region of the image field 10 in the image plane 11.

In respect of details of the projection exposure apparatus 1, reference is made, moreover, to DE 10 2010 041 623 A1 and DE 10 2011 086 345 A1, which are herewith integrated as a constituent of the present application.

An optical system 27 according to the disclosure includes the illumination optical unit 4 and the projection optical unit 9. The optical system 27 according to the disclosure has a mirror device 20, which is yet to be described in more detail below.

The radiation source 3 is, in particular, an EUV radiation source which emits illumination radiation 14 in the form of an EUV radiation. The wavelength of the emitted used radiation of the radiation source 3 lies, in particular, in the range of 5 nm to 30 nm. Other wavelengths which find use in lithography and for which suitable light sources are available are also possible.

The radiation source 3 can be a plasma source, for example a DPP source or an LPP source. A radiation source based on a synchrotron can also be used as a radiation source 3. Information about such a radiation source can be found by the person skilled in the art for example in U.S. Pat. No. 6,859,515 B2. A collector 15 is provided for focusing the illumination radiation 14 from the radiation source 3.

The illumination optical unit 4 includes a field facet mirror 16 with a multiplicity of field facets 17. The field facet mirror 16 is arranged in a plane of the illumination optical unit 4 which is optically conjugate with respect to the object plane 6. The EUV radiation 14 is reflected from the field facet mirror 16 to a pupil facet mirror 18 of the illumination optical unit 4. The pupil facet mirror 18 has a multiplicity of pupil facets 19. With the aid of the pupil facet mirror 18, the field facets 17 of the field facet mirror 16 are imaged into the object field 5.

There is at least one associated pupil facet 19 on the pupil facet mirror 18 for each field facet 17 in the field facet mirror 16. A light channel or radiation channel is formed between respectively one field facet 17 and respectively one pupil facet 19. The facets 17, 19 of at least one of the facet mirrors 16, 18 can have a switchable embodiment. In particular, they can be arranged in a tiltable manner on the facet mirror 16, 18. Here it is possible only to embody some of the facets 17, 19, e.g. at most 30%, 50% or at most 70%, in a tiltable manner. Provision can also be made for all facets 17, 19 to have a tiltable embodiment. In particular, the switchable facets 17, 19 are the field facets 17. By tilting the field facets 17, it is possible to vary the assignment of same to the respective pupil facets 19 and hence the formation of the light channels, in particular the setting of a specific illumination setting. Here, a specific arrangement of the pupil facets 19 impinged upon by the illumination radiation 14 is referred to as illumination setting.

In particular, a selection of the following illumination settings come into question when operating the projection exposure apparatus 1: circular illumination setting with different radii, annular illumination settings with different inner and outer boundary radii, x-dipole settings, y-dipole settings, dipole settings, with other orientations and quasar illumination settings with different orientations.

In respect of further details about the facet mirrors 16, 18 with tiltable facets 17, 19 and about the illumination optical unit 4, reference is made to WO 2010/049 076 A1, which is completely integrated herewith as a constituent of the present application.

The beam path of the illumination radiation 14 in the illumination optical unit 4 and the projection optical unit 9 and, in particular, the structural arrangement of the field facet mirror 16 and of the pupil facet mirror 18 cannot be gathered from FIG. 1.

The reticle holder 8 is displaceable in a controlled manner in such a way that, during the projection exposure, the reticle 7 can be displaced in the object plane 6 in a displacement direction. Accordingly, the wafer holder 13 is displaceable in a controlled manner in such a way that the wafer 12 is displaceable in the image plane 11 in a displacement direction. As a result of this, the reticle 7 and the wafer 12 can be scanned through the object field 5 and the image field 10, respectively. The displacement direction is also referred to as scanning direction. The shifting of the reticle 7 and of the wafer 12 in the scanning direction can preferably be carried out in a manner synchronous to one another.

The projection optical unit 9 includes a multiplicity of projection mirrors $M_i$, which are not explicitly depicted in FIG. 1. In particular, the projection optical unit 9 includes at least three, in particular at least five projection mirrors M1 to M5. In particular, it can have at least six, seven or eight projection mirrors M1 to M8.

During use of the projection exposure apparatus 1, the reticle 7 and the wafer 12, which bears a coating that is light-sensitive to the illumination light 14, are provided. Subsequently, at least one portion of the reticle 7 is projected onto the wafer 12 with the aid of the projection exposure apparatus 1.

As described above, the reticle 7 and the wafer 12 are scanned through the object field 5 and the image field 10, respectively, for exposure purposes. Finally, the light-sensitive layer on the wafer 12 that has been exposed with the illumination radiation 14 is developed. A microstructured or nanostructured component, in particular a semiconductor chip, is produced in this way.

During the exposure, the reticle 7 is illuminated by illumination radiation 14 in such a way that the chief ray angle (CRA) of the EUV radiation 14 is incident on the reticle 7 under an angle of incidence of at most 6°, in particular at most 3°, in particular at most 1°, in particular 0°. Here, the angle of incidence is defined as the angle between the chief ray of the radiation beam serving to illuminate the reticle 7 and a normal 29 on the reticle 7. In particular, the angle of incidence of the chief ray is less than the arcsine of the object-side numerical aperture (NAO), CRA<arcsin (NAO). In particular, the object-side numerical aperture (NAO) is at least 0.075, in particular at least 0.1, in particular at least 0.15, in particular at least 0.2.

Figure 2A:
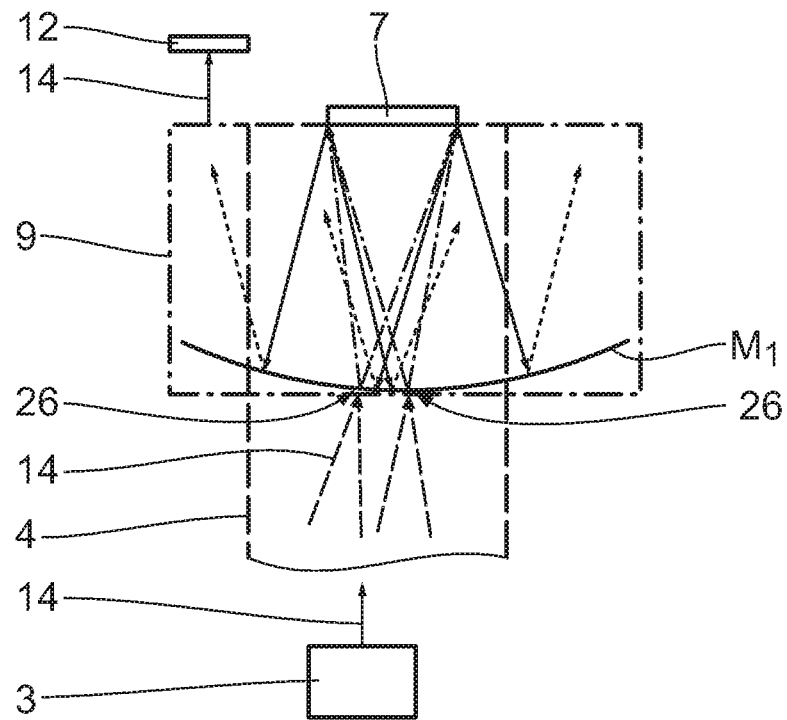
FIGS. 2*a* and 2*b* show schematic illustrations of the beam path in the region of the reticle in the case of illumination with a small chief ray angle.
Figure 2B:
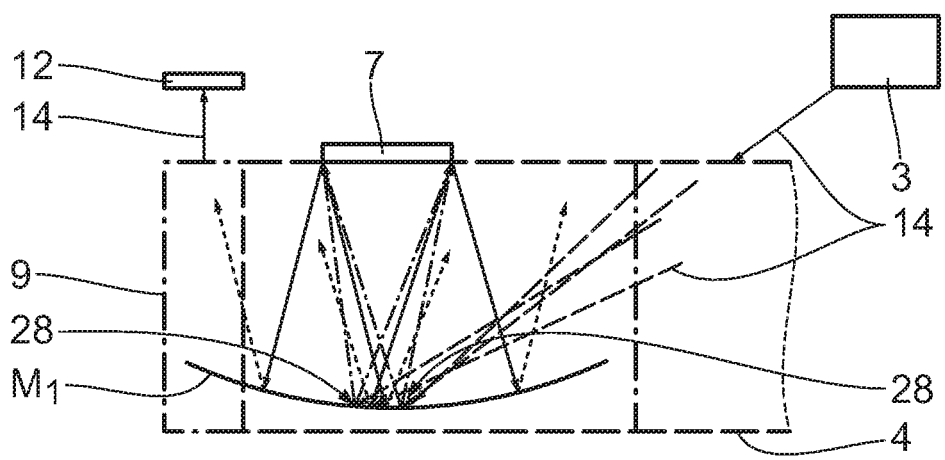

As depicted in an exemplary manner in FIGS. 2a and 2b, a region in which the beam path of the illumination optical unit 4 overlaps with the beam path of the projection optical unit 9 arises in the case of an illumination of the reticle with small chief ray angles. In particular, it is possible for the beam path of the illumination optical unit 4 and the beam path of the projection optical unit 9 to overlap in the region of the first mirror $M_1$ and/or in the region of the second mirror $M_2$ of the projection optical unit 9. It is for this reason that provision can be made for the mirror $M_1$ and/or the mirror $M_2$ of the projection optical unit 9 to be provided with radiation-transmissive regions 26 (FIG. 2a) or with beam-deflecting elements 28 (FIG. 2b), in particular in the form of deflection mirrors or deflection gratings, for the purposes of threading illumination radiation 14.

In view of the beam path in the projection optical unit 9, the radiation-transmissive regions 26 and the radiation-deflecting elements 28 form obscurations of the mirror $M_1$ and/or $M_2$. Therefore, these mirrors $M_1$ and/or $M_2$ are also referred to as mirrors with a fragmented obscuration. If the illumination radiation 14 encounters such an obscuration on the path to the wafer 12 after the reflection at the reticle 7, it no longer contributes to the exposure of the wafer 12 but instead is lost.

With the aid of the optical components 23 and/or the mirror devices 20, which are described in more detail below, it is possible to ensure that a stable lithography process is possible, despite such a loss. By reducing unnecessary obscurations, it is possible, in particular, to reduce the loss, in particular to minimize the latter. It is also possible to ensure that specific orders of diffraction contribute without losses to the imaging of the reticle 7 on the wafer 12.

Figure 19:
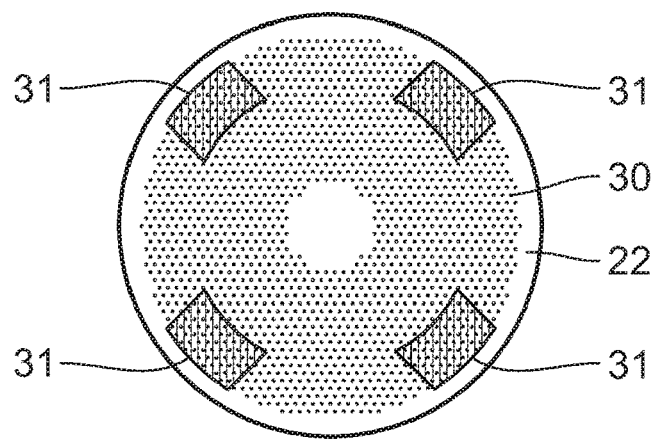
FIG. 19 shows a schematic illustration of all possible people facet positions and the regions which are in fact involved for a given quadrupole setting.

It was identified that, in the prior art, it is not so much the employed pupil degree of filling, i.e. the employed pupil facet spots on these mirrors $M_1$ and $M_2$, which leads to obscurations of the mirror $M_1$ and/or $M_2$, but rather the degree of switching, i.e. the number of possible switching positions of the field facets 17 and the pupil facet spots provided, but not used, to this end on these mirrors $M_1$ and $M_2$. This is elucidated in an exemplary manner in FIGS. 19 and 20. These figures each depict a plan view of the reflection surface 22 of one of the mirrors $M_1$ or $M_2$ in an exemplary manner, wherein FIG. 19 depicts the totality of all possible pupil spots 30, i.e. the position of all possible pupil facets 19 in the region of this mirror, and plots the regions 31 actually used in an exemplary setting, i.e. the regions impinged upon by illumination radiation 14.

It was recognized that the number of obscurations, and hence the loss of the illumination radiation 14, in particular the loss of orders of diffraction at the mirror $M_1$ or $M_2$, can be markedly reduced if only the actually used regions 31 are used for threading illumination radiation 14, i.e. provided with radiation-transmissive regions 26 or with radiation-deflecting elements 28.

Figure 20:
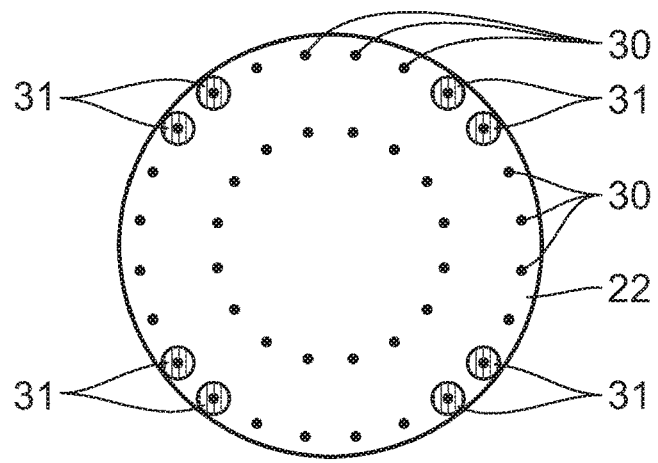
FIG. 20 shows a schematic illustration corresponding to FIG. 19 with a smaller number of pupil spots.

FIG. 20 depicts the corresponding situation for the case of a smaller number of pupil spots 30. Once again, the pupil spots 30 actually used in the exemplary setting are characterized as used regions 31.

One aspect of the disclosure consists of reducing, in particular minimizing, the number of unnecessary obscurations during the operation of the projection exposure apparatus 1.

In general, this object is achieved by virtue of the obscurations having a variable embodiment. In the case of radiation-transmissive regions 26, these can be made to be radiation-reflecting regions by way of actuation. In the case of radiation-deflecting elements 28, these can, in particular, have a variably positionable and/or orientable embodiment.

Below, different variants of these options are described in an exemplary manner.

Figure 3:
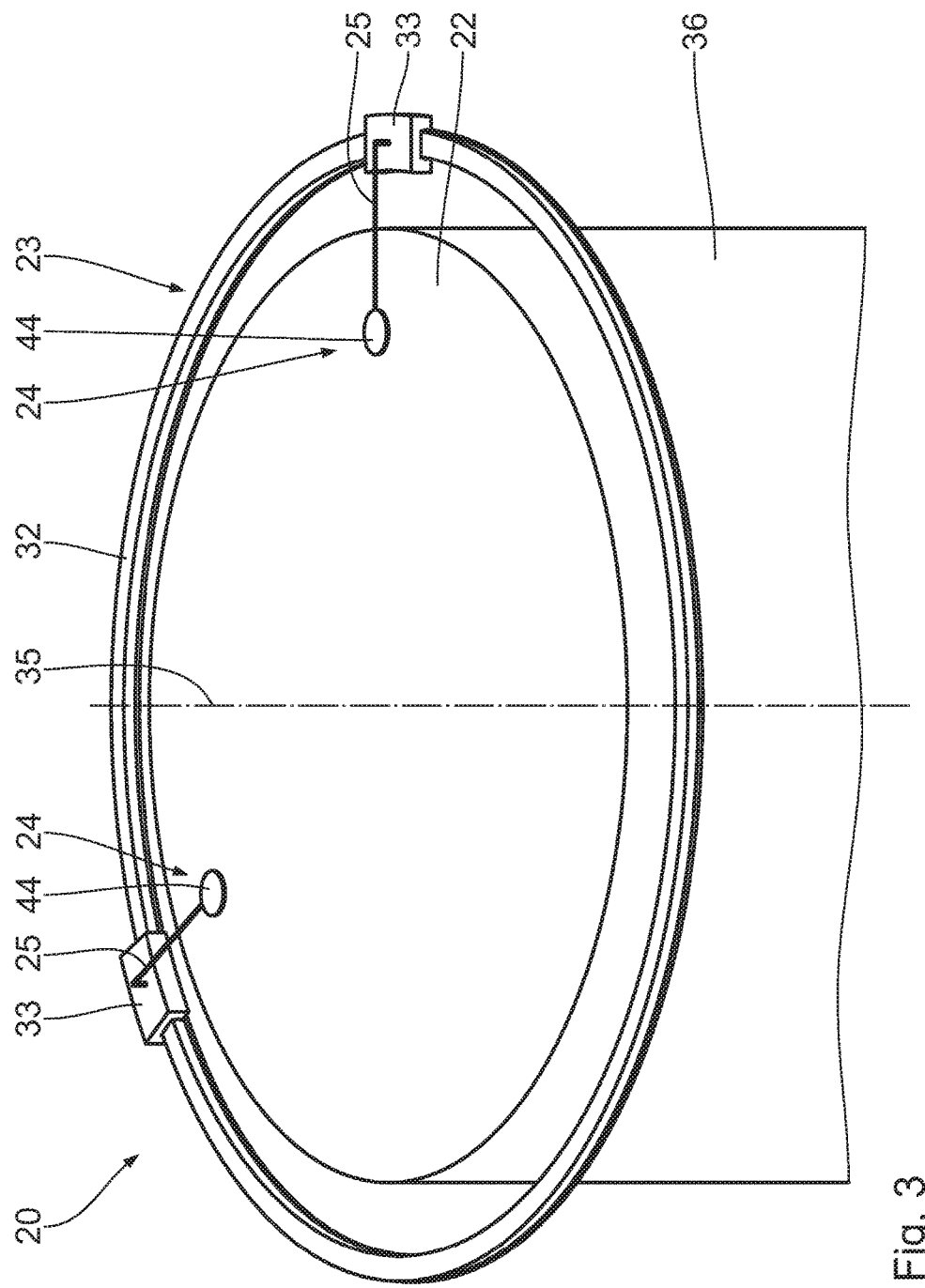
FIG. 3 shows a schematic view of a mirror device including an optical component with adjustably arranged individual mirrors.
Figure 4:
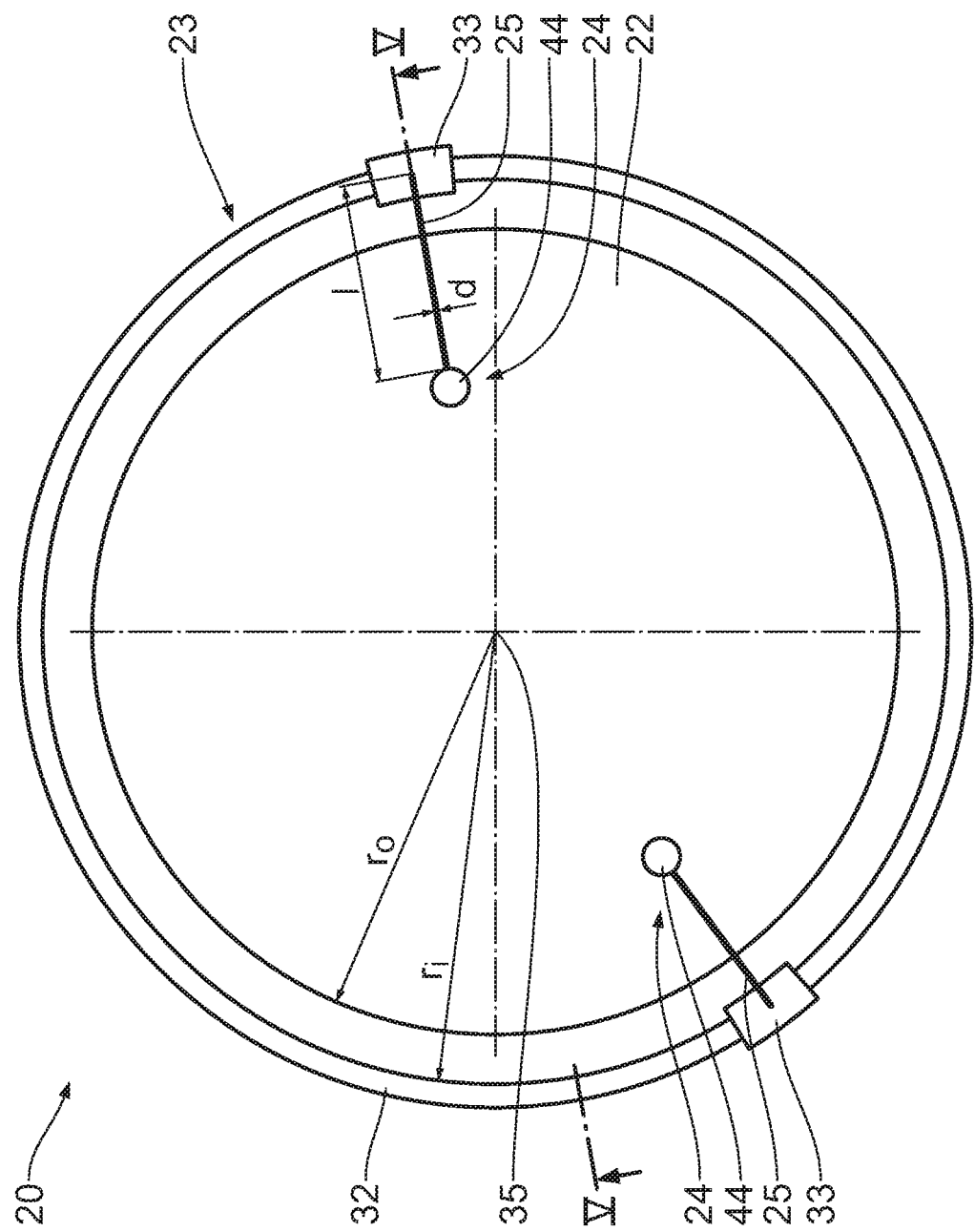
FIG. 4 shows a plan view of the mirror device in accordance with FIG. 3 along the normal direction.
Figure 5:
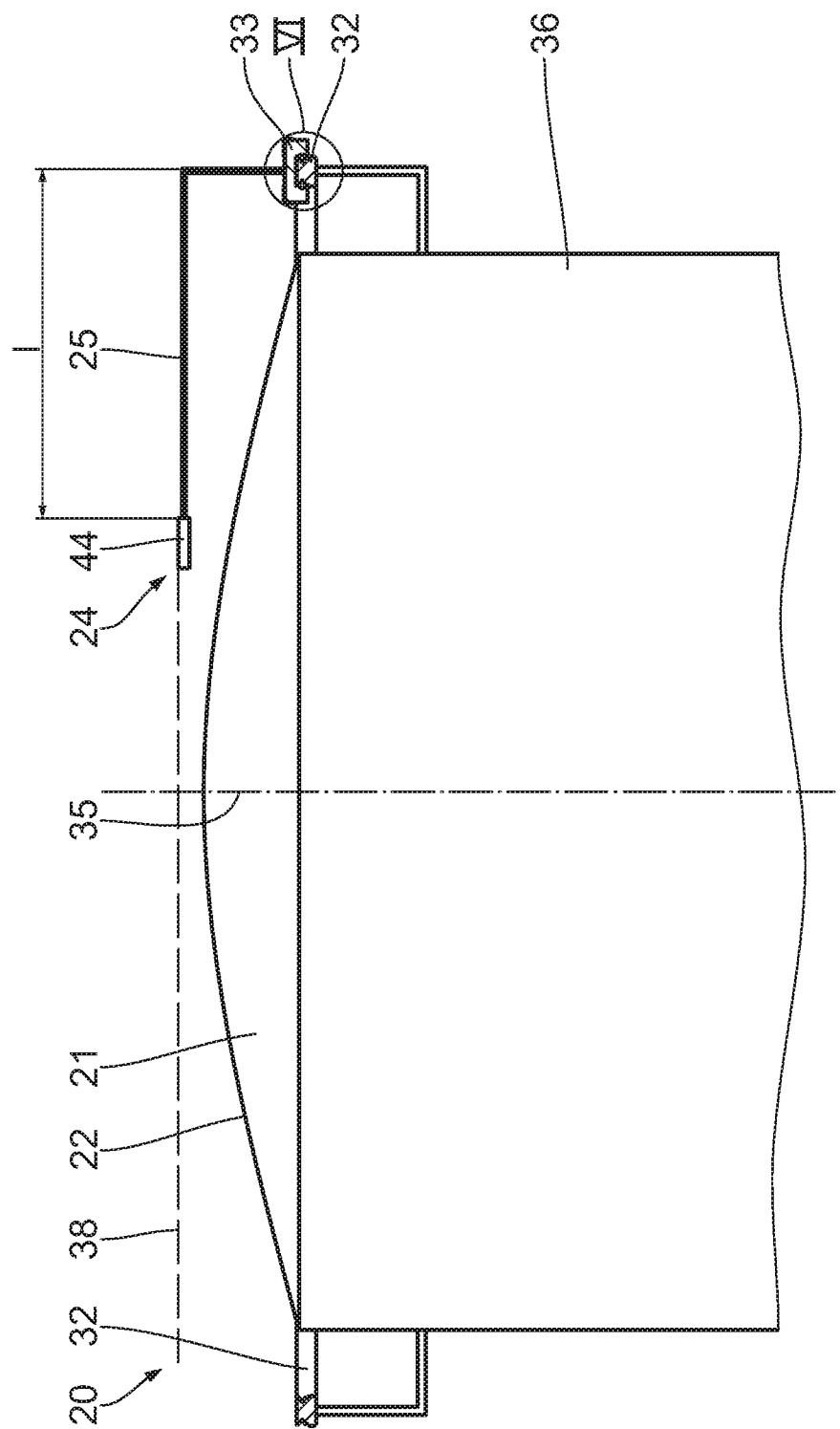
FIG. 5 shows a schematic cross section along the line V-V of the mirror device in accordance with FIGS. 3 and 4.
Figure 6:
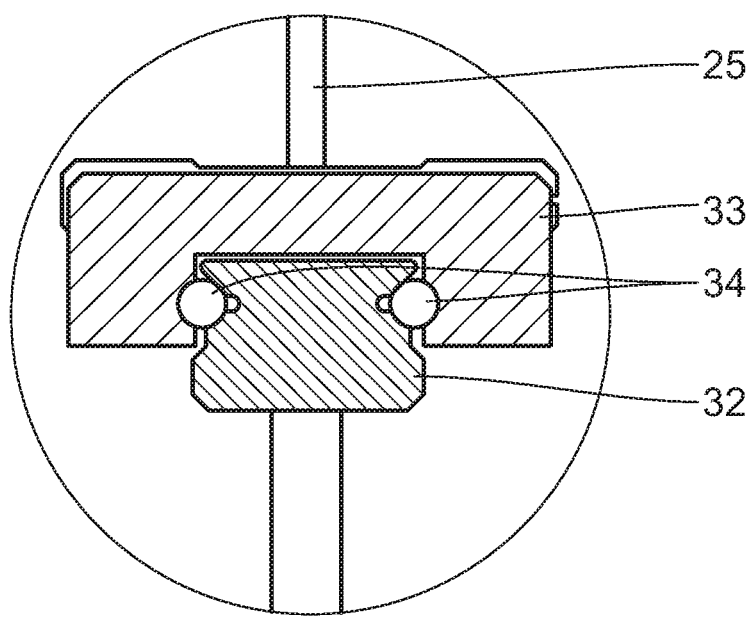
FIG. 6 shows a detailed illustration of the section VI from FIG. 5.

In accordance with the variants depicted in FIGS. 3 to 5, provision is made for the pupil facets 19 to be embodied as variably positionable facet elements, in particular in the form of individual mirrors 24. In general, the facet elements are embodied as radiation-deflecting or beam-guiding elements. Instead of the individual mirrors 24, it is also possible to make provision of grating elements, in particular diffraction gratings, in particular so-called blazed gratings. For reasons of simplicity, reference is only made to facet elements or individual mirrors 24 below.

In particular, the individual mirrors 24 each have a round, in particular circular embodiment. They have linear dimensions, in particular a diameter, in the range of 1 mm to 20 mm, in particular in the range of 2 mm to 15 mm, in particular in the range of 3 mm to 10 mm, preferably in the range of 4 mm to 8 mm. In principle, it is also possible to embody the individual mirrors 24 to have corners, in particular in a polygonal manner, for example with a triangular, square or hexagonal embodiment. In principle, it is also possible to embody the individual mirrors 24 in an elliptical manner or in a different manner with two different extents along two orthogonal axes. This can be advantageous, in particular, if the boundary of the entrance pupil of the projection optical unit 9 is not circular. In particular, the extent along the two orthogonal axes can have a ratio of at least 1.1:1, in particular at least 1.2:1, in particular at least 1.3:1, in particular at least 1.5:1, in particular at least 2:1.

The individual mirrors 24 are embodied as constituents of an optical component 23. In particular, the optical component 23 serves as a facet mirror of the illumination optical unit 4, in particular as a pupil facet mirror 18. In particular, it forms the pupil facet mirror 18. The optical component 23 is mechanically connected to the mirror $M_1$ or $M_2$, in particular to a holder 36 for a mirror body 21 of the mirror $M_1$ or $M_2$. The optical component 23 can be connected in an interchangeable manner to the holder 36.

The mirrors $M_1$ and $M_2$ each have reflection surfaces 22. The reflection surface 22 is usually curved. It can have an embodiment with convex or concave curvature. It can have a spherical or aspherical embodiment. It can also be embodied as a free-form surface. In principle, it is also possible for the reflection surface 22 to have a planar embodiment.

The mirror $M_1$ or $M_2$, in particular the mirror body 21, forms a mirror device 20 together with the optical component 23.

The reflection surface 22 of the mirror device 20 is, in particular, a constituent part of the projection optical unit 9. The individual mirrors 24 form constituent parts of the illumination optical unit 4. In particular, they form the pupil facets 19.

In particular, the mirror device 20 is arranged in the projection optical unit 9 in such a way that the individual mirrors 24 are arranged in the beam path of the illumination optical unit 4 as pupil facets 19 and the reflection surface 22 is arranged in the beam path of the projection optical unit 9.

In view of the beam path in the projection optical unit 9, the individual mirrors 24 of the optical component 23 form obscurations of the reflection surface 22 of the mirror device 20. Therefore, the mirror device 20 is also referred to as a mirror with a fragmented obscuration.

The totality of the individual mirrors 24 which are situated in the beam path of the projection optical unit 9 have an overall surface which makes up at most 30%, in particular at most 20%, in particular at most 10% of the reflection surface 22 of the mirror device 20.

In particular, the mirror device 20 can be arranged in the beam path of the illumination optical unit 4 in such a way that the individual mirrors 24 are arranged in the region of a pupil plane of the illumination. The mirror device 20 can be arranged in such a way, particularly in the case of a homocentrically divergent illumination of the reticle 7. This ensures that the illumination pupil does not vary over the object field 5. The mirror device 20 can be arranged in the region of a pupil plane of the projection optical unit 9. It can also be arranged outside of the region of a pupil plane of the projection optical unit 9, in particular at a distance from a pupil plane of the projection optical unit 9. Here, in particular, D(CR)/(D(SA)+D(CR))<0.1 applies, where D(SA) is the diameter of a sub-aperture in the region of the individual mirrors 24 and D(CR) specifies the maximum distance of chief rays of an effective object field imaged by the lens, measured in a reference plane, in the region of the individual mirrors 24.

The optical component 23 includes a mechanical guide device. The mechanical guide device is embodied as a runner 32. In particular, it includes the runner 32. In particular, it includes at least one runner 32. It can also include more than one, in particular two, in particular at least two, in particular three or more runners 32.

The runner 32 extends in a plane perpendicular to a normal 35.

The runner 32 has a closed form. In particular, it has a ring-shaped embodiment. In particular, it has a circular-ring-shaped embodiment. In particular, the runner 32 has an inner radius $r_i$, which is greater than an outer radius $r_o$ of the reflection surface 22. Other forms are likewise possible and may be advantageous. It may likewise be advantageous to embody the runner 32 in a three-dimensionally aplanar manner. This should be understood to mean an embodiment in which the runner 32 has a component in the direction of the normal 35.

The runner 32 has a profiled embodiment. In particular, it has a double-trapezoidal or double-Σ-shaped cross section. It can also have an H-shaped or T-shaped cross section. It can also have a polygonal cross section. In particular, it does not have a circular cross section.

A carriage 33 is arranged on the runner 32. For the purposes of a low-friction contact between the carriage 33 and the runner 32, it is possible for balls 34 to be arranged therebetween. In particular, the balls 34 form a ball bearing.

In a preferred embodiment, the carriage 33 is arranged without contact on the runner 32. By way of example, this can be achieved by a suitable arrangement of magnetic elements in the carriage 33 and in the runner 32.

In a further alternative (not depicted here), the carriage 33 can be displaceable via a gear drive on the runner 32 embodied as a toothed rail.

The carriage 33 is displaceable along the runner 32. In particular, it is displaceable by an actuator system. For the purposes of displacing the carriage 33, provision can be made of a stepper motor, in particular with a piezo-motor, in particular a piezo-ultrasonic motor. The latter engages the runner 32 on one side. Therefore, the runner 32 is also referred to as friction rail. In respect of further details about the drive of the carriage 33, reference is made to DE 41 33 108 A1.

The carriage 33 can have maximum dimensions of less than 3 cm, in particular less than 2 cm, in particular less than 1 cm.

The carriage 33 can be displaced along the runner 32 with a speed of up to 500 mm/s. Moreover, it can be held in a stationary manner on the runner 32 in a precise and stable fashion.

The individual carriages 33 are displaceable independently of one another. In particular, they are displaceable independently of one another along the runner 32. They can also be displaceable in pairs or in groups. In particular, it is possible to arrange respectively two of the carriages 33 at opposite positions on the runner 32. These carriages 33 can each be displaceable in a synchronized manner.

The carriage 33 is positionable on the runner 32 with a precision of better than 1 mm, in particular better than 300 µm, in particular better than 100 µm. Accordingly, the respectively assigned individual mirror 24 is positionable with a precision of better than 1 mm, in particular better than 300 µm, in particular better than 100 µm.

A positioning element 25 is arranged at the carriage 33 in each case. The carriage 33 can also form a constituent part of the positioning element 25. The positioning element 25 is securely connected to the carriage 33. By way of example, it can be clamped in a bore in the carriage 33. It can also be adhesively bonded, soldered or welded onto the carriage 33. It can also be screwed to the carriage. It can also be connected to the carriage 33 in an interlocking or cohesive manner. In particular, it can have an integral embodiment with the carriage 33.

The positioning element 25 is embodied as a pointer or in a pointer-like manner. In particular, it has a rod-like embodiment. In particular, it has a length l and a cross section with a maximum diameter d. The ratio of the length l to the maximum diameter d of the positioning element 25 is referred to as the aspect ratio thereof. The aspect ratio l:d of the positioning element 25 is, in particular, at least 3:1, in particular at least 5:1, in particular at least 10:1.

The maximum diameter d, in particular in a plane defined by the runner 32, in particular in a plane perpendicular to a normal 35, is at most 1 cm, in particular at most 3 mm, in particular at most 1 mm, in particular at most 0.3 mm.

The positioning element 25 is each case displaceable in a guided manner on the runner 32.

Respectively one of the individual mirrors 24 is assigned to each one of the positioning elements 25. In each case, the individual mirror 24 is arranged at an end of the positioning element 25 opposite to the carriage 33.

The individual mirrors 24 are in each case positionable via the positioning element 25, in particular variably positionable, i.e. displaceable.

The individual mirrors 24 are positionable in a ring-shaped region with the aid of the carriages 33 and the positioning elements 25. In particular, they are respectively positionable in at least one reflection position in such a way that the image thereof falls in a circular-ring-shaped region in the case of the perpendicular projection along the direction of the normal 35 into the plane 38. In particular, this image lies completely within a predetermined circular area or a predetermined circular-ring area.

The figures only depict a small number of individual mirrors 24. The overall number of individual mirrors 24 which are arranged in the beam path of the projection optical unit 9 lies in the range of 2 to 400, in particular in the range of 4 to 200.

The optical components 23 is arranged without contact in relation to the reflection surface 22. In particular, the individual mirrors 24 and the positioning elements 25 are arranged without contact in relation to the reflection surface 22.

The individual mirrors 24 preferably have a small distance from the reflection surface 22 in the direction of the normal 35. In particular, the distance in the direction of the normal 35 between the individual mirrors 24 and the reflection surface 22 lies in the range of 10 μm to 10 cm, in particular in the range of 100 μm to 1 cm.

The individual mirrors 24 are arranged along a common plane 38. They can also be arranged along a curved surface. In particular, they are arranged along a pupil surface, in particular a pupil plane of the illumination optical unit 4. Here, an arrangement along the plane of the surface should be understood to mean that at least one point on the reflection surface of the mirror, in particular a center of same, lies on this plane of the surface.

A further variant of the mirror device 20 is described below with reference to FIGS. 7 and 8. Identical components acquire the same reference signs as in the above-described variant, to which reference is hereby made.

Figure 7:
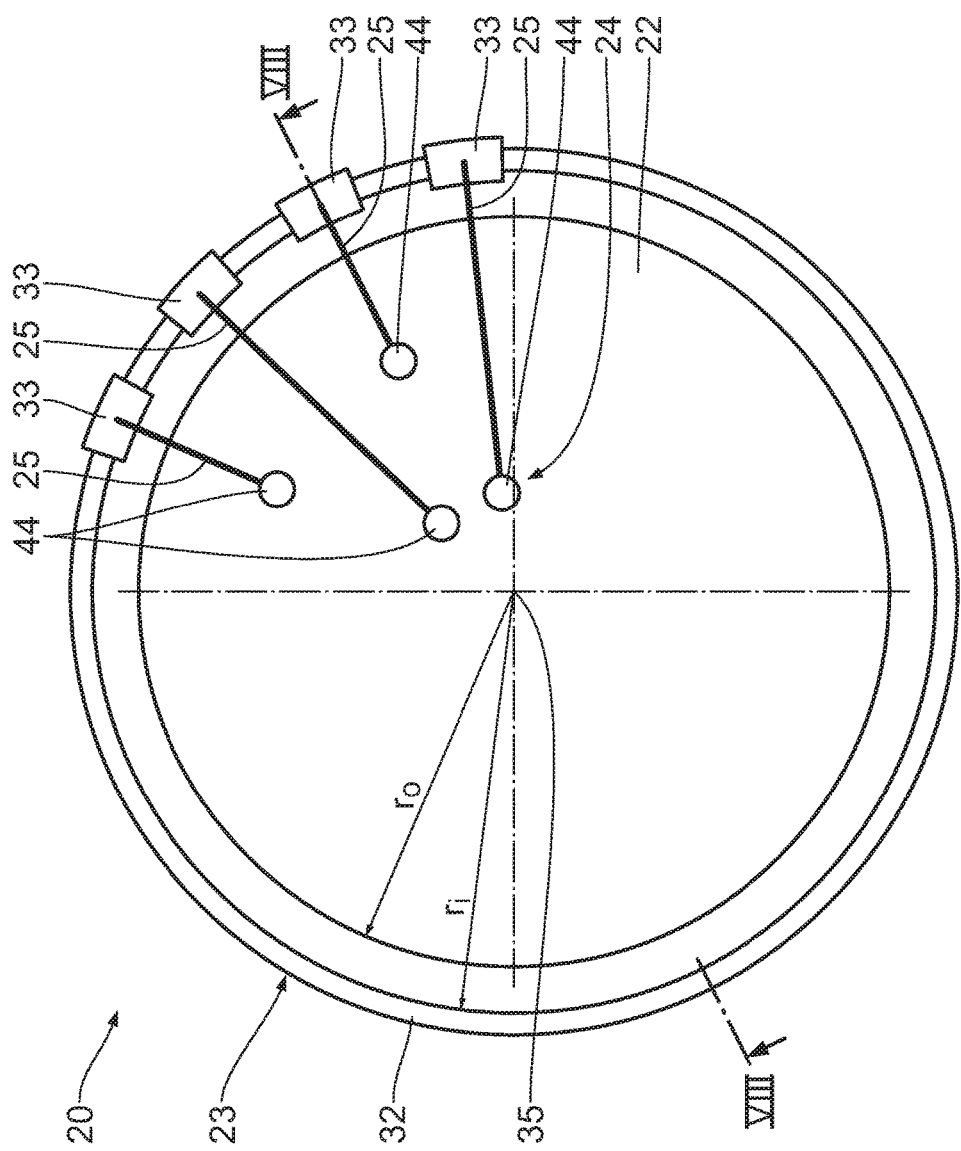
FIG. 7 shows a plan view in accordance with FIG. 4 of a further mirror device.
Figure 8:
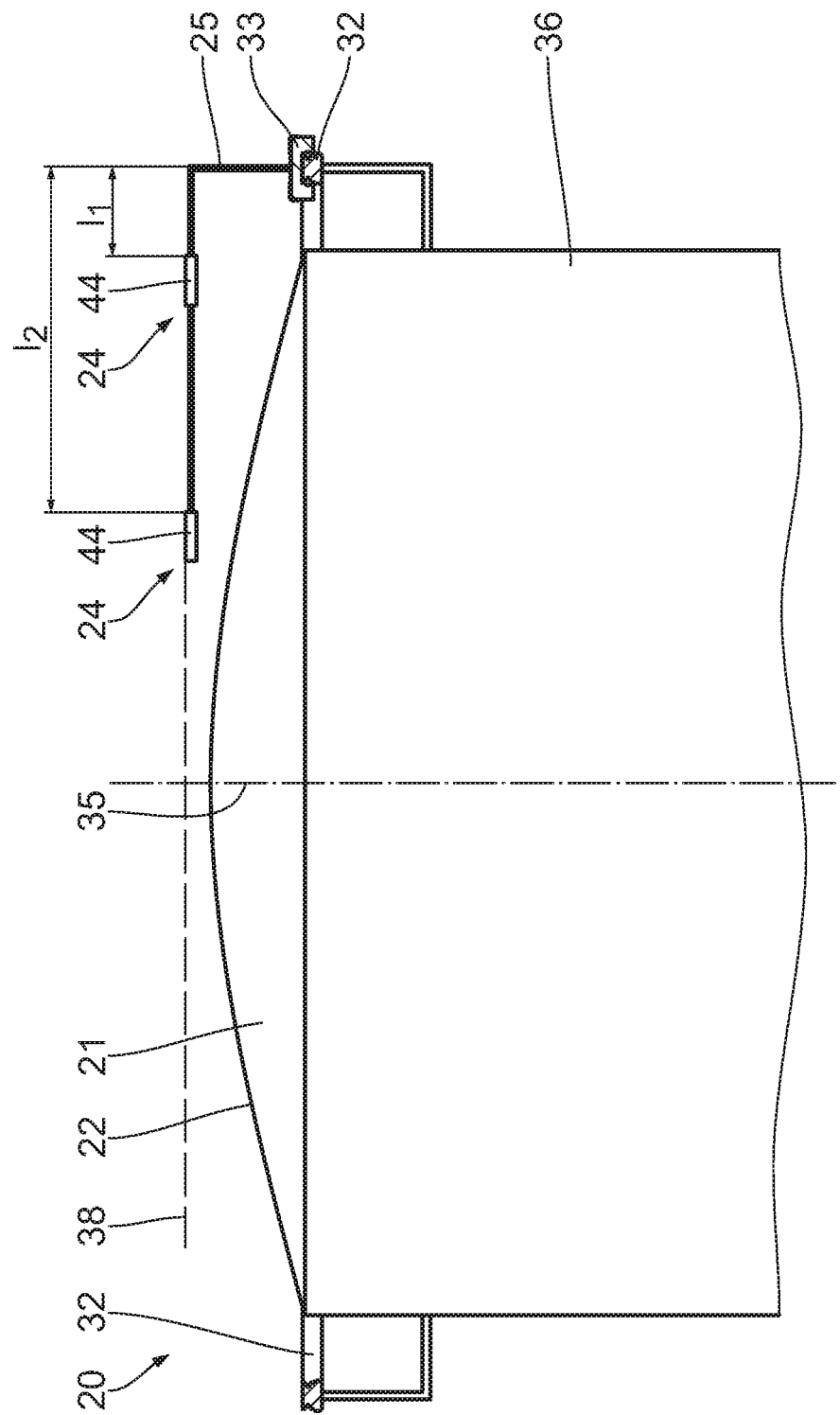
FIG. 8 shows a schematic cross section along the line VIII-VIII of the mirror device in accordance with FIG. 7.

In the variant in accordance with FIGS. 7 and 8, the positioning elements 25 have different lengths $l_i$. In the depicted variant, these positioning elements 25 alternately have a shorter length $l_1$ and a longer length $l_2$.

It is also possible to select the lengths $l_i$ from more than two, in particular three, five or more different lengths $l_i$.

It is also possible to arrange the positioning elements 25 on the respectively associated carriage 33 in a manner adjustable along the longitudinal direction thereof. In this case, they have an adjustable length $l_i$, in particular an adjustable effective length $l_i$. In particular, they can be embodied to be adjustable along the longitudinal direction thereof by an actuator system.

The distribution of the illumination angles can be modified, in particular set, during the illumination of the reticle 7 by way of the length $l_i$ of the positioning elements 25.

Figure 9:
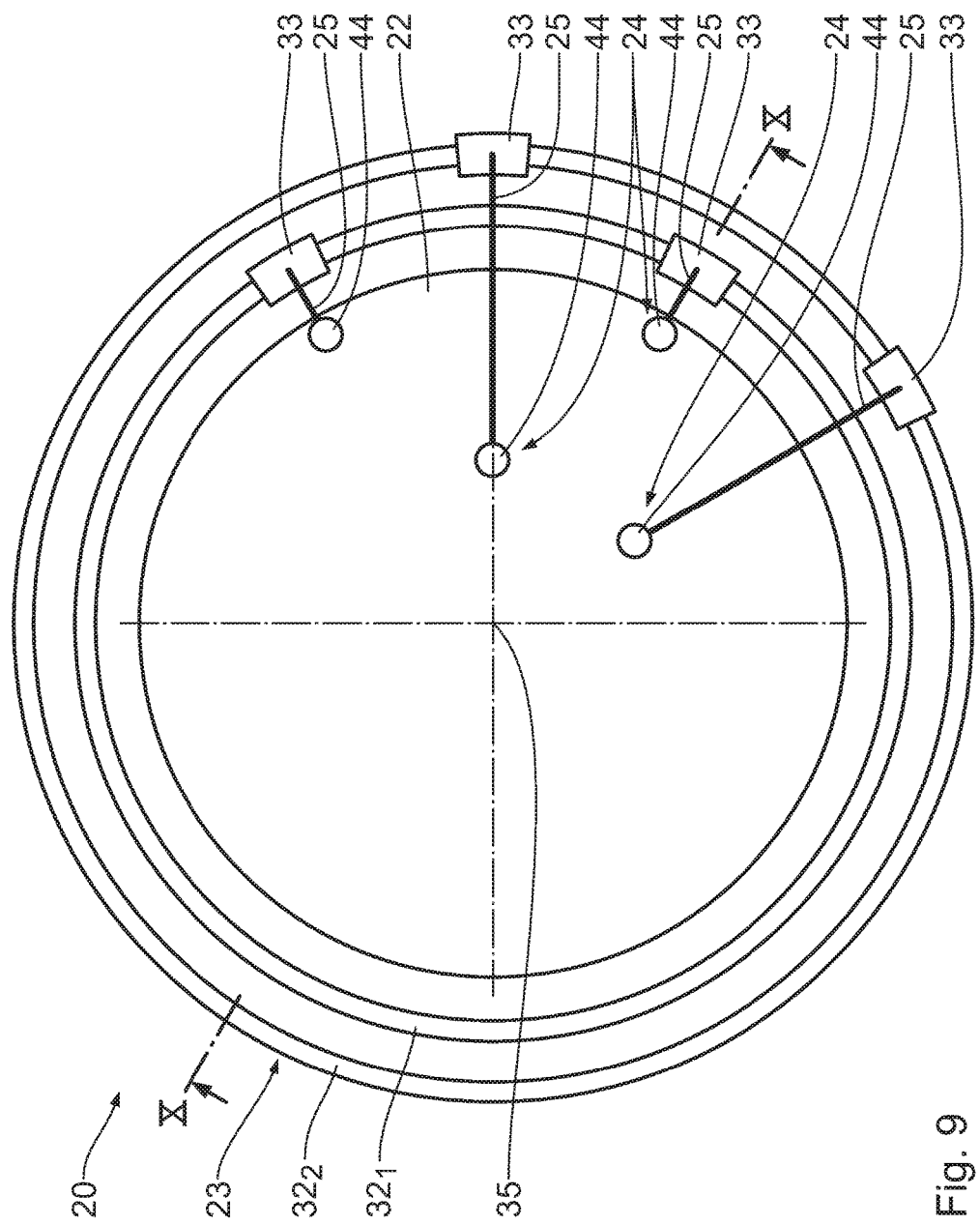
FIG. 9 shows a plan view of a further mirror device.
Figure 10:
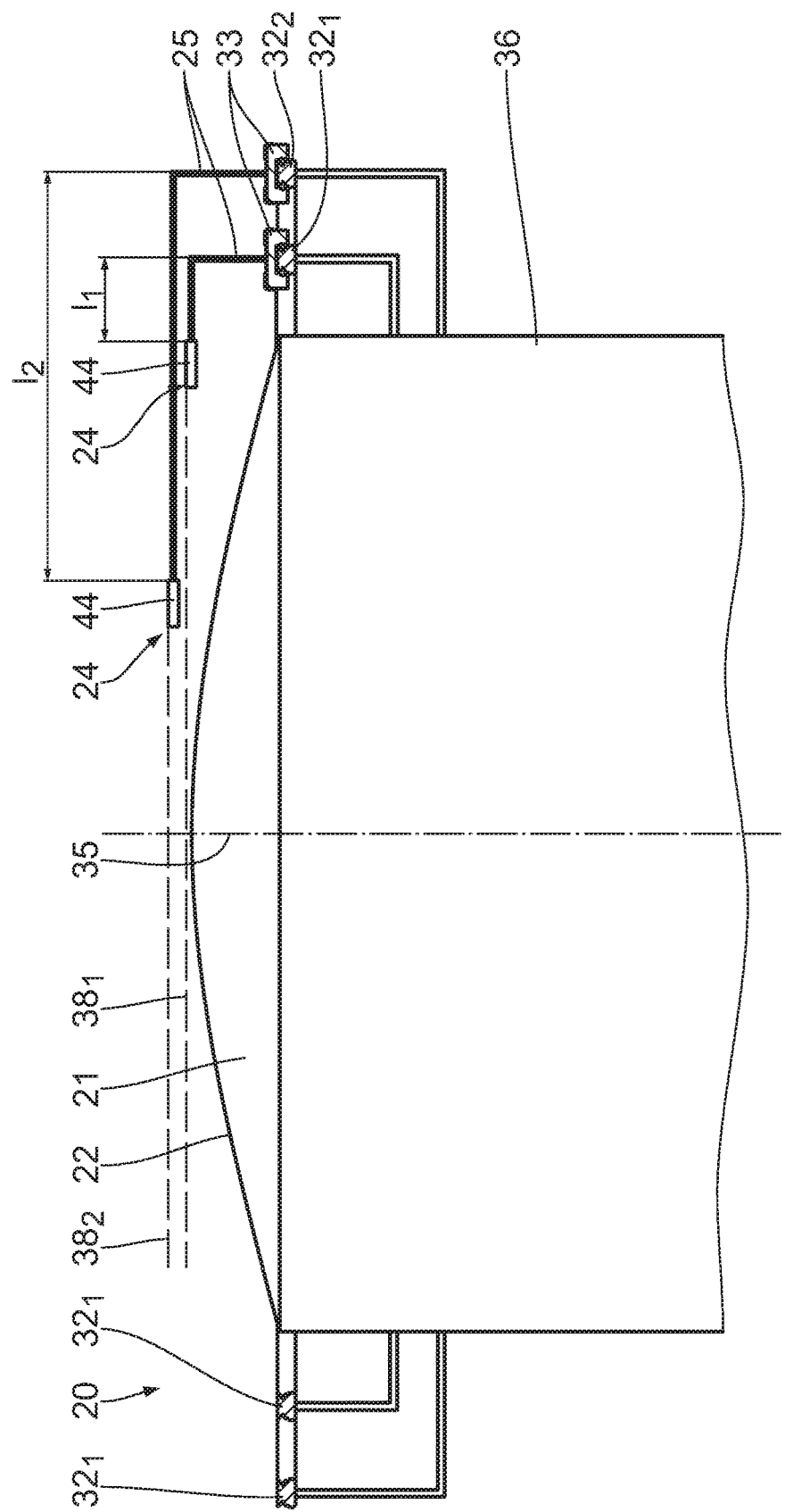
FIG. 10 shows a schematic cross section along the line X-X of the mirror device in accordance with FIG. 9.

A further variant of the mirror device 20 is described below with reference to FIGS. 9 and 10. Identical parts acquire the same reference signs as in the above-described variants, to which reference is hereby made.

In this variant, the mechanical guide device includes two runners $32_1$ and $32_2$.

The two runners 32 are arranged concentrically in relation to one another. They are arranged without contact between one another. They can be arranged in a common plane. They can also be arranged offset from one another in the direction of the normal 35.

The individual mirrors 24 which are arranged in positionable fashion on the first runner $32_1$ are arranged along a first plane $38_1$ of the surface. The mirrors 24 which are arranged on the second runner $32_2$ are arranged along a second plane $38_2$ of the surface. The planes $38_1$ and $38_2$ are arranged at a distance from one another in the direction of the normal 35. This can be achieved by an appropriate embodiment of the respective positioning elements 25. This can also be achieved by virtue of the runners $32_1$ and $32_2$ being arranged offset from one another in the direction of the normal 35.

The positioning elements 25 which are assigned to a specific one of the two runners $32_1$, $32_2$ have the same length $l_i$ in each case. In the depicted variant, the positioning elements 25 which are assigned to the inner runner $32_1$ in each case have a shorter length $l_1$ than the positioning elements 25 which are assigned to the outer runner $32_2$. The latter each have a length $l_2$, with the following applying: $l_1 < l_2$.

The flexibility of the positioning of the individual mirrors 24 is increased as a result of arranging more than one runner 32.

Provision can also be made of more than two, in particular three, four or more runners 32.

By offsetting the positioning elements 25 in the direction of the normal 35, it is possible to position the respectively assigned individual mirrors 24 independently of one another.

Figure 11:
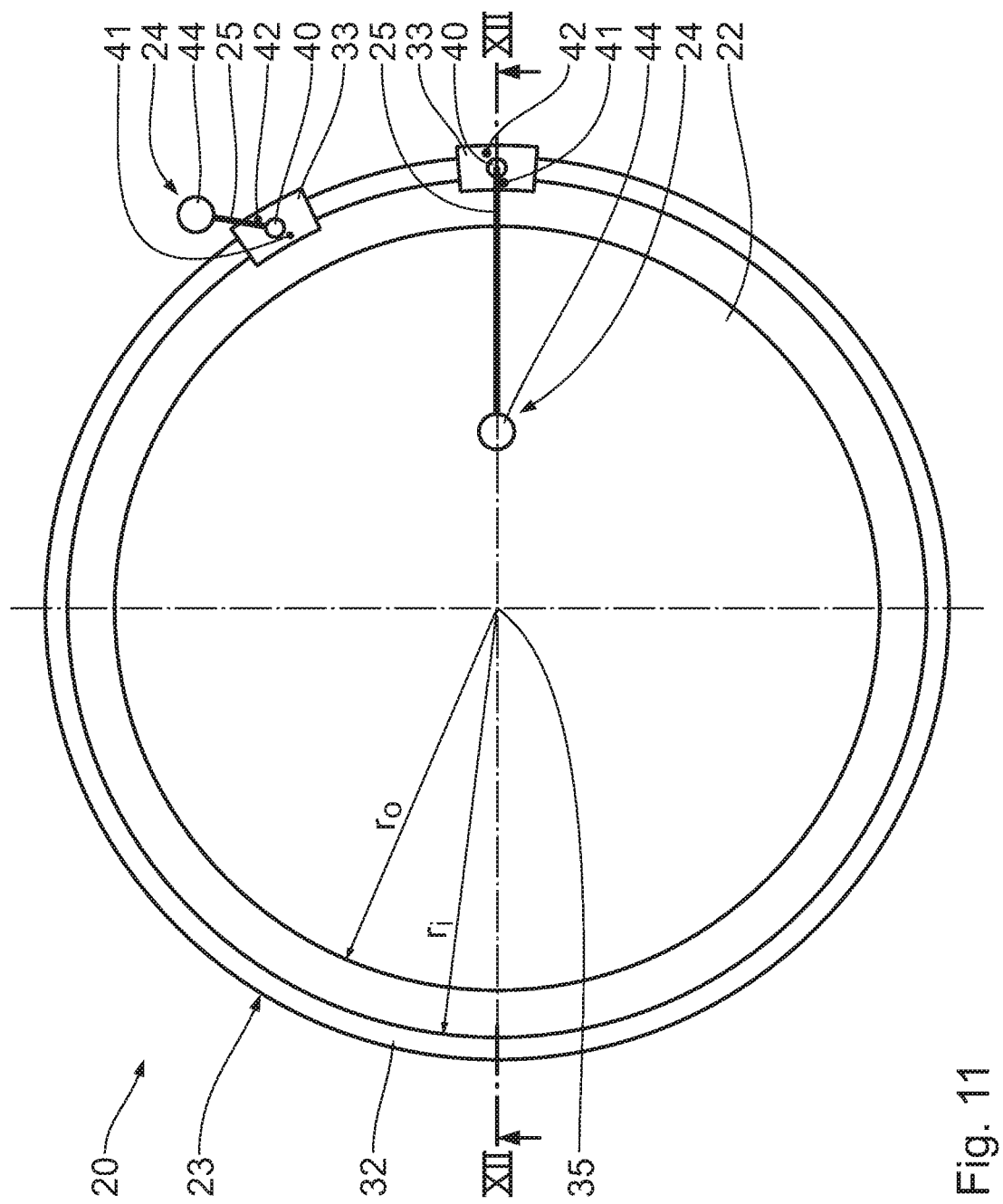
FIG. 11 shows a plan view of a further mirror device.
Figure 12:
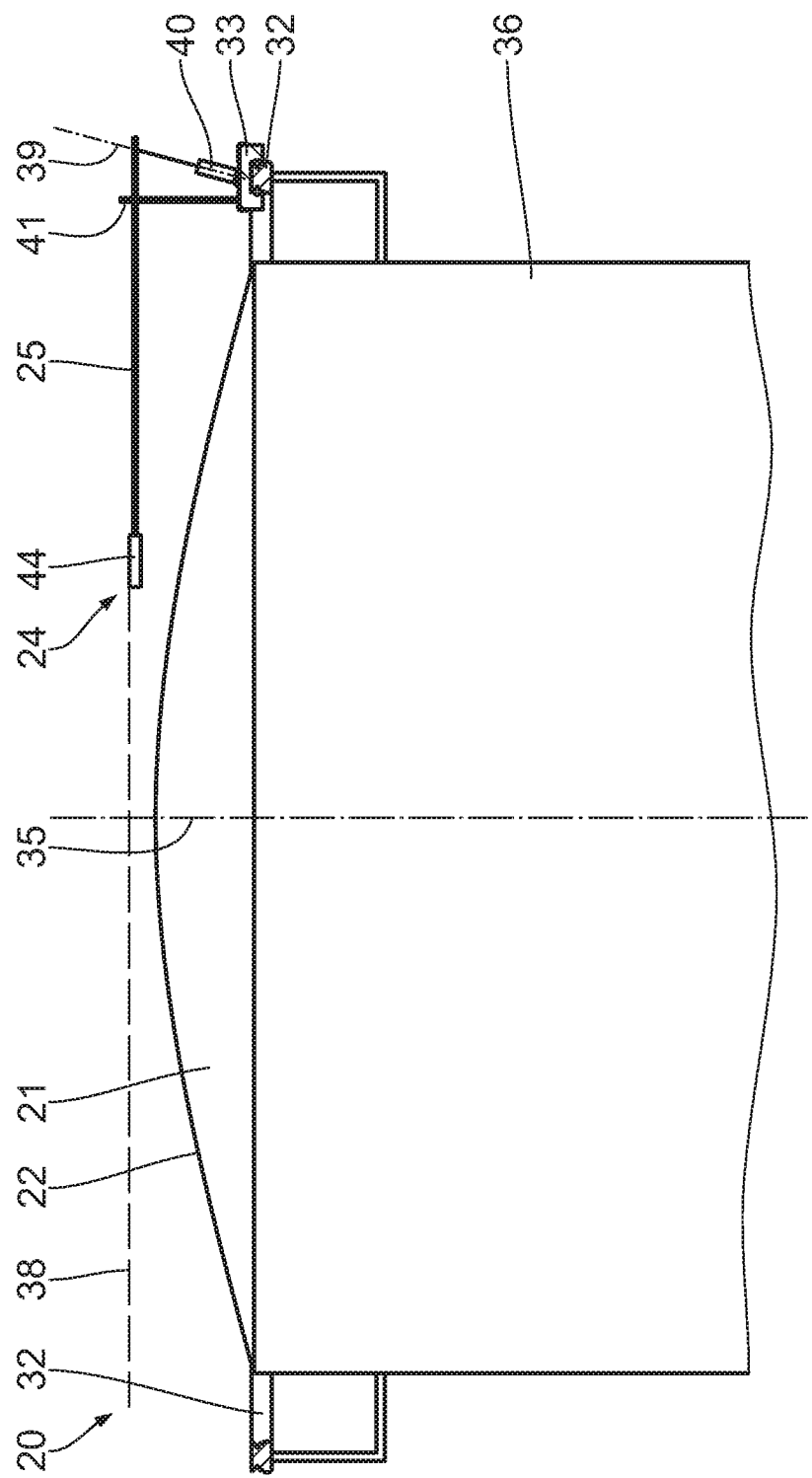
FIG. 12 shows a schematic cross section along the line XII-XII through the mirror device in accordance with FIG. 11.

A further variant of the mirror device 20 is described below with reference to FIGS. 11 and 12. Identical parts acquire the same reference signs as in the above-described variants, to which reference is hereby made.

In this variant, the positioning elements 25 have an additional degree of freedom, in particular an additional positioning degree of freedom. First of all, they are displaceable along the runner 32 via the respectively assigned carriage 33. Secondly, they are swivelable about a swivel axis 39. In particular, they are arranged on the respective carriage 33 in a manner swivelable about the swivel axis 39.

What can be achieved by a swivelability of the positioning elements 25 is that the same positioning of one of the individual mirrors 24 can be achieved in different ways. In particular, this can be traced back to the fact that the positioning of the individual mirror 24 in this case is effected with more than one degree of freedom, in particular with more than one positioning degree of freedom. Here, an increase in the positioning degrees of freedom leads to a greater flexibility. However, it involves a more complex actuation of the actuators.

The swivel axis 39 is inclined in relation to the normal 35. In principle, it can also be aligned parallel to the normal 35. In particular, it extends at an angle in the range of 0° to 30°, in particular in the range of 2° to 10° in relation to the normal 35. In particular, it is oriented in such a way that it sweeps over the surface of a funnel when displacing the carriage 33 along the runner 32.

What is achieved by tilting the swivel axis 39 relative to the normal 35 is that the positioning element 25 with the mirror 24 is swiveled in a plane inclined in relation to the plane 38. What can be achieved hereby is that the individual mirror 24 or the positioning element 25 traverses a trajectory on which it has a greater distance from the plane 38 and hence from the reflection surface 22. As a result of this, unwanted contact between reflection surface 22 and positioning element 25 can be prevented, in particular in the case of a convex surface shape of the reflection surface 22.

The positioning elements 25 are arranged in such a way that, in the reflection positioning, they extend parallel to the plane 38 perpendicular to the normal 35. Hence, they are arranged obliquely, i.e. not perpendicular, to the swivel axis 39. In principle, they can also be arranged perpendicular to the swivel axis 39.

For the purposes of swiveling the positioning elements 25 with the individual mirrors 24, provision is made of an actuator 40, in particular in the form of a motor, in particular an electric motor. The actuator 40 is securely connected to the carriage 33.

An end position for the swivelability of the positioning element 25 is defined by a mechanical stop 41, in particular in the form of a stop pin. The stop 41 can be arranged on the carriage 33 in such a way that the positioning element 25 is aligned exactly in the radial direction, i.e. perpendicular to the runner 32, in the end position defined by the stop 41. In particular, the stop 41 defines a so-called on position. In particular, the accuracy of the positioning of the individual mirrors 24 in the on position can be improved by the stop 41.

The individual mirrors 24 are swivelable into an off position via the actuator 40. In particular, this is advantageous provided individual ones of the individual mirrors 24 are not required for setting a specific illumination setting. They can be swiveled out of the beam path of the projection optical unit 9 by way of swiveling into the off position. In other words, they do not lead to an obscuration of the beam path of the projection optical unit 9 in the off position. If an individual mirror 24 is in the off position, the image thereof lies outside of the reflection surface 22, in particular outside of the image of the runner 32, in the case of a projection along the direction of the normal 35. In particular, the image thereof lies outside of the circle area or circular-ring area described above.

Since an individual mirror 24 in the off position does not contribute to illuminating the reticle 7, the off position need not be able to be set with great accuracy. However, it is nevertheless possible to arrange a further stop 42 for predetermining the off position on the carriage 33. As a result of this, actuating the actuation of the swiveling of the positioning element 25 is simplified.

The positioning element 25 has at least one on position and at least one off position. It can also have a plurality of on positions. In particular, it can be continuously swivelable. It can also be swivelable with predetermined, discrete swivel positions. A continuous swivelability increases the variability of the positioning of the individual mirrors 24. The precision of the positioning of the individual mirrors 24 can be improved by a swivelability with discrete swivel positions.

The individual mirrors 24 with the associated positioning elements 25 which are not used in a specific illumination setting can be folded away in an off position with the aid of the actuators 40 so that they cannot vignette the beam path of the projection optical unit 9.

Even if different aspects of the positionability of the individual mirrors 24 were described with the aid of the positioning elements 25 on the basis of different variants, these are naturally also combinable with one another as desired. In particular, it can be advantageous to embody swivelable positioning elements 25 with different lengths $l_i$.

It can also be advantageous to arrange swivelable positioning elements 25 on a first runner, while the positioning elements 25 on a second runner 32 are not swivelable.

It can also be advantageous to arrange both swivelable and non-swivelable positioning elements 25 on a single runner 32.

Further combinations are likewise possible.

In a method for setting a predetermined illumination setting, the individual mirrors 24 are positioned at the positions involved to this end with the aid of the positioning elements 25. Preferably, the number of individual mirrors 24, in particular the number of individual mirrors 24 positioned in the beam path of the projection optical unit 9, corresponds precisely to the number of pupil spots to be set. The number of individual mirrors 24 to be positioned, in particular the number of individual mirrors 24 to be positioned in the beam path of the projection optical unit 9, is, in particular, precisely as big as the number of field facets 17. In particular, the number of individual mirrors 24 is less than the total number of different radiation channels which are able to be set, which correspond to the number of field facets 17 multiplied by the number of switching positions thereof. In particular, it is less than the total number of all possible pupil spots 30. Unnecessary vignetting can be reduced, in particular avoided, as a result.

Preferably, the individual mirrors 24 which are not required for setting a specific illumination setting are driven out of the beam path.

In the case of a predetermined illumination setting, different regions on the reflection surface 22 are impinged by the illumination radiation 14 on the way from the reticle 7 to the wafer 12, i.e. in the beam path of the projection optical unit 9, in a manner dependent on the structure to be imaged on the reticle 7. In an advantageous variant, the information about which regions on the reflection surface 22 are impinged by specific orders of diffraction can be used to arrange the unused individual mirrors 24 and/or the positioning elements 25 of the individual mirrors 24 in such a way that neither the positioning elements 25 nor, in particular, the unused individual mirrors 24 obscure the beam path in the projection optical unit 9. In particular, they can be arranged in such a way that predetermined orders of diffraction can pass the optical component 23 without losses or at least with less than a maximum permissible vignetting. In particular, they can be arranged in such a way that the component of the vignetted energy relative to the overall energy is less than half the portion of the area vignetted by the individual mirrors 24 and/or positioning elements 25 relative to the overall area of the reflection surface 22.

In particular, it is possible to arrange the individual mirrors 24 in the beam path of the projection optical unit 9 in such a way that the entire vignetting of the reflection surface 22 by the individual mirrors 24, in particular by the optical component 23, is at most 10%, in particular at most 5%, in particular at most 3%, in particular at most 2%, in particular at most 1%.

Particularly in the case of swivelable positioning elements 25, the arrangement of the positioning elements 25 can also be adapted to the position of the regions used on the reflection surface 22 for imaging the reticle 7 on the wafer 12. In particular, it is possible to arrange the positioning elements 25 in such a way that at least some thereof extend not exactly in the radial direction. The angle range in which the positioning elements 25 can be arranged relative to the runner 32 can be restricted by the stops 41, 42. It can be selected as desired.

As a result of embodying the optical component 23 with positioning elements 25 of different length and/or adjustable length, it is possible to further increase the variability, in particular the number of possibilities of how a specific illumination setting can be set. In particular, provision can be made of an optimization method for selecting the arrangement of the positioning elements 25 with the individual mirror 24 which is in fact used for setting a predetermined illumination setting. In particular, it is possible to select the actually used arrangement from a discrete selection of different possibilities, in particular in a manner dependent on the structures to be imaged on the reticle 7. If the structures to be imaged are known, the illumination of the reflection surface 22, and hence also the effect of the positioning elements 25 and/or individual mirrors 24 at a given arrangement and/or length of the positioning elements 25, can be calculated from the illumination pupil. As a result of this, an advantageous, in particular ideal setting possibility can be selected from various setting possibilities.

Further aspects of the arrangement of the individual mirrors 24 of the optical element 23 are described below. The following aspects are combinable as desired with the different variants of the positionability of the individual mirrors 24.

As already described, the individual mirrors 24 serve as deflection mirrors for the illumination radiation 14. In particular, they serve to deflect illumination radiation 14 in the beam path of the illumination optical unit 4. In particular, they serve to guide the illumination radiation 14 from the field facets 17 to the reticle 7. For the purposes of setting the desired deflection of the illumination radiation 14, the positioning of the individual mirrors 24 is first of all important, as described above. Secondly, the beam-guiding properties of the individual mirrors 24 may depend on their respective orientation.

The individual mirrors 24 have a plane reflection surface 44. They can also have a curved, in particular convex or concave reflection surface 44.

Below, the orientation of the individual mirrors 24 is characterized in each case by a normal 43 on the reflection surface 44 thereof. In the case of individual mirrors 24 with a curved embodiment, this is understood to mean the normal 43 at a central point of the reflection surface 44.

So that the individual mirrors 24 can serve as facet elements of the illumination optical unit 4, it is desirable to arrange these in such a way that their reflection surface 44 is arranged respectively tilted in relation to the respectively adjacent region of the reflection surface 22 of the mirror $M_1$ or $M_2$ of the projection optical unit 9. In a simplified manner, this is expressed by virtue of the individual mirrors 24 being arranged in a tilted manner relative to the reflection surface 22, i.e. in a non-parallel manner relative to the latter.

It should be recalled at this point that a beam-guiding, in particular beam-deflecting effect can also be achieved by diffraction, i.e. with the aid of grating elements, in particular with the aid of so-called blazed gratings, or, in general, with diffractive optical elements (DOE). In this case too, the orientation of these elements can be characterized by a preferred direction, in particular by a normal on the grating plane.

Different possibilities for adjusting the orientation of the individual mirrors 24 are described below.

The individual mirrors 24 preferably have an adjustable orientation. It is possible only to embody individual ones of the individual mirrors 24 with an adjustable orientation, while at least individual ones of the individual mirrors 24 have a fixedly predetermined orientation. It is also possible to embody all of the individual mirrors 24 with an adjustable orientation.

It is also possible in each case to provide different individual mirrors 24 with associated positioning elements 25 for different orientations of the individual mirrors 24. While an adjustability of the orientation of the individual mirrors 24 leads to it being possible to reduce the overall number thereof, a larger number of individual mirrors 24 is involved in the variant according to which different individual mirrors 24 are provided for different orientations. Of this number, at most half, in particular at most 25%, in particular at most 10% are actually used for setting a typical illumination setting. However, the structural embodiment of the bearing of the individual mirrors 24, in particular the arrangement thereof at the positioning elements 25, is simpler in this alternative.

In particular, the individual mirrors 24 are embodied in such a way that the beam-guiding effect thereof is adaptable to different positionings, in particular to different positionings relative to the runner 32 and hence relative to the reticle 7.

In particular, the individual mirrors 24 each have at least one orientation degree of freedom. They can also have more than one orientation degree of freedom. In particular, the individual mirrors 24 can be mounted in a manner rotatable about an axis of rotation swiveled relative to the normal 43 thereof or in a manner swivelable about one or two swivel axes extending perpendicular to the normal 43 thereof.

In particular, the orientation of the individual mirrors 24 is adjustable by an actuator system.

An adjustable orientation of the reflection surface 44 of the individual mirror 24 can be achieved by virtue of the individual mirror 24 being mounted in a rotatable manner, wherein the normal 43 is arranged tilted with respect to the axis of rotation. Therefore, the normal 43 describes a lateral side of the cone about the axis of rotation in the case of a rotation of the individual mirror 24.

The tilt angle of the normal 43 relative to the axes of rotation lies, in particular, in the range of 0° to 45°, in particular in the range of 5° to 30°. It can also be fixedly predetermined. It can also be adjustable, in particular adjustable by an actuator system.

The individual mirrors 24 can also be mounted in a manner rotatable about two axes of rotation. This opens up greater flexibility to the extent of where the virtual light sources, from which the individual mirrors 24 are impinged by illumination radiation 14, can be attached.

Provided the individual mirrors 24 are arranged in such a way that the normal 43 thereof is tilted relative to the normal 35 on the plane 38, an adjustment of the positioning along the runner 32 generally leads to an associated change in the orientation of the individual mirrors 24. What can be achieved by suitable guiding of the illumination radiation 14 in the illumination optical unit 4 is that the orientation of the individual mirrors 24, which is predetermined by a position of the carriage 33 along the runner 32, precisely corresponds to the desired and/or required orientation. In this case, it is not absolutely necessary to separately adapt the orientation of the individual mirrors 24 to their positionings. However, this constitutes a special case. In general, it is advantageous to embody the individual mirrors 24 with an adjustable orientation. With the aid of the positioning elements 25, the individual mirrors 24 are positionable with an accuracy in the millimeter range or better. In particular, the positioning tolerance is at most 1 mm, in particular at most 300 µm, in particular at most 100 µm. In view of the orientation of the individual mirrors 24, the tolerance is at most 10 mrad, in particular at most 3 mrad, in particular at most 1 mrad, in particular at most 300 µrad, in particular at most 100 µrad, in particular at most 50 µrad.

Figure 13:
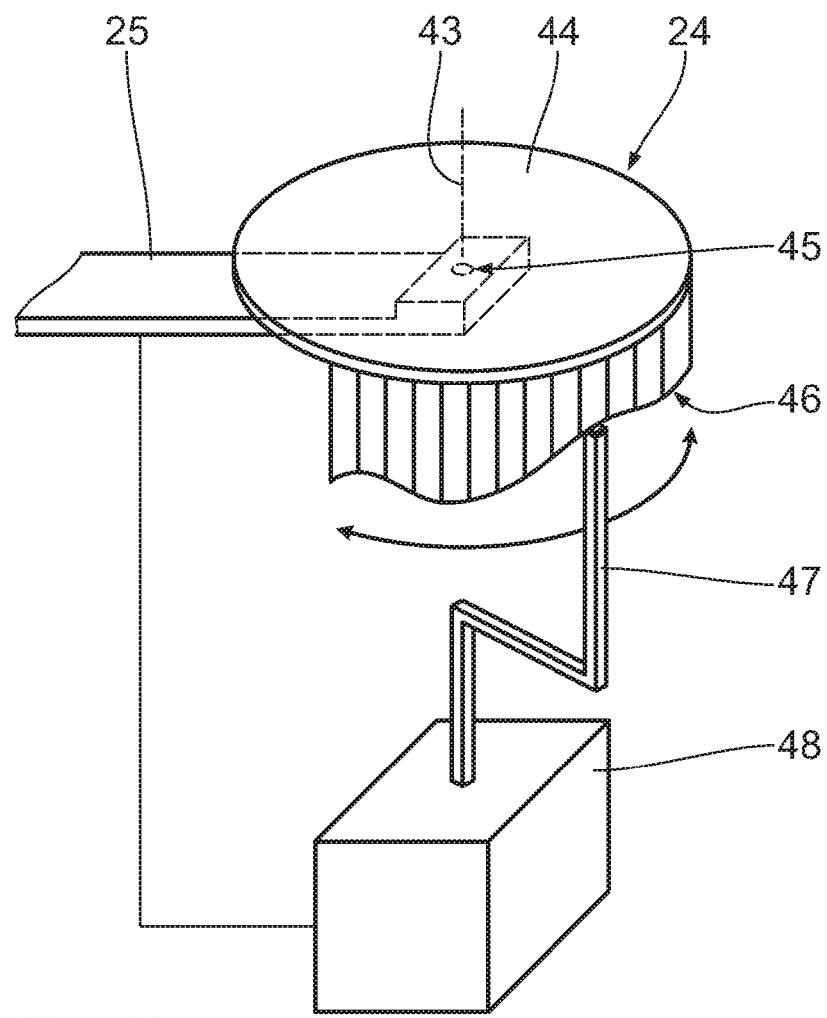
FIG. 13 shows a schematic illustration of a device for adjusting the orientation of a mirror.

In accordance with a variant depicted in FIG. 13, the individual mirror 24 is mounted via a fixed bearing 45 on the rear side of the individual mirror 24 lying opposite the reflection surface 44.

The individual mirror 24 has a profile 46 on its rear side lying opposite the reflection surface 44. The profile 46 has an embodiment which is non-parallel, i.e. oblique at least in part in relation to the reflection surface 44. It can have a planar embodiment and be inclined in relation to the reflection surface 44. It can also have an aplanar embodiment.

It is possible to drive along the profile via a side arm 47 which is actuatable by an actuator system. To this end, the side arm 47 is mechanically connected to an actuator 48, in particular a rotational actuator, at one end. The other end of the side arm 47 has mechanical contact with the profile 46. The orientation of the reflection surface 44 of the mirror 24 can be changed by rotating the side arm 47.

In particular, the actuator 48 is integrated into the positioning element 25. In particular, it has a fixed mechanical connection with the positioning element 25.

The illustration in FIG. 13 should be understood to be, firstly, schematic and, secondly, purely exemplary. Alternative embodiments for adjusting the orientation of the individual mirrors 24 with the aid of a side arm which is actuatable by an actuator system are possible.

Figure 14:
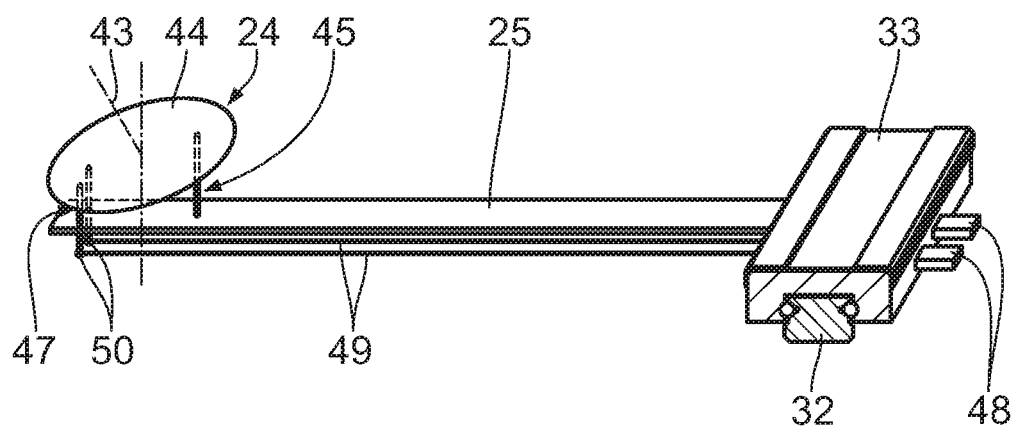
FIG. 14 shows a schematic illustration of a further device for adjusting the orientation of a mirror of the optical component.

A further variant is depicted in FIG. 14 in an exemplary manner. In this variant, two actuators 48 for adjusting the orientation of the individual mirror 24 are arranged at the carriage 33. They can be integrated into the carriage 33. In particular, these are linear actuators.

The actuators 48 each render it possible to shift an actuation rod 49 in a linear direction, in particular in the longitudinal direction of the positioning element 25. The shifting of the rods 49 is in each case transferred to the side arms 47 by way of a deflection 50. The orientation of the individual mirror 24 can be adjusted by shifting the rods 49 and by an actuation of the side arms 47 connected therewith. In particular, it is possible to adjust the direction of the normal 43 of the individual mirror 24 relative to the positioning element 25.

Figure 15:
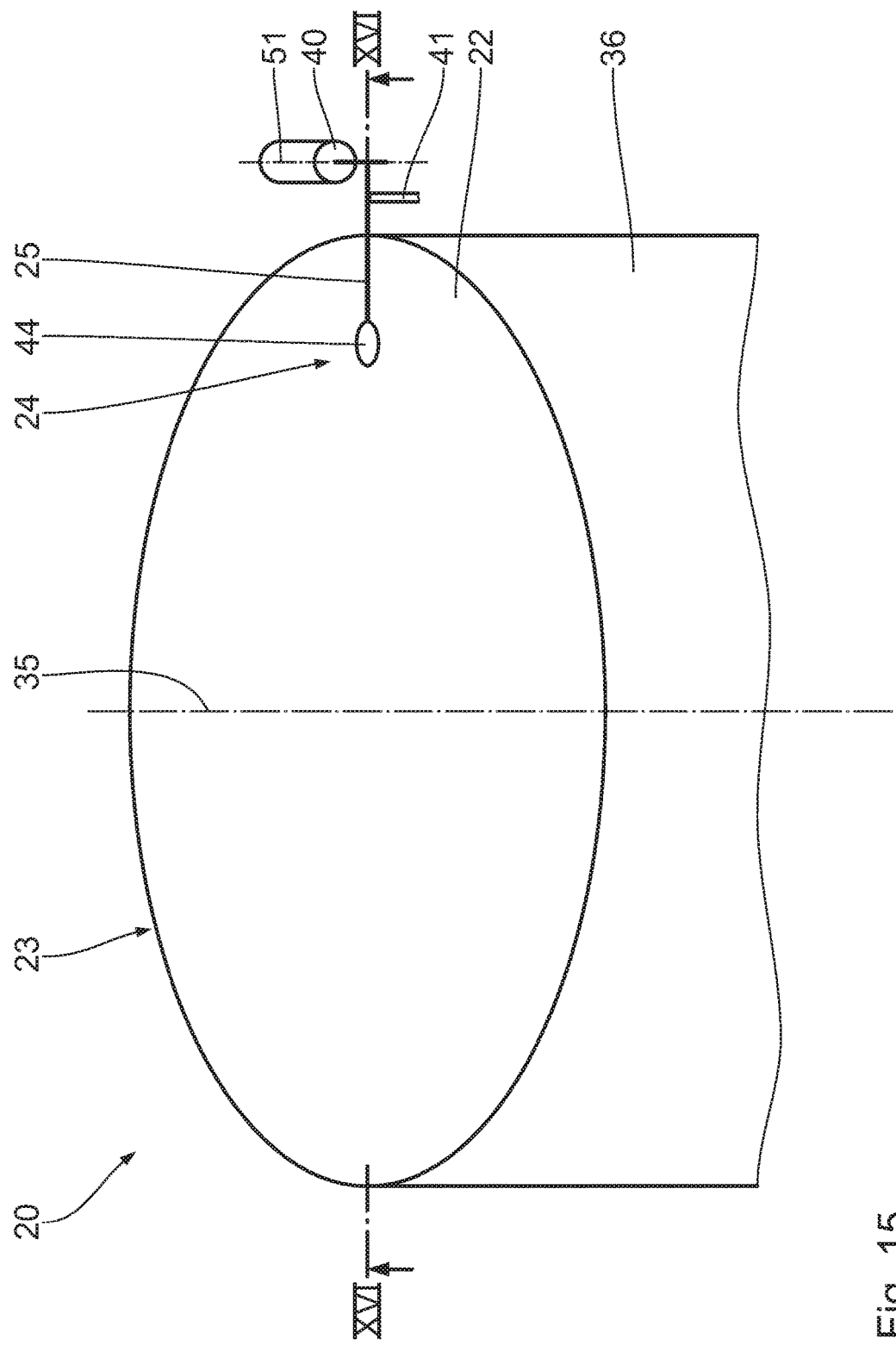
FIG. 15 shows a schematic illustration of a further mirror device with adjustable mirrors.
Figure 16:
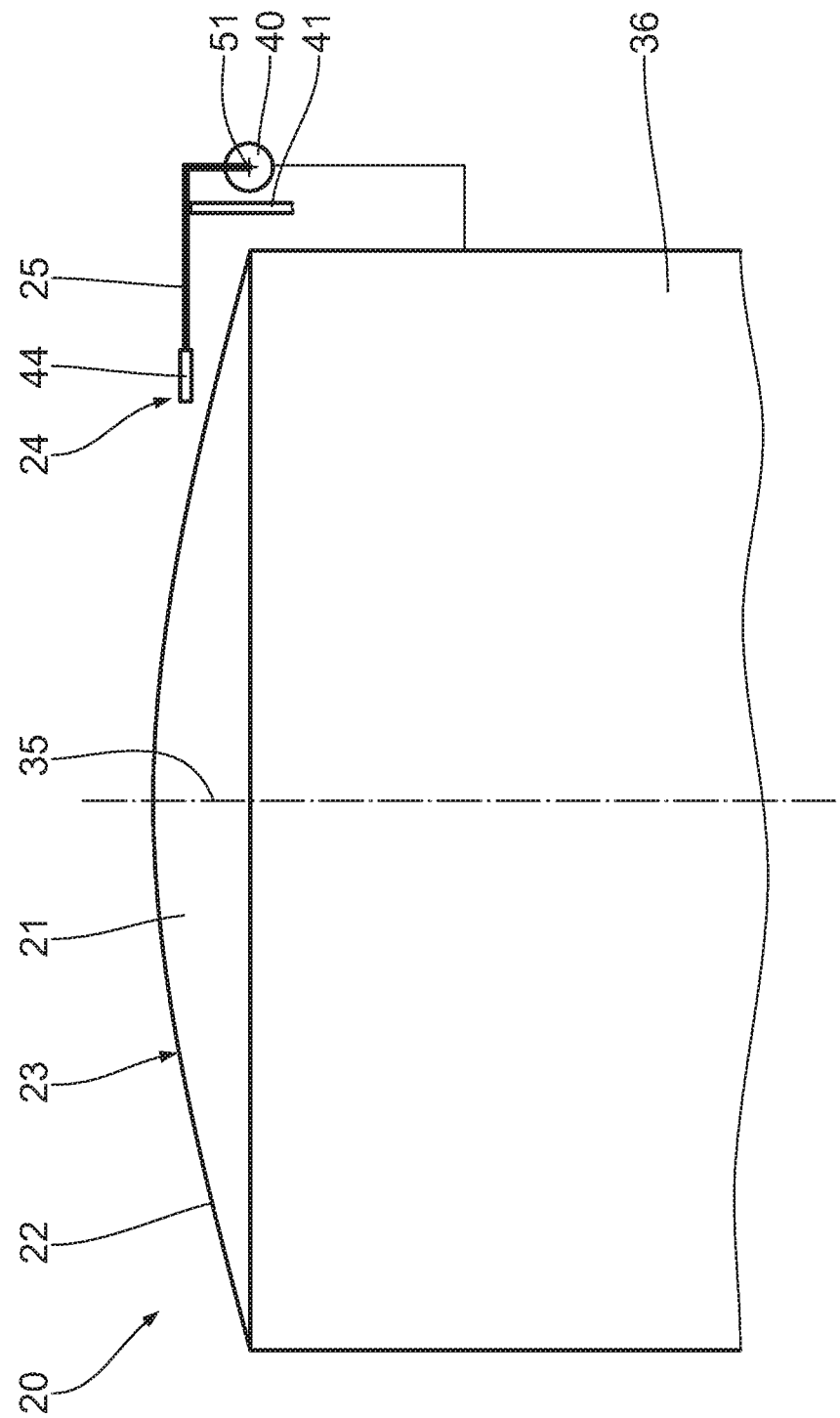
FIG. 16 shows a schematic cross section of the mirror device in accordance with FIG. 15 along the line XVI-XVI.

In accordance with a further variant depicted in FIGS. 15 and 16, the individual mirrors 24 can each be folded in and out. In particular, they are able to be folded into and out of the beam path of the illumination optical unit 4. To this end, in particular, they are mounted in a manner swiveable about an axis of rotation 51. In particular, the axis of rotation 51 is arranged parallel to the plane 38.

The actuator 40 is provided for swiveling the individual mirrors 24.

The stop 41 is provided for defining an end position in which the individual mirror 24 is in its reflection position.

The actuator 40 can be securely connected to the holder 36 for the mirror 21. In accordance with the variants described above, the actuator 40 can also be arranged on a carriage 33 arranged on the runner 32.

The orientation of the actuator 40 influences a spatial region in which the individual mirror 24 is swivelable. Therefore, the available space in the projection exposure apparatus 1, in particular in the region of one of the first mirrors $M_1$ and $M_2$ of the projection optical unit 9, can be taken into account by the orientation of the actuator 40. Depending on the conditions, it may be advantageous to swivel the mirrors in a plane which is parallel or at least substantially parallel to the plane 38, or else in a plane which is perpendicular or at least substantially perpendicular thereto, or in a plane which extends obliquely to this plane. Here, the term substantially parallel or substantially perpendicular should be understood to mean deviations of up to 10°, in particular of less than 5°.

The mirror device 20 forms, in particular, a constituent part of the projection optical unit 9. In particular, it forms a constituent part of both the projection optical unit 9 and the illumination optical unit 4.

Figure 17:
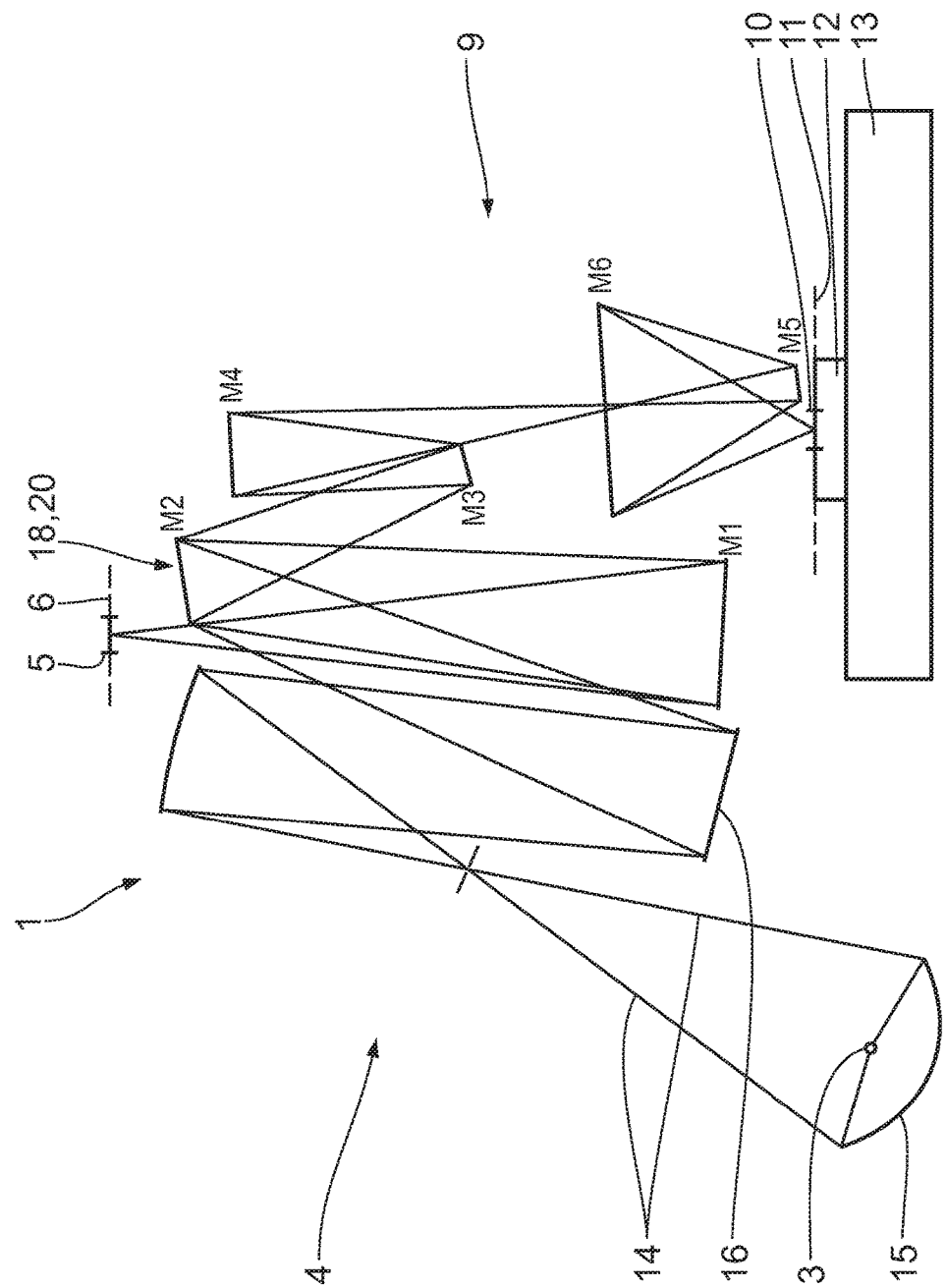
FIG. 17 shows a schematic illustration of the arrangement of the mirror device in the beam path of a projection exposure apparatus.

FIG. 17 depicts, in an exemplary manner, a beam path of the projection exposure apparatus 1, in which the mirror device 20 includes the second mirror $M_2$ in the beam path of the projection optical unit 9. A projection optical unit 9 with six mirrors $M_1 \ldots M_6$ is depicted in an exemplary manner. This should not be restrictive. It is likewise possible to embody the projection optical unit 9 with a different number of mirrors $M_i$, in particular with three, four, five, seven, eight or more mirrors $M_i$.

Figure 18:
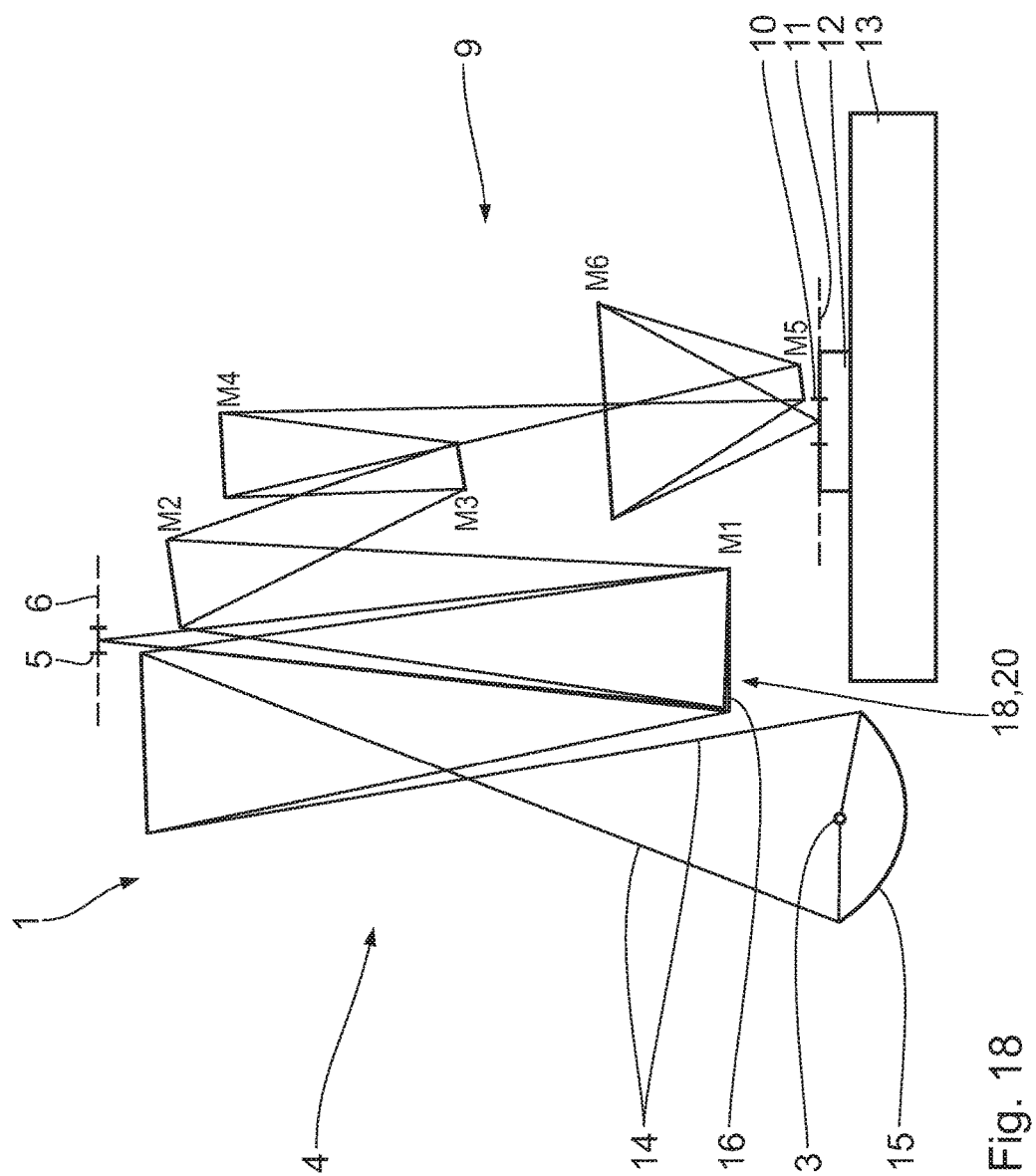
FIG. 18 shows a schematic illustration of an alternative arrangement of the mirror device in the beam path of a projection exposure apparatus.

The same applies to the arrangement in accordance with FIG. 18, which should likewise be understood to be exemplary. In this arrangement, the mirror device 20 includes the first mirror $M_1$ of the projection optical unit 9.

Figure 21:
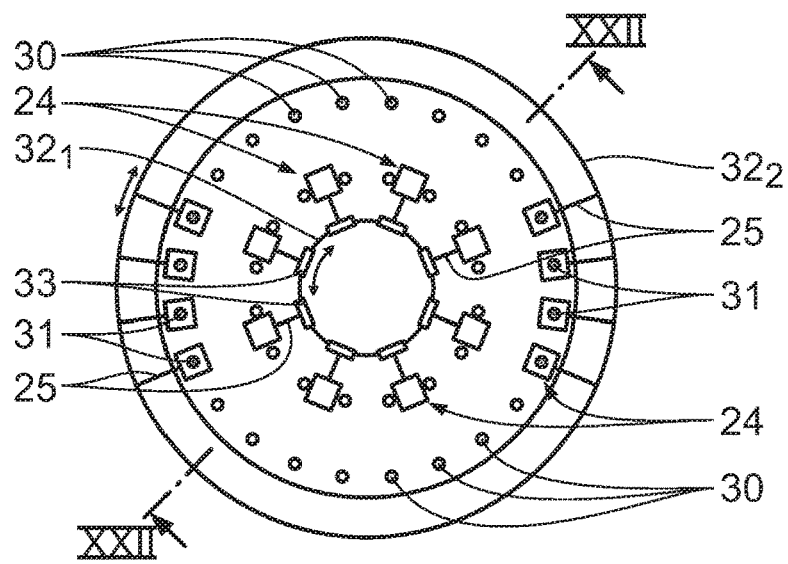
FIG. 21 shows a schematic view of a further mirror device.
Figure 22A:
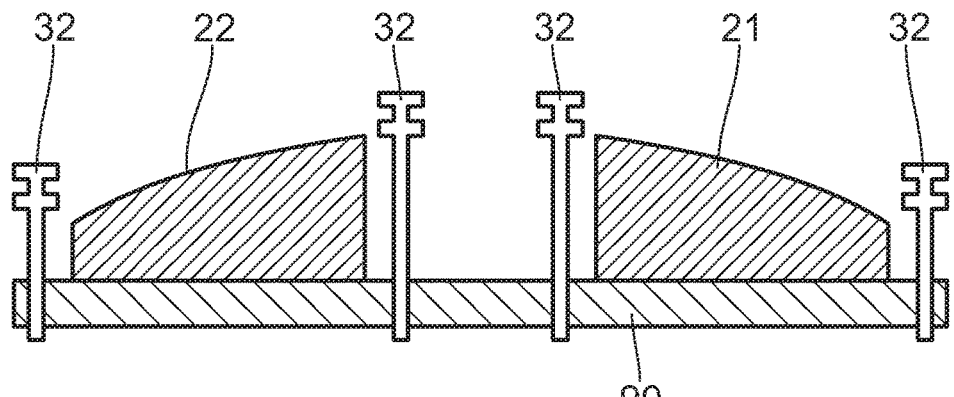
FIG. 22*a* shows a schematic cross section along the line XXII-XXII of the mirror device in accordance with FIG. 21.
Figure 22B:
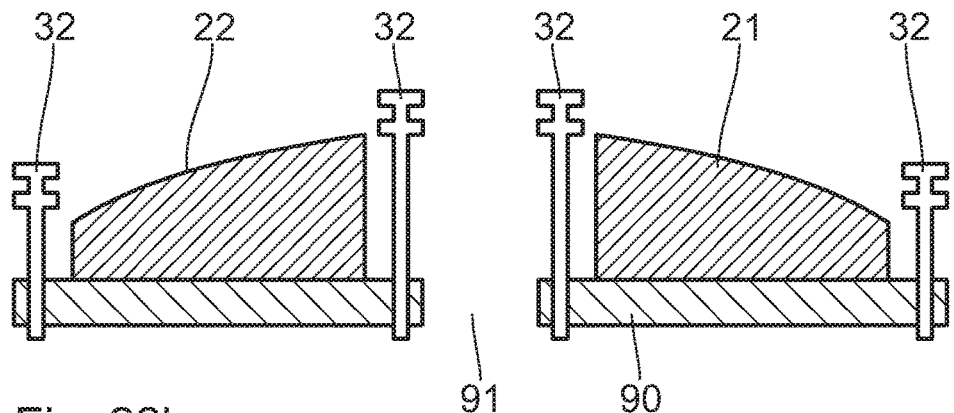
FIG. 22*b* shows a schematic cross section along the line XXII-XXII of a variant of the mirror device in accordance with FIG. 21.

FIGS. 21, 22a and 22b depict further variants of the mirror device 20. Identical parts acquire the same reference signs as in the case of the above-described variants, to the description of which reference is hereby made.

In the variants depicted in these figures, the guide device includes an outer runner $32_2$ and an inner runner $32_1$.

Substantially, these variants correspond to the variant depicted in FIGS. 3 to 5, wherein provision is additionally made of the inner runner $32_1$ with carriages 33, positioning elements 25 and individual mirrors 24 displaceable thereon in a guided manner.

In accordance with these variants, the runners $32_i$ are arranged on a holding plate 90. In particular, the holding plate 90 serves for mechanically fixing the runners $32_1$. They can also serve as carrier substrate for the mirror $M_i$ of the projection optical unit 9.

In the variant in accordance with FIG. 22a, the holding plate 90 has a continuous embodiment. In the variant depicted in FIG. 22b, the holding plate 90 has an opening 91. In particular, the opening 91 serves as a passage opening for the illumination radiation 14.

Such an arrangement of a guide device and positioning elements 25 displaceable thereon in a central region may be expedient, particularly in the case of a projection optical unit with a central obscuration of the pupil thereof. Such projection optical units are known from US 2006/0232867. A central obscuration of the pupil means that certain regions of the mirror $M_i$ of the projection optical unit cannot be impinged upon by light or the light which is reflected at these regions is certainly vignetted prior to reaching the wafer 12. Guide devices can advantageously be attached in such regions.

In the arrangement of the individual mirrors 24 which is depicted in an exemplary manner, the individual mirrors 24 which are mounted on the outer runner $32_2$ are in each case just situated in a reflection position, in which they respectively lie in one of the regions 31 for illuminating the reticle, which regions are actually used or provided to this end.

The individual mirrors 24 which are mounted on the inner runner $32_1$ are in each case just situated between two possible pupil spots 30 in accordance with the positioning shown in FIG. 21 in an exemplary manner. In this case, they would not contribute to the illumination of the reticle 7.

The individual mirrors 24 on the different runners $32_i$ can be positioned independently of one another. In principle, it is also possible to embody the controller and/or actuator system of the individual mirrors 24 in such a way that positioning of one of the individual mirrors 24 on one of the runners $32_i$ automatically leads to a positioning, adapted thereto, of one of the individual mirrors 24 on the other runner $32_j$ or, in the case of more than two runners $32_i$, on one of the other runners $32_j$.

In accordance with one advantageous variant, provision is made for the individual mirrors 24 which are not used for illuminating the reticle 7 to be displaced, in particular to be swiveled, in particular to be swiveled out of the beam path of the projection optical unit 9 in such a way that they do not lead to an obscuration of the beam path of the projection optical unit 9. In particular, the positioning thereof can be selected in such a way that at least predetermined orders of diffraction, in particular the respective zeroth and/or ±first order of diffraction are guided from the reticle 7 to the wafer 12.

Figure 23:
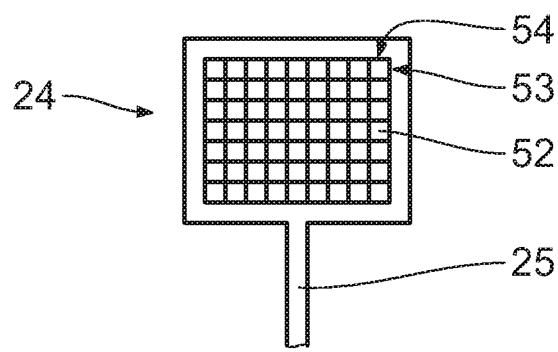
FIG. 23 shows a schematic illustration of a portion of an optical component, in which the beam-guiding element includes a multi-mirror arrangement (MMA)

A further variant for the adjustment of the orientation of the individual mirrors 24 is described below with reference to FIG. 23. In accordance with this variant, the individual mirrors 24 have a changeable form. In particular, they have a changeable reflection surface 44. This can be achieved by virtue of the reflection surface 44 of the individual mirrors 24 in each case being composed of the reflection surfaces of a multiplicity of micromirrors 52.

The micromirrors 52 can each have an area of at most 1 $cm^2$, in particular at most 4 $mm^2$, in particular at most 1 $mm^2$, in particular at most 0.4 $mm^2$. However, the individual reflection surface thereof can be so large that the beam-deflecting effect thereof can be described by geometric optics and reflection is the relevant physical effect. They can be arranged in a matrix with lines 53 and columns 54. In particular, they can form a multi-mirror array (MMA). In particular, they can be embodied as a microelectromechanical system (MEMS). In particular, they are individually displaceable. They can also be displaceable group-by-group, in particular line-by-line and/or column-by-column. In respect of further details about the micromirrors 52 and, in particular, the arrangement and displaceability thereof, reference is made to WO 2010/049 076 A1, which is completely integrated herewith as a constituent of the present application.

It is also possible to embody the micromirrors 52 to be so small that the beam-deflecting effect thereof corresponds to that of a grating, in particular a blazed grating, and diffraction is the relevant physical effect. Such micromirrors 52 are also referred to as digital micromirror devices (DMD).

The number of micromirrors 52 per individual mirror 24 is, in particular, in the range of 2 to 1000, in particular in the range of 4 to 300, in particular in the range of 9 to 150.

Figure 24:
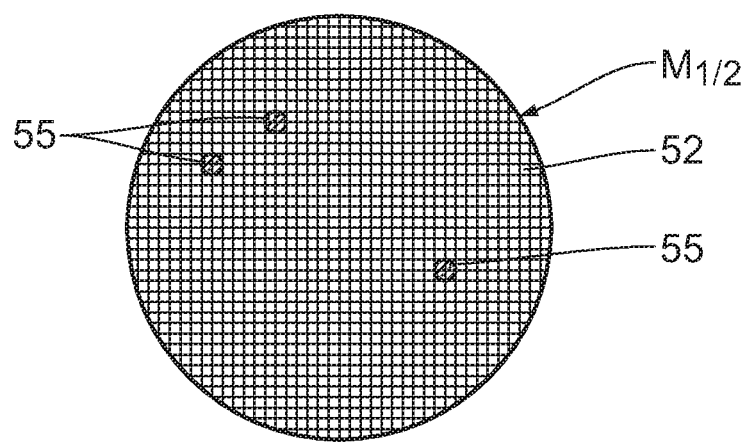
FIG. 24 shows a schematic plan view of the reflection surface of a mirror which is embodied as a multi-mirror arrangement (MMA)

In accordance with the variant depicted in FIG. 24, the form of the reflection surface 22, i.e. the form of one of the mirrors $M_1$ or $M_2$ of the projection optical unit, is changeable. In particular, provision is made for embodying the mirror $M_1$ and/or $M_2$ as an MMA, in particular as a MEMS. It may also be advantageous to embody the mirror $M_1$ and/or $M_2$ as an MMA, in particular as a MEMS, only in regions, for example in a circular-ring-shaped region.

The displaceability of the micromirrors 52 can be used to form virtual deflection mirrors 55 in a temporary local manner. The virtual deflection mirrors 55 can be formed in each case from one, two, four or more of the micromirrors 52. They can form a reflection surface which is adapted to the desired properties of the illumination optical unit 4. In particular, they can be embodied in such a way that they form pupil facets 19.

In particular, in this variant, it is possible to form at least some of the micromirrors 52 with an aplanar reflection surface. In particular, it is possible to embody the totality of the micromirrors 52 in such a way that the reflection surfaces thereof each form a portion of the desired reflection surface 22 of the mirror $M_1$ or $M_2$ of the projection optical unit 9. This is substantially harmless to the desired properties of the illumination optical unit 4, particularly in the case of micromirrors 52 with a surface area of less than 1 $mm^2$.

Figure 25:
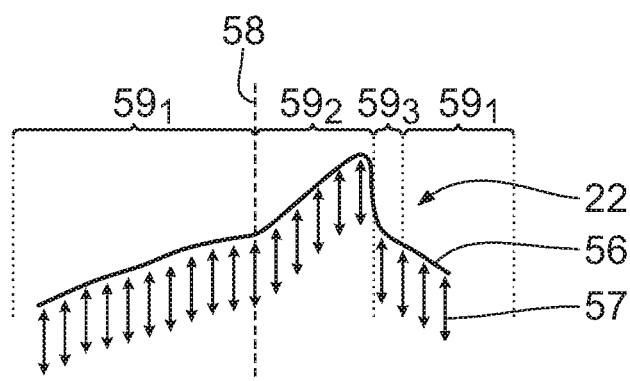
FIG. 25 shows a schematic sectional illustration through a mirror with an elastically changeable reflection surface.

A further variant of a mirror with a changeable reflection surface 22 is described below with reference to FIG. 25. The mirror includes an elastic membrane 56 in accordance with this variant. The reflection surface 22 is formed on the elastic membrane 56. A multiplicity of adjustable stamp devices 57 are arranged on the side of the elastic membrane 56 lying opposite the reflection surface 22. In particular, the stamp devices 57 are arranged parallel to one another. In particular, they can be arranged in a matrix-like lattice. In particular, they are extendable and retractable along a common adjustment direction 58. The form of the membrane 56, and hence the form of the reflection surface 22, can be set and modified with the aid of the stamp devices 57. Here, the membrane 56 ensures that the reflection surface 22 has a continuous embodiment. In particular, it is free from jumps or edges which could lead to diffraction effects. The reflection surface 22 is subdividable into different regions $59_1$, $59_2$ and $59_3$ with the aid of the stamp devices 57. Here, the region $59_1$ forms a reflection surface which is a constituent part of the projection optical unit 9. The region $59_2$ forms one of the virtual deflection mirrors 55 which, in particular, is a constituent part of the illumination optical unit 4. The region $59_3$ forms a transition region between the two regions $59_1$ and $59_2$.

Figure 26:
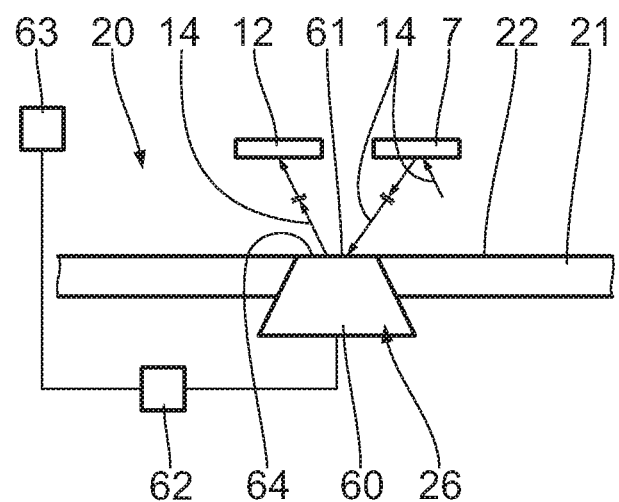
FIG. 26 shows a schematic sectional illustration through a portion of a further mirror device.

A further variant of the mirror device 20 is described below with reference to FIG. 26. This variant relates to the principle depicted in FIG. 2a, according to which illumination radiation 14 is guided from the radiation source 3 to the reticle 7 through radiation-transmissive regions 26 in the mirror body 21. As was explained in an exemplary manner on the basis of FIGS. 19 and 20, the number of pupil spots 30 is substantially higher than the number of regions 31 actually used. Since a radiation-transmissive region 26 is provided in the mirror body 21 for each possible pupil spots 30, illumination radiation 14 which could be used to image the reticle 7 in the wafer 12 is lost in the beam path of the projection optical unit 9. In order to reduce these losses, provision is made according to the variant depicted in FIG. 26 for a plug 60 to be used to close the radiation-transmissive regions 26 which are not used.

The plug 60 has a conical-frustum-shaped embodiment. In particular, it has a complimentary embodiment to a conical form of the radiation-transmissive regions 26.

The plug 60 is adapted to the respective opening in the mirror body 21 which forms the radiation-transmissive region 26. On the smaller cover surface 61 thereof, it has a form which completes the form of the reflection surface 22 in the region of this radiation-transmissive region 26. The smaller cover surface 61 is embodied as a reflection surface 64 for reflecting the illumination radiation 14.

An actuator 62 is provided for positioning the plug 60 in the opening in the mirror body 21. As a constituent part of an interferometric device, the actuator 62 is preferably connected to a sensor 63 in a data-transferring manner. The sensor 63 serves to detect the position of the plug 60, in particular the position of the plug 60 in the radiation-transmissive region 26. With the aid of the interferometric device, the plug 60 can, in particular, be positioned so precisely in the radiation-transmissive region 26 that the offset in the transition from the reflection surface 22 to the reflection surface 64 of the plug 60 is less than a fraction of the wavelength of the illumination radiation 14, in particular less than ¼, in particular less than ⅛, in particular less than ¹⁄₁₆, in particular less than ¹⁄₃₂ of the wavelength of the illumination radiation 14. The offset is at least less than such a fraction of the wavelength modulo the wavelength. As a result of this, destructive interferences can be avoided.

Figure 27:
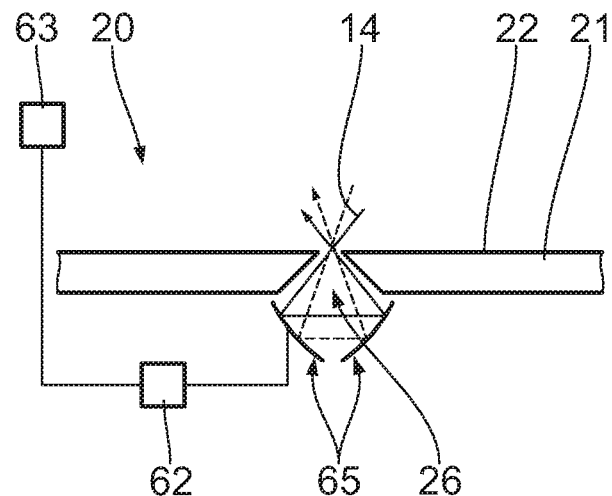
FIG. 27 shows a schematic sectional illustration through a portion of a further mirror device.

A further variant of the mirror device 20 is described below with reference to FIG. 27. This variant substantially corresponds to the variant in accordance with FIG. 26, wherein a reflector 65 is arranged on the rear side of the mirror body 21 in place of the plug 60. The reflector 65 is adjustable, in particular adjustable by an actuator system. The actuator 62 is provided for adjusting the reflector 65. The position of the reflector 65 is regulable via the interferometric device which includes the actuator 62 and the sensor 63. The radiation-transmissive region 26 is closable in a virtual manner via the reflector 65.

The illumination radiation 14 is reflected at the reflector 65, in particular two times.

The reflector 65 is adjustable in such a way that the optical path in the reflector modulo the wavelength is less than a fraction of the wavelength, in particular less than ¼, in particular less than ⅛, in particular less than ¹⁄₁₆ of the wavelength.

Moreover, the optical path in the reflector 65 is shorter than the longitudinal coherence length of the illumination radiation 14. Therefore, this variant is particularly suitable for narrow-band radiation sources 3.

Further aspects and refinements of the positioning and/or the setting of the orientation of the individual mirrors 24 are described below.

To the extent that the individual mirrors 24 have an adjustable orientation, in particular a reflection surface 44 with an adjustable normal 43, they can be used as pupil facets 19 at any desired positioning in the pupil. In particular, it is possible to continuously adjust the position of the pupil facets 19. Therefore, the position of the pupil spots 30, in particular of the used regions 31, is not restricted to discrete, predetermined positions.

While the individual mirrors 24 are arranged outside of the object-side numerical aperture of the illumination optical unit 4, this can be used for dark-field illumination of the reticle 7. To the extent that the optical component 23 with the individual mirrors 24 with a first mirror $M_1$ of the projection optical unit 9 forms the mirror device 20, there is no need for changes on the projection lens. In particular, it is not necessary to enlarge the diameters of the mirrors $M_i$ of the projection optical unit 9.

If the optical component 23 is intended to be combined with the second mirror $M_2$ of the projection optical unit 9 to form the mirror device 20, provision is made for the first mirror $M_1$ of the projection optical unit 9 to be enlarged.

In accordance with the variants of the mirror device 20 described above, a single individual mirror 24 is in each case positionable with in each case one of the positioning elements 25. Here, each one of the individual mirrors 24 serves, in particular, to form a pupil facet 19, which is to be arranged in a specific region 31.

However, it is also possible to bring more than a single pupil facet 19 to the desired positions thereof using a single positioning element 25. This can, in particular, simplify the mechanical implementation.

If only a few discrete illumination settings should be able to be set, in particular at most ten different illumination settings, in particular at most four different illumination settings, the positioning elements 25 can each be embodied in such a way that they serve for the positioning of more than one of the individual mirrors 24, in particular for two, three, four or more of the individual mirrors 24. In other words, it is possible to arrange more than one of the individual mirrors 24, in particular two, three, four or more of the individual mirrors 24, at one of the positioning elements 25, in particular at a selection of the positioning elements 25, in particular at all of the positioning elements 25. Like in the variants described above, these individual mirrors 24 can be positioned in the beam path of the illumination optical unit 4. In particular, it is advantageous if these individual mirrors 24 can be swiveled into an off position outside of the beam path of the illumination optical unit 4 and, in particular, outside of the beam path of the projection optical unit 9.

Figure 28:
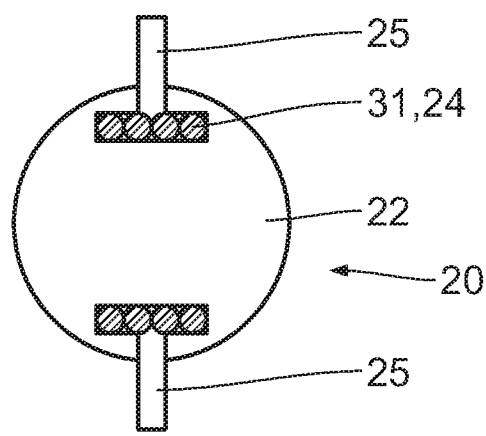
FIGS. 28 to 30 show schematic illustrations of a further mirror device in different arrangements for setting different illumination settings.
Figure 29:
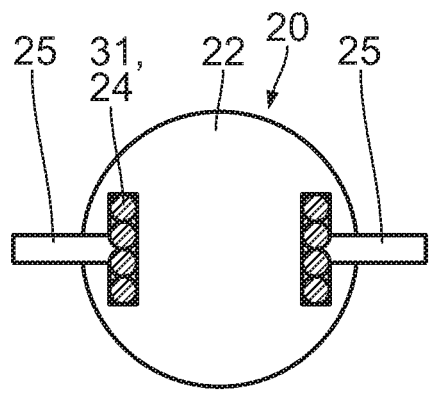
Figure 30:
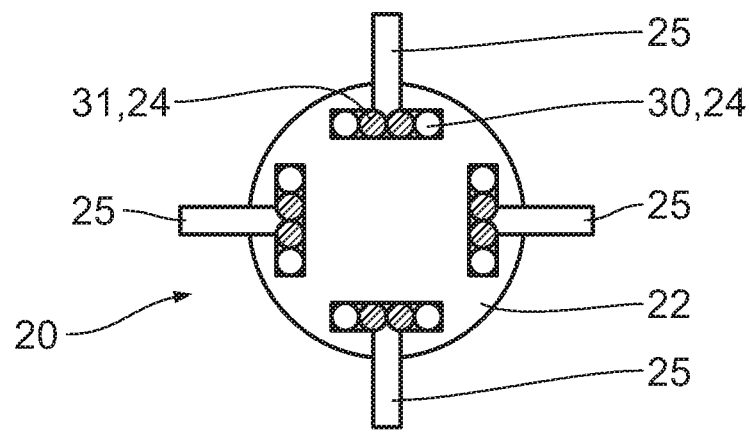

A variant with four positioning elements 25 is depicted schematically in FIGS. 28 to 30. Four individual mirrors 24 are arranged at each one of the positioning elements 25 in each case.

Using this mirror device 20, it is possible, in particular, to set a y-dipole illumination setting (FIG. 28), an x-dipole illumination setting (FIG. 29) and a c-quad illumination setting (FIG. 30). Each one of these three illumination settings includes the same number of actually used regions 31. In the c-quad illumination setting, two individual mirrors 24 which do not contribute to the illumination of the reticle 7 are arranged on each one of the positioning elements 25 in each case. However, the structural outlay is significantly simplified by the arrangement of more than one individual mirror 24 at each positioning element 25.

Figure 31:
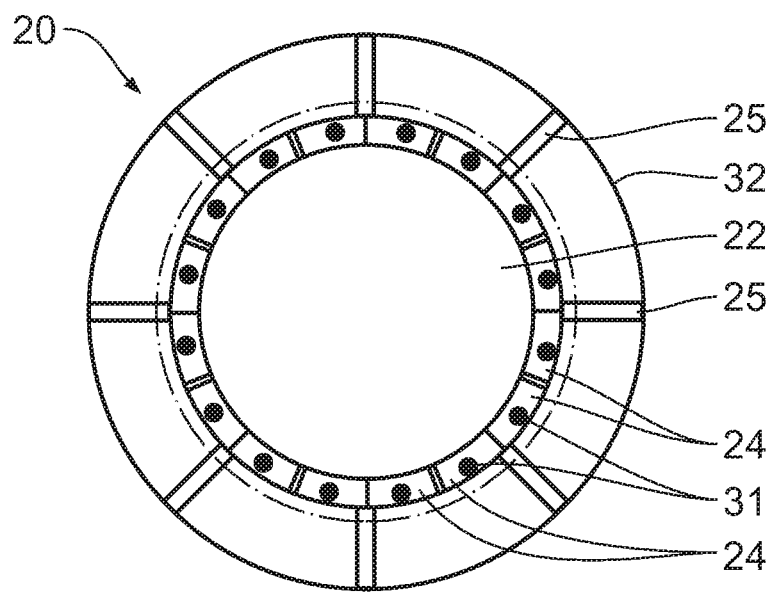
FIGS. 31 and 32 show schematic illustrations of further mirror devices.

FIG. 31 schematically depicts a further variant, in which more than one individual mirror 24 is arranged at each one of the positioning elements 25. In this variant, two individual mirrors 24 are arranged at each positioning element 25 in each case. This variant is suitable, in particular, for setting differently oriented dipole illumination settings and/or an annular illumination setting. If only dipole illumination settings are intended to be set, it is possible to reduce the number of positioning elements 25 in this variant to two or four.

Figure 32:
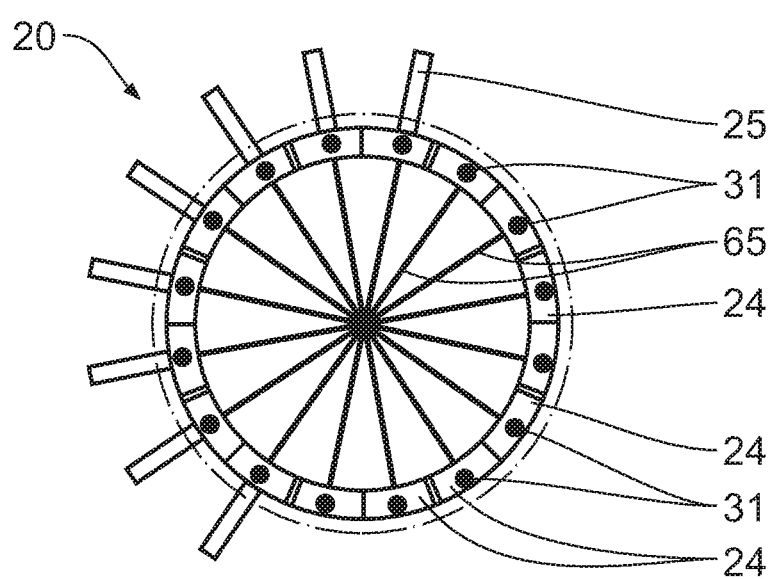

FIG. 32 depicts a further variant, in which two individual mirrors 24 are arranged at each one of the positioning elements 25 in each case. The two individual mirrors 24 are arranged in each case at the mutually opposing end of a common pointer 65. In particular, they are arranged in such a way that they come to rest in a point-symmetrical manner within the pupil. As a result of this, the telecentricity of the illumination of the reticle 7 is improved.

In this variant, provision can be made for the optical component 23 to be embodied with a single positioning element 25 of this type and two individual mirrors 24 fixedly connected to one another via the pointer 65. However, the optical component 23 can have two or more such positioning elements 25.

Figure 33:
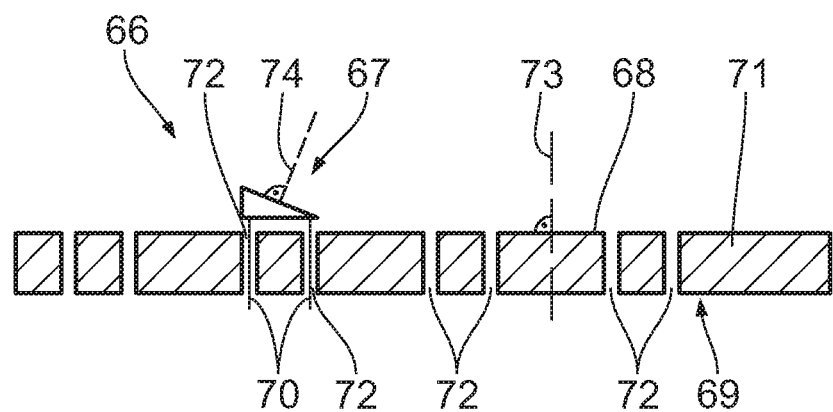
FIG. 33 shows a schematic cross section through a portion of a mirror device with facet elements which are able to be placed onto the mirror body.
Figure 34:
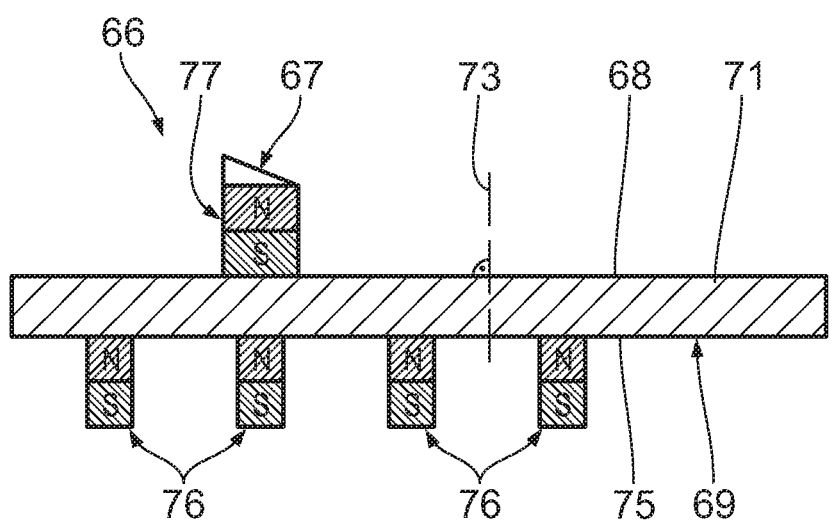
FIG. 34 shows a schematic illustration of a further mirror device with facet elements which are able to be placed onto the mirror body.

FIGS. 33 and 34 depict two further variants of a mirror device 66 with variable facet elements 67.

In the variants depicted in FIGS. 33 and 34, the facet elements 67 are arranged variably on the reflection surface 68 of the mirror 69.

The mirror device 66 includes the mirror 69 and the facet elements 67.

In view of the function thereof and/or arrangement thereof in the projection exposure apparatus 1, the mirror device 66 corresponds to the mirror device 20 described above, with the description thereof being referred to herewith.

The facet elements 67 are provided with pin-like feet 70. In particular, they are provided with two, three or more feet 70 in each case. The feet 70 serve to arrange the facet elements 67 at predetermined positions on the reflection surface 68 of the mirror 69. To this end, the mirror body 71 of the mirror 69 in each case has the appropriate number of bores 72 at these positions.

The bores 72 have a cross section which is substantially smaller than the cross section of the facet elements 67 in the direction perpendicular to the normal 73. In particular, the ratio of the cross section of the bores 72 to the cross section of the facet elements 67 in the direction perpendicular to the normal 73 is at most 1:10, in particular at most 1:30, in particular at most 1:100, in particular at most 1:300, in particular at most 1:1000. In particular, the obscuration of the mirror 69 caused by the bores 72 is substantially less than the obscuration caused by the totality of the facet elements 67. In particular, it is substantially less than the obscuration which would be caused by an arrangement of facet elements 67 at all possible positions predetermined by the bores 72.

The feet 70 are able to be clamped into the bores 72. To this end, they can have a resilient and/or elastic embodiment.

The facet elements 67 each have a surface normal 74 which is inclined to a normal 73 of the reflection surface 68 of the mirror 69.

Provision is made of having a dedicated facet element 67 for each field facet 17 and each switching position of same. Then, for the purposes of setting a specific illumination setting, the facet elements 67 involved to this end only are to be arranged on the mirror 69.

In so doing, it is possible to ensure that the facet elements 67 can be arranged only in the respectively provided position on the reflection surface 68 of the mirror 69 by way of different arrangements of the feet 70 and the bores 72 corresponding thereto.

The arrangement of the facet elements 67 and/or the replacement of same can be carried out with the aid of an actuator embodied as a pick-and-place robot. In this case, the pick-and-place robot forms the guide device.

Instead of fixing the facet elements 67 via feet 70 to be inserted into the bores 72, provision can be made for the facet elements 67 to be fixed magnetically on the reflection surface 68 of the mirror 69, as depicted schematically in FIG. 34. To this end, magnets 76 are arranged on the rear side 75 of the mirror body 71. The magnets 76 can be fixedly connected to the mirror body 71. They can also be arranged on the mirror body 71 in an adjustable manner. In particular, they can be adjustable in the direction perpendicular to the normal 73.

The possible positionings of the facet elements 67 on the mirror body 71 can be predetermined by the arrangement of the magnets 76.

For the purposes of fixing the facet elements 67 to the mirror body 71, these are likewise provided with magnets 77.

The actuator provided for interchanging the facet elements 67 includes, in particular, an electromagnet, via which the field of the respective magnet 76 provided for fixing the facet elements 67 on the mirror body 71 can be compensated. This renders it possible to detach the facet elements 76 from the mirror 69 again in a simple manner.

For the purposes of setting a specific illumination setting, the beam-guiding elements which serve as pupil facets 19 firstly have the desired positioning and secondly have the orientation fitting thereto. In particular, it is generally desirable to align the normals 73 of the beam-guiding elements in a suitable manner.

In accordance with a further aspect of the disclosure, it was identified that it may be advantageous to compensate tolerances in the orientation of the pupil facets 19, in particular of the beam-guiding elements which form the pupil facets 19, by adaptations on the field facet mirror 16. The method provided to this end is explained below on the basis of FIG. 35, which is schematic. In accordance with this variant, provision is made of a sensor device 78, via which the actual orientation of the pupil facets 19 can be determined. In particular, the actual orientation of the pupil facets 19 is determinable with an accuracy better than 1 mrad, in particular better than 0.1 mrad, in particular better than 50 μrad.

The position and extent of the original image of the reticle 7 on the first facet mirror 16 can be calculated from the known position of the reticle 7 and the determined positioning and orientation of the pupil facets 19.

Figure 35:
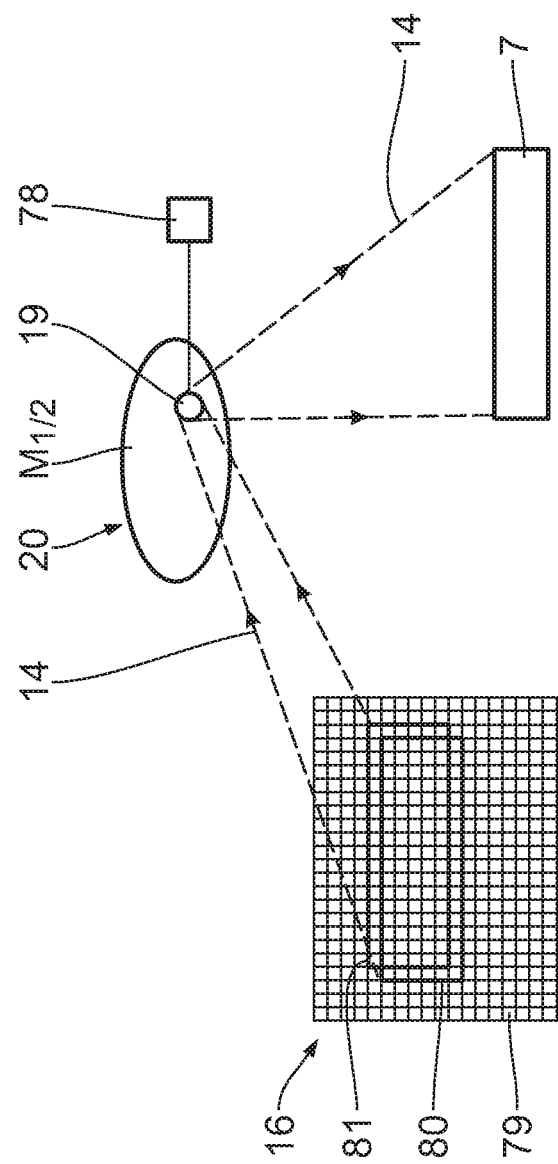
FIG. 35 shows a schematic illustration of the beam path from a first faceted element to the reticle for the purposes of explaining a method for compensating tolerances in the orientation of the pupil facet.

Preferably, the first facet mirror 16 is embodied as a multi-mirror arrangement (MMA), in particular as a MEMS-MMA. In this case, the individual micromirrors 79 of the first facet mirror 16 can precisely be grouped and oriented in such a way that precisely one virtual facet is formed for each pupil facet 19, the virtual facet corresponding to the original image of the reticle 7 on the first facet mirror 16. In other words, provision is made for the position of the facets, in particular the field facets 17, on the first facet mirror, in particular the field facet mirror 16, to be selected or adjusted in a manner dependent on the orientation of the pupil facets 19. FIG. 35 schematically depicts a position 80 of a field facet 17 without such an adjustment and the corresponding position 81 after the adjustment. What emerged is that tolerances in the orientation of the pupil facets 19 up to several mrad can be compensated for by an appropriate adjustment in the position 80 of the field facets 17 on the field facet mirror 16.

A further variant of the mirror device 20 is described below with reference to FIG. 36. Identical parts acquire the same reference signs as in the case of the above-described variants of the mirror device 20, to the description of which reference is hereby made. In the variant in accordance with FIG. 36, the mechanical guide device includes four wheel manipulators 82.

Each wheel manipulator 82 includes an actuator 83, via which a plurality of positioning elements 25 with individual mirrors 24 are rotatably mounted about a common axis of rotation 84. The positioning elements 25 are arranged around the axis of rotation 84 in a star-shaped manner. A variant with in each case six positioning elements per wheel manipulator 82 is depicted. A number of positioning elements 25 per wheel manipulator 82 deviating therefrom is likewise possible. In the case of a single positioning element 25 per wheel manipulator 82, the variant in accordance with FIG. 36 substantially corresponds to the variant in accordance with FIGS. 11 and 12.

Figure 36:
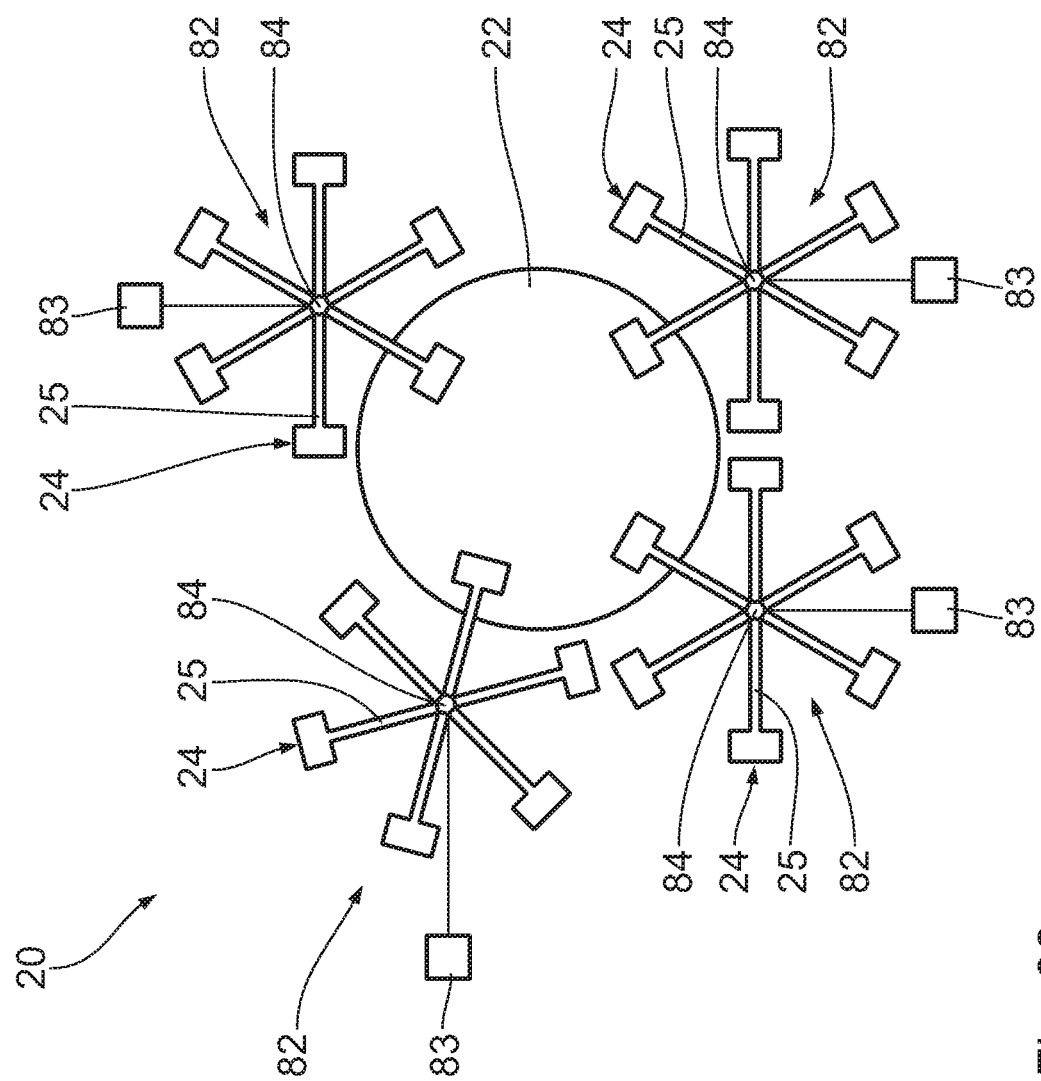
FIG. 36 shows a schematic illustration of a further mirror device with variably positionable facet elements.

The individual wheel manipulators 82 can also be displaceably mounted along a runner in a variant in accordance with FIG. 36.

The positioning elements 25 of one and same wheel manipulator 82 can in each case have pairwise different lengths $l_i$.

The individual mirrors 24 of one and same wheel manipulator 82 can in each case have pairwise different orientations. They can also have an adjustable orientation.

In this variant, it is also possible for the individual mirrors 24 to be continuously adjustable, in particular to have a continuously adjustable positioning and/or orientation. They can also have discrete positionings and/or orientations.

Figure 37:
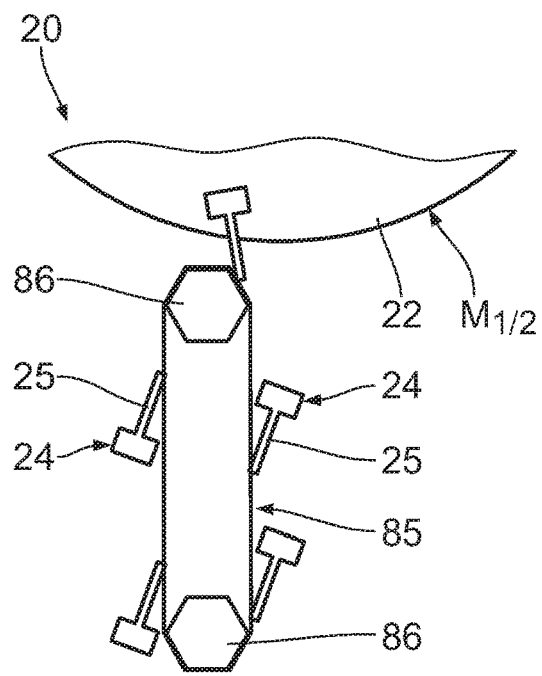
FIGS. 37 and 38 show schematic illustrations of a portion of a further mirror device with variably positionable facet elements.

A further variant of the mirror device 20 is described below with reference to FIG. 37. In accordance with this variant, the positioning elements 25 are threaded onto a band or a chain 85. The band or the chain 85 is drivable via a drive device with at least two drive and/or deflection elements 86. At least one of the drive and/or deflection elements 86 has a noncircular, in particular a polygonal, in particular triangular, quadrilateral, pentagonal or hexagonal cross section. As a result of this, the positioning of the individual mirrors 24 can be simplified. In particular, it is possible to improve the precision of the positioning of the individual mirrors 24.

The positioning elements 25 can be rigidly connected to the band or the chain 85.

Figure 38:
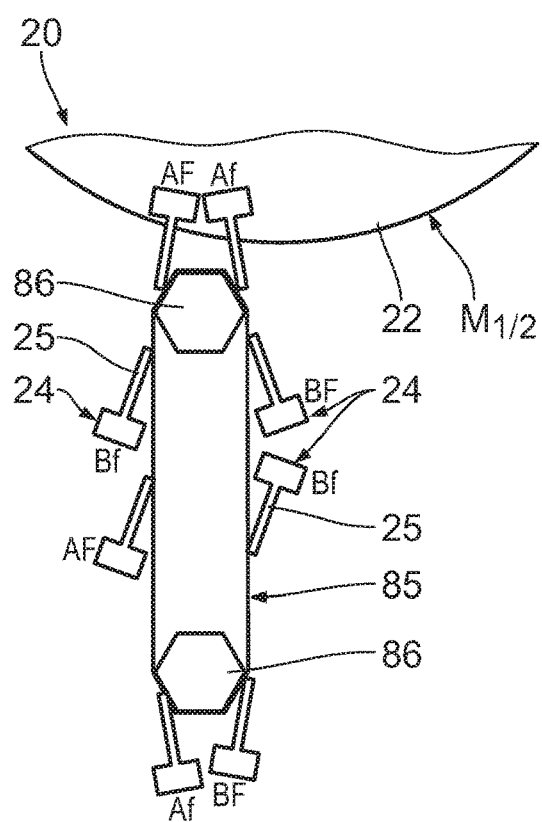

In accordance with a further variant schematically depicted in FIG. 38, it is also possible to arrange the positioning elements 25 with the individual mirrors 24 on the band or the chain 85 in such a way that more than one individual mirror 24, in particular two of the individual mirrors 24 or more than two of the individual mirrors 24 simultaneously contribute to an illumination setting. As a result of this, it is possible, in particular, to position in each case two or more of the pupil facets 19, which are impinged with illumination radiation 14 by two or more of the field facets 17, in the beam path of the illumination optical unit 4 via a single such positioning device.

FIG. 38 schematically depicts a variant in which the different individual mirrors 24 can serve in each case as pupil facets 19 for two of the field facets 17 with two different switching positions A, B. For elucidation purposes, it is specified next to each one of the individual mirrors 24 for which one of the two field facets 17 (F, f) and for which one of the two switching positions (A, B) the respective individual mirror 24 forms the associated pupil facet 19.

To the extent that all combinations of the different switching positions of the field facets 17 are intended to be taken into account, the number of groupings of the positioning elements 25 with the individual mirrors 24 on the band or the chain 85 precisely corresponds to the product of the number of switching positions of the respective field facets 17. However, depending on desired properties, it is also possible to omit one or more of these combinations.

A further variant of the mirror device 20 is described below with reference to FIG. 39. It was identified that the pupil can be built up in scanning fashion provided that the positioning elements 25 with the individual mirrors 24 are quickly displaceable between different positions. A scanning build-up of the pupil is possible, in particular, provided that the period of time for displacing the positioning element 25 with the individual mirror 24 between two different positionings is shorter than the period of time which a point on the wafer 12 involved for passing through the scanning slit. In accordance with this variant, only some of the used regions 31 are illuminated at each instant of the illumination of the reticle 7, and hence of the wafer 12. The whole pupil only emerges in the scan integral.

Figure 39A:
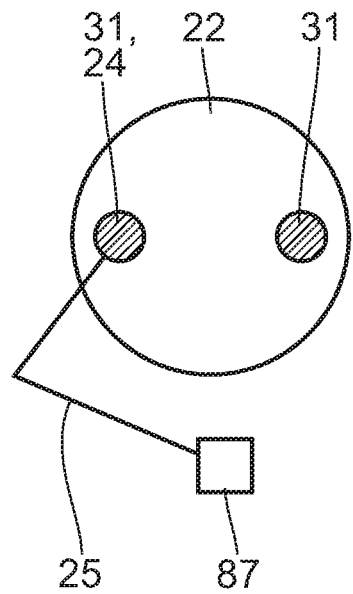
FIGS. 39*a* to *d* show schematic illustrations of a further mirror device with a variably positionable facet element in different positions, FIG. 40 schematically shows a portion of an optical component with variably positionable facet elements, FIG. 41 schematically shows two cross sections of the optical component in accordance with FIG. 40, placed over one another, along the lines XLIa-XLIa and XLIb-XLIb.
Figure 39B:
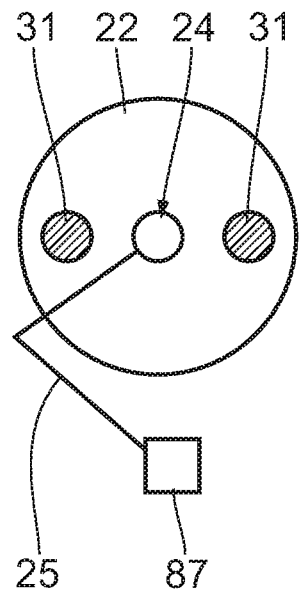
Figure 39C:
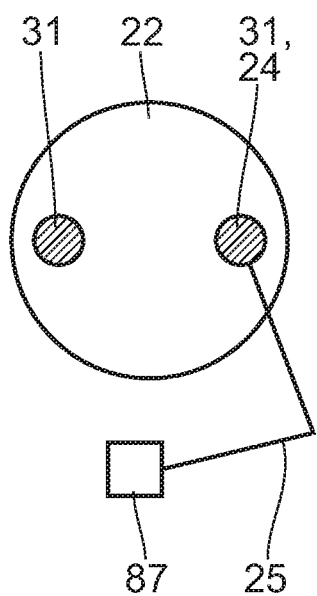
Figure 39D:
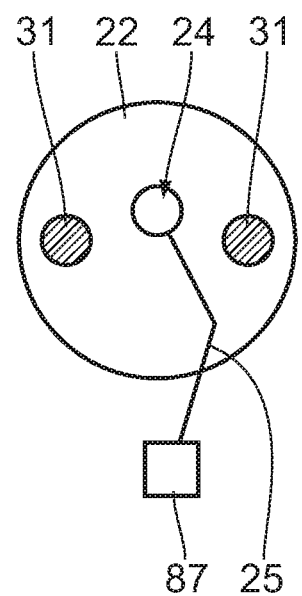

FIGS. 39a to d schematically depict the displacement of one of the individual mirrors 24 between a first used region 31 (FIG. 39a) and a second used region 31 (FIG. 39c). The two schematically depicted used regions 31 serve to generate a dipole illumination setting. In the intermediate positions depicted in FIGS. 39b and 39d, the individual mirror 24 is situated in the pupil region not required, and actually unwanted, for the illumination setting. The time duration for displacing the individual mirror 24 from the first used region 31 (FIG. 39a) into the second used region 31 (FIG. 39c) and back again should therefore be as short as possible. Therefore, a fast actuator 87 is provided for displacing the individual mirror 24. In particular, the time for displacing the individual mirror 24 between the two used regions 31 is less than 1 ms, in particular less than 0.5 ms, in particular less than 0.3 ms, in particular less than 0.1 ms. In particular, it is shorter than the time duration for which the individual mirror 24 is kept stationary in the used regions 31 in each case. In particular, the latter time duration is at least 0.1 ms, in particular at least 0.3 ms.

Provision can be made for the illumination radiation 14 to be switched off during the displacement of the individual mirror 24. In this case, smearing of the pupil is avoided.

It is also possible to leave the illumination radiation 14 switched on during the displacement of the individual mirror 24. In this case, the pupil is smeared, i.e. the pupil with which the wafer 12 is exposed differs slightly from a predetermined pupil; however, this can often be tolerated. In addition to an increase in the throughput, i.e. the speed with which the wafer 12 can be exposed, an advantage is, inter alia, that the radiation source 3 need not be switched off and hence there is no new switch-on gradient.

Even if only a single positioning element 25 adjustable in such a way is depicted in FIG. 39, provision can also be made of two, three, four or more such positioning elements 25. These can in turn have additional actuation degrees of freedom. In respect of details, reference is made to the variants described above.

An advantageous variant of the runner 32 is described below with reference to FIGS. 40 and 41. In particular, it was identified that the alignment of the normal 43 depends on the local derivative of the spatial extent of the runner 32.

The runner 32 can have a three-dimensional, in particular aplanar embodiment. In other words, it has a profile which does not lie in a single plane. In particular, the runner 32 has such an embodiment that it has a component oriented perpendicular to the plane 38, at least in regions. In this manner, it is possible to change the orientation of the individual mirror 24, without an additional actuator, by way of displacing the carriage 33 along the runner 32.

Figure 40:
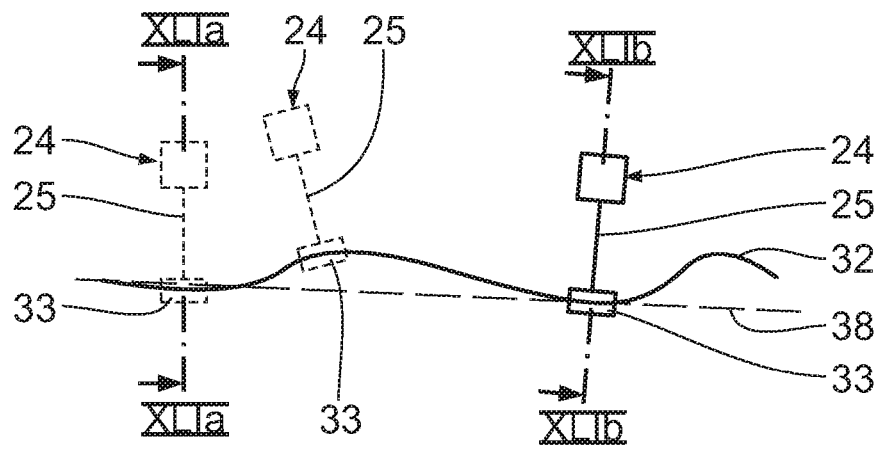
Figure 41:
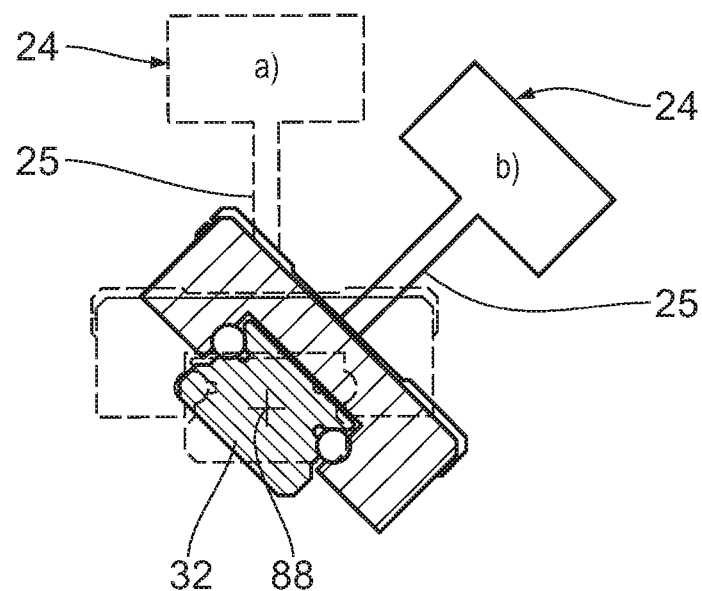

FIG. 40 shows three different positions in an exemplary manner, the positionings having different alignments of the positioning element 25. Moreover, it is possible to set the orientation of the individual mirrors 24 about an axis 88 aligned perpendicular to the longitudinal direction of the positioning elements 25 by way of a twist of the runner, as depicted schematically in FIG. 41. For the purposes of elucidating this concept, two different positionings a) and b) of the positioning elements 25 with the individual mirror 24 are depicted in an exemplary manner.

The runner 32 can, in general, be embodied in accordance with the rail of a roller coaster.

Further details of the individual mirrors 24 are described below. The following details relate, in particular, to the adjustability of the individual mirrors 24, in particular of the plugs 60, and the mechanisms provided to this end. Below, they are described, in particular, for the embodiments depicted in general in FIGS. 2a and 26, in which the mirror body 21 has radiation-transmissive regions 26. Accordingly, they are also applicable to the remaining embodiments.

The mechanisms for adjusting the individual mirrors 24, in particular the plugs 60, have a high precision. In particular, they enable an adjustability of the individual mirrors 24, in particular of the plugs 60, with the precision in the sub-micrometer range, in particular with a precision of better than 100 nm, in particular better than 50 nm, in particular better than 30 nm, in particular better than 20 nm, in particular better than 10 nm, in particular better than 5 nm, in particular better than 3 nm, in particular better than 2 nm and in particular better than 1 nm.

In general, the mechanisms are low maintenance, in particular maintenance-free.

In particular, they are suitable for vacuum or encapsulated in such a way that they are suitable for vacuum.

Furthermore, they are insensitive to atomic hydrogen. They include no outgassing substances which could lead to contamination of the EUV optics. They are thus are outgassing-free or encapsulated in such a way that they are suitable for vacuum.

Further details about the actuators for displacing the individual mirrors 24 and/or the plugs 60 and/or the reflectors 65 are described below in note form. In particular, piezo-drives and/or Lorentz actuators are suitable as actuators. In particular, such actuators are suitable for vacuum.

If use is made of a piezo-drive, it is possible either to directly use the movement of a piezo-module or to use a plurality of piezo-modules for a stepper drive referred to as coupler. Hence, both rotational and translational movements are possible herewith.

Lorentz actuators, in particular with a coil-magnet arrangement, can serve to realize linear and/or rotational movements.

In particular, the actuators have an encapsulated embodiment. Encapsulated electric motors, in particular disk rotors or stepper motors, can serve as actuators. Using these motors, it is possible, in particular, to generate a rotational movement. The rotational movement can be converted into a linear movement. To this end, provision can be made of spindles, cams, belt drives or a rack-and-pinion combination. Preferably, the components for converting the rotational movement into a linear movement have an encapsulated embodiment.

It is also possible to use magnets as pickups. This is also referred to as a magnetic coupling. In particular, the pickups can operate without abrasion.

The actuators can also be embodied as bimetal actuators. Such actuators can be locally heated in order to carry out swivel movements. By way of example, heating resistors, in particular heat coils, can serve for heating purposes.

Pre-tensioned spring elements can also serve for triggering movement. These can enable rotations and/or translations.

Provision can also be made of pneumatic and/or hydraulic actuators.

A further option consists of using shape memory alloys. These can change their shape by the action of heat. In particular, they have at least one predetermined shape and at least one further shape. The further shape can likewise be predetermined. It can also be undetermined. In particular, the rigid state of the shape memory alloy can be the first shape. The further shape can be given by a soft state of the shape memory alloy. In this case, there may be the occurrence of a tilting away due to weight or of a movement as a result of a different force, for example a spring force. A second predetermined state of the shape memory alloy can also cause a tilting away.

The shape memory alloys can also be actuated magnetically.

Capacitive actuators are also possible. These are provided, in particular, in the case of components which are very small.

Different guide types with kinematics which may be provided for a guided displacement of the individual mirrors 24 and/or the plugs 60 and/or the reflectors 65 are described below in an exemplary manner. In particular, the kinematics enable a guided displacement after the application of the force by the actuators or by gravity.

Flexures are provided in accordance with a preferred embodiment. In particular, these have a frictionless embodiment. In particular, they have an abrasion-free embodiment. In this case, no free particles which could lead to contamination, in particular of a mirror of the EUV optics, in particular of the illumination optical unit 4 or the projection optical unit 9, are generated during the displacement of the components.

In particular, the flexures are embodied without play. Therefore, they have a high precision.

In particular, they are embodied in such a way that no slip-stick effect occurs.

In particular, a single flexure enables a rotational movement. Linear movements are also realizable via a combination of flexures.

A plurality of magnetic bearings can also be provided. These operate in a contactless manner. They are substantially frictionless. In particular, they operate in an abrasion-free manner.

Furthermore, it is possible to provide antifriction bearings, in particular ball bearings, roller bearings or spherical roller bearings. In particular, the antifriction bearings can be arranged in the runner or runners 32 and/or in the carriage 33. They enable linear and/or rotational movements. They are very cost effective.

Lubricants suitable for vacuum are provided for lubricating the bearings.

In principle, it is also possible to provide sliding bearings.

It is also possible to provide air bearings, in particular encapsulated air bearings. By way of example, they are able to be used for shielding purposes in corrugated hoses or by way of additional suction which maintains the vacuum.

Below, exemplary embodiments for elucidating the displacement of the individual mirrors 24 and/or of the plugs 60 and/or of the reflectors 65 are described with reference to FIGS. 42 to 66. Identical components acquire the same reference signs as in the case of the above-described variants, to the description of which reference is hereby made.

The beam path of the illumination radiation depicted in the figures should be understood in a purely exemplary manner. It merely serves to elucidate the arrangement of the mirror device 20 relative to the reticle 7 and the radiation source 3.

The displacement of the individual mirrors 24 and/or of the plugs 60 and/or of the reflectors 65 is only depicted schematically in the figures. In particular, it is effected with the aid of the actuators and/or kinematic systems described above.

Figure 42:
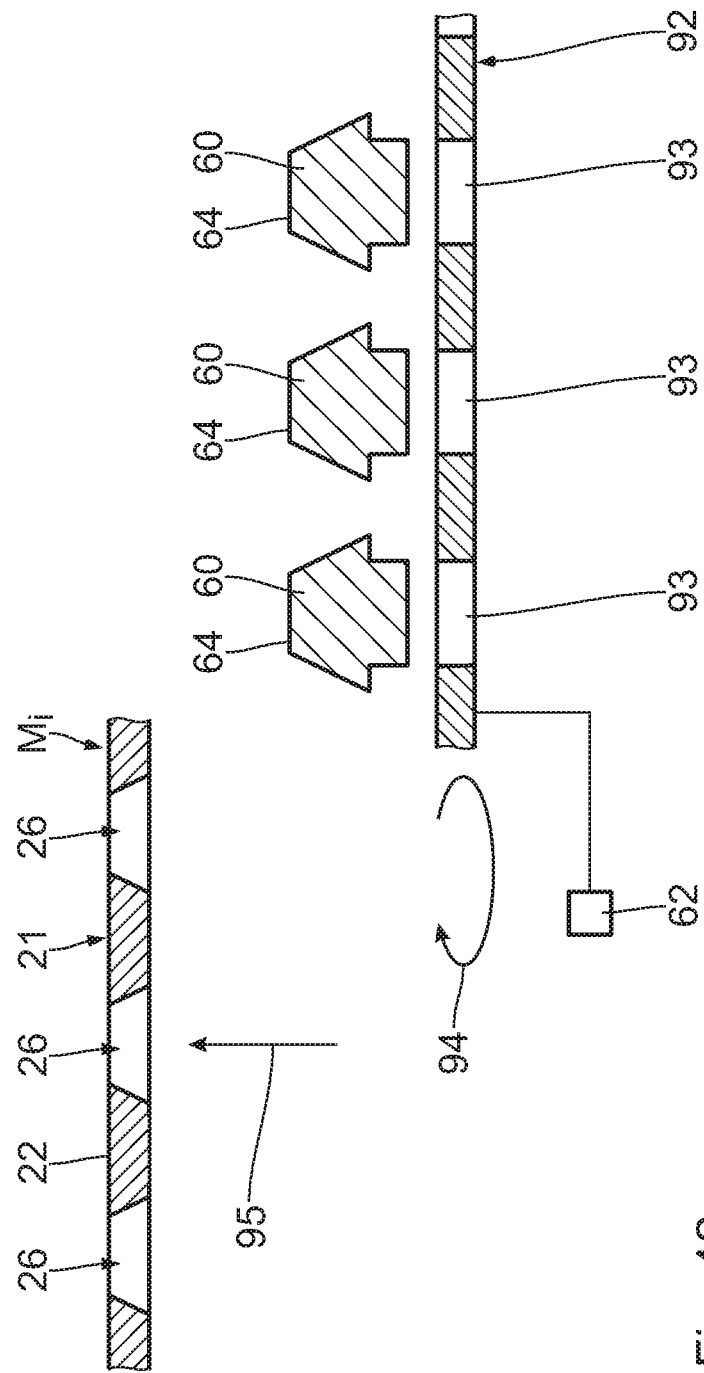
FIG. 42 shows a schematic illustration of a variant of the mirror device in accordance with FIG. 26, FIGS. 43a and 43b show schematic illustrations of the mirror device in accordance with FIG. 42 for different settings.

In the embodiment depicted in FIG. 42, the plugs 60 for closing the radiation-transmissive regions 26 are initially arranged in or on a pick-and-place container 92. In particular, the pick-and-place container 92 forms a holding device for the plugs 60.

The pick-and-place container 92 has holding openings 93 for receiving the plugs 60. The arrangement of the holding openings 93 in the pick-and-place container 92 is adapted to the arrangement of the radiation-transmissive regions 26 in the mirror body 21. In particular, the pick-and-place container 92 is embodied in such a way that it can be arranged relative to the mirror body 21 in such a way that the holding openings 93 are flush in each case with one of the radiation-transmissive regions 26. In particular, provision can be made of precisely one holding opening 93 in the pick-and-place container 92 for each one of the radiation-transmissive regions 26.

Via the pick-and-place container 92, it is possible to insert a multiplicity of plugs 60 into the radiation-transmissive regions 26 at the same time. This can be effected via the actuator 62. For the purposes of arranging the plugs 60 in the radiation-transmissive regions 26, provision can be made, in particular, for the pick-and-place container 92 to be initially swiveled-in via a rotational movement 94. Subsequently, the plugs 60 can be inserted into the radiation-transmissive regions 26 via a translational movement 95.

In particular, an encapsulated electric motor with an antifriction bearing is provided for the rotational movement 94. As a result, large ranges of motion are possible.

In particular, a piezo-drive or Lorentz actuator can be provided for the translational movement 95, which is also referred to as a linear movement. In particular, the translational movement 95 can be guided by flexures.

Figure 43A:
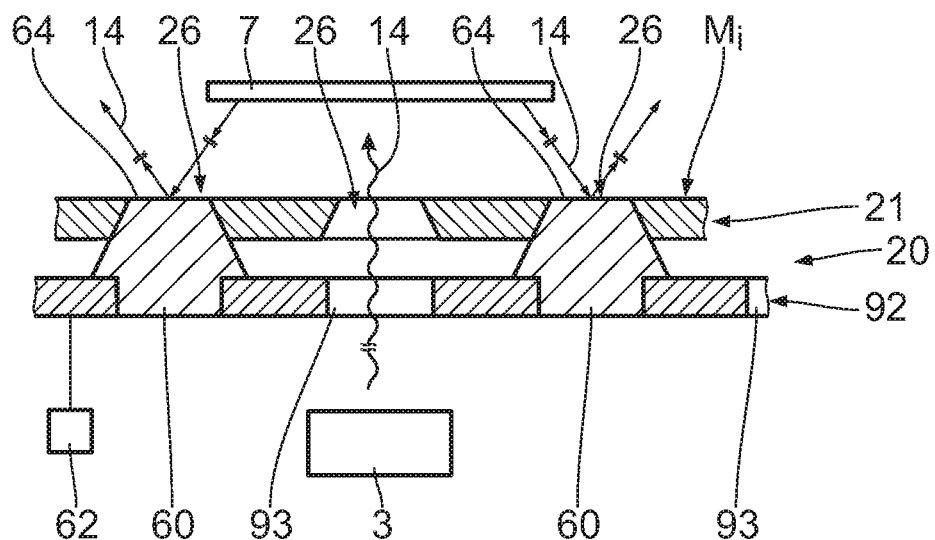
Figure 43B:
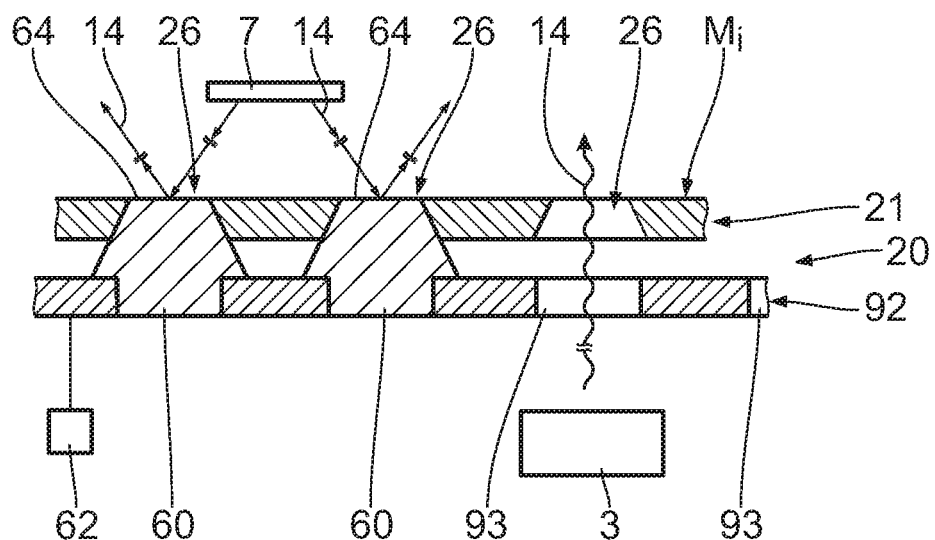

FIGS. 43a and 43b depict two different settings in an exemplary manner, in which different radiation-transmissive regions 26 are closed by plugs 60.

Since arranging the plugs 60 in the pick-and-place container 92 is possible in advance, it is possible to switch to-and-fro between these settings in a simple manner and/or within a short period of time. In particular, provision can be made for more than one pick-and-place container 92 to be provided.

Figure 44A:
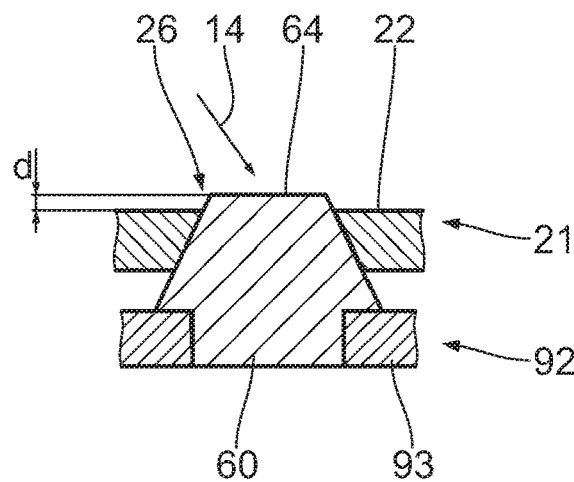
FIGS. 44a to 44c show schematic illustrations for elucidating different insertion positions of the mirror elements in passage openings of a mirror body.
Figure 44B:
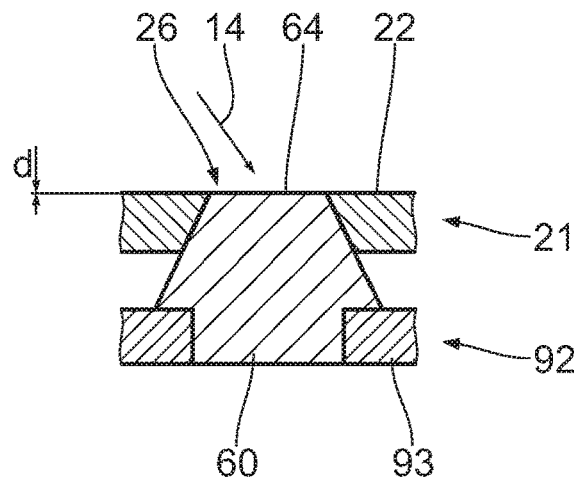
Figure 44C:
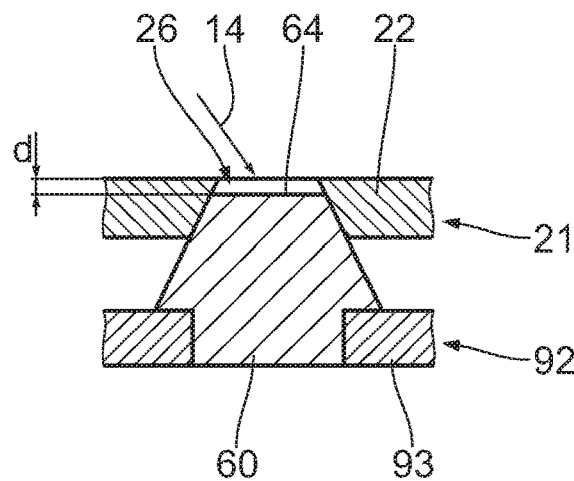

As depicted in an exemplary manner in FIGS. 44a, 44b and 44c, the plugs 60 can be embodied and/or arranged in the radiation-transmissive regions 26 in such a way that, in the inserted state, they project beyond the respectively adjacent region of the reflection surface 22 (FIG. 44a), terminate flush thereto (FIG. 44b) or are offset to the rear relative thereto (FIG. 44c). In the arrangement in accordance with FIG. 44b, the reflection surface 64 of the plug 60 just leads to a continuous continuation of the reflection surface 22 of the mirror body 21. In the arrangements in accordance with FIGS. 44a and 44c, there is a positive or a negative offset between the reflection surface 64 of the plug 60 and the reflection surface 22 of the mirror body 21.

A path difference of the illumination radiation 14, and hence a phase difference, can be produced and/or adjusted by the relative arrangement and/or adjustment of the plug 60 relative to the reflection surface 22 of the mirror body 21.

Figure 45A:
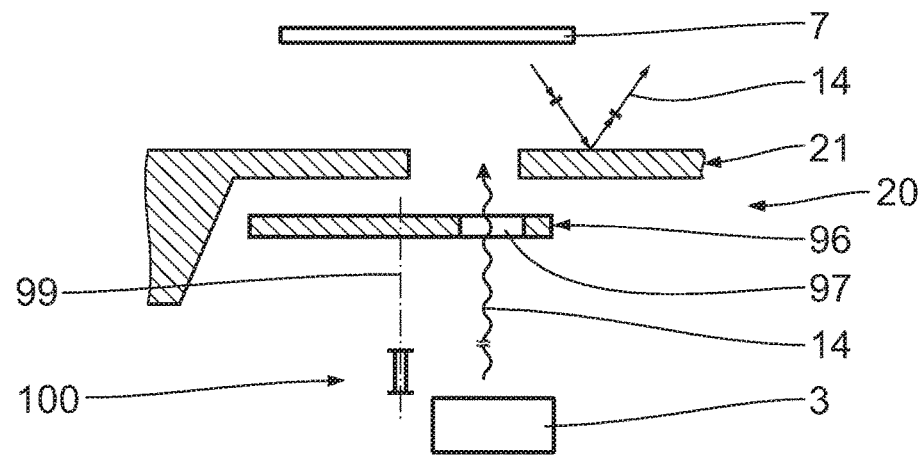
FIGS. 45a and 45b show schematic illustrations of a further variant of a mirror device, in which a passage opening is variably closable with the aid of a rotatably mounted plate.
Figure 45B:
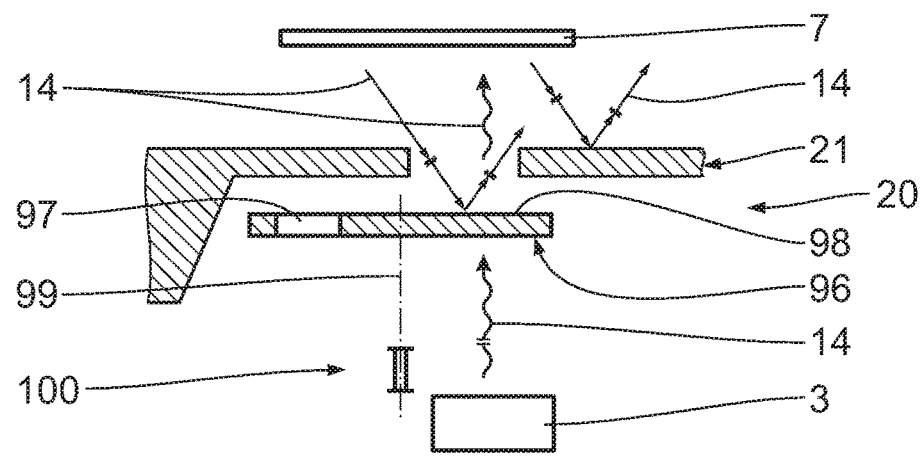

In the embodiment depicted in an exemplary manner in FIGS. 45a and 45b, a plate 96 is arranged adjacent to a radiation-transmissive region 26. The plate 96 has passage openings 97. It has at least one passage opening 97. In particular, it can also have two or more passage openings 97.

The plate 96 moreover has a radiation-reflecting region 98. The radiation-reflecting region 98 is arranged on the side of the plate 96 facing the radiation-transmissive region 26.

The plate 96 has a disk-shaped embodiment. In particular, it can have a round, in particular circle-shaped embodiment.

Figure 46:
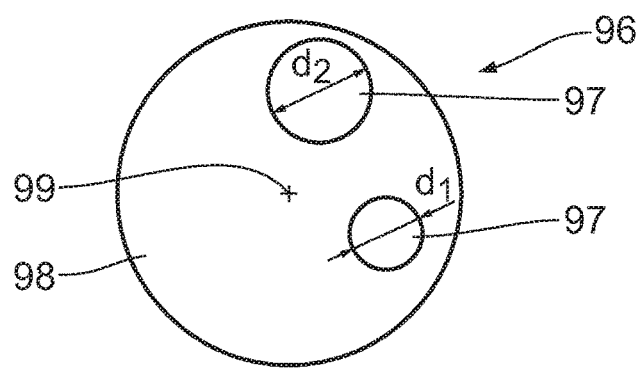
FIG. 46 shows a plan view of the plate in accordance with FIGS. 45a and 45b, FIGS. 47a and 47b show a schematic illustration of a further variant of a mirror device with a variably closable passage opening.

A view of the plate 96 is depicted in FIG. 46 in an exemplary manner. In this exemplary embodiment, the plate 96 has two passage openings 97. The passage openings 97 have different diameters. This allows an adaptation to the size of the pupil spots, in particular to the size of the radiation source 3.

In particular, the plate 96 is rotatably mounted. It is rotatably mounted about an axis of rotation 99. In particular, the axis of rotation 99 is aligned perpendicular to the plane 96, in particular perpendicular to the radiation-reflecting region 98. It can extend centered or off-centered relative to the plate 96.

The rotational movement which enables the swiveling-in and/or a rotation of the plate 96 about the axis of rotation 99 is realized by Lorentz actuators and flexures. The actuator system is only depicted schematically in FIGS. 45a and 45b. It is provided with a reference sign 100.

Figure 47A:
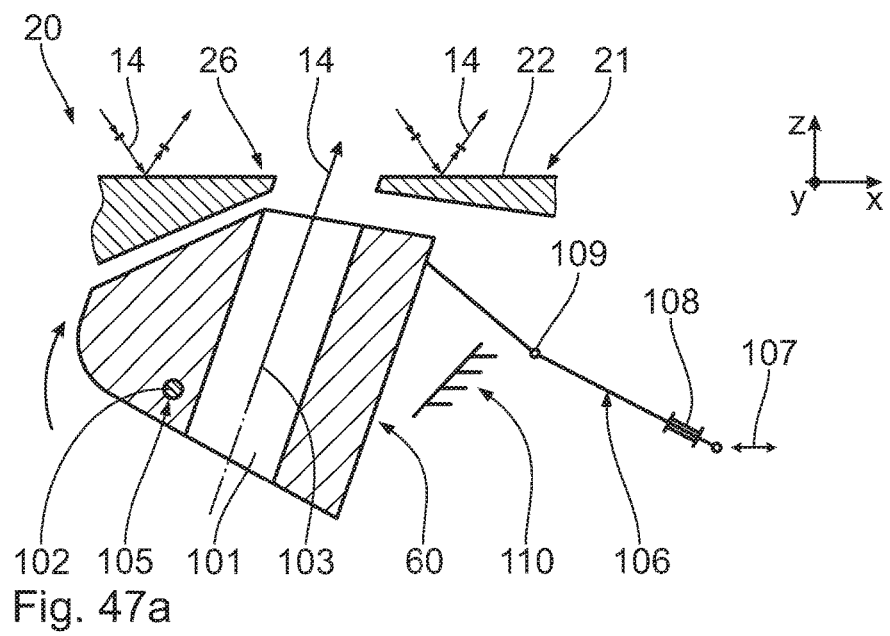
Figure 47B:
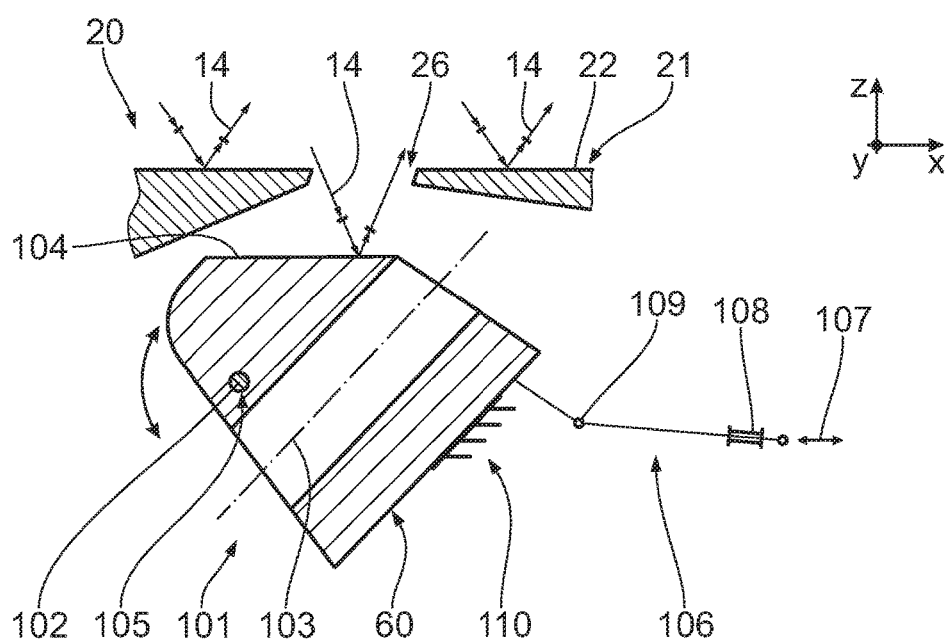
Figure 50:
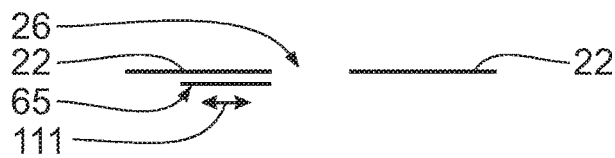
FIGS. 50 to 70 show schematic illustrations of further variants of mirror devices with variably closable passage openings, wherein different forms of the actuator system and/or different kinematics are provided for closing the passage openings.
Figure 51:
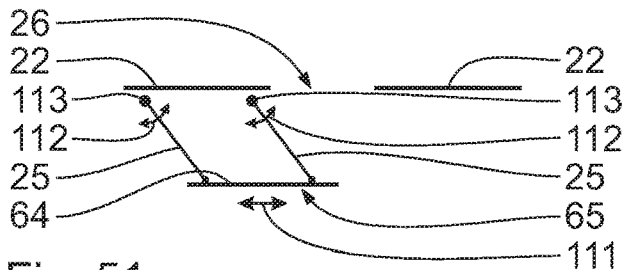
Figure 52:
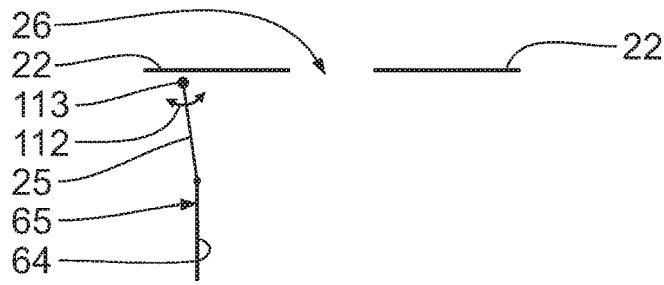

FIGS. 47a and 47b depict a variant in which the plug 60 itself has a passage opening 101. In particular, the passage opening 101 has a diameter corresponding to that of the radiation-transmissive region 26. The plug 60 is swivelable about an axis 102 which is aligned perpendicular to the longitudinal direction 103 of the passage opening 101. In the Cartesian coordinate system depicted in the figures, the rotational movement can be effected by a combination of the rotation about the x-axis and the y-axis. The radiation-transmissive region 26 can be closed by swiveling the plug 60. In particular, it is closed by a radiation-reflecting region 104 on the plug 60. The radiation-reflecting region 104 has dimensions which are at least as large as those of the radiation-transmissive region 26.

For the purposes of swiveling the plug 60, the latter is provided with a swivel joint 105.

Moreover, for the purposes of actuating the plug 60, provision is made of an actuator device 106 with a linear actuator 107, a sliding joint 108, a joint 109 and a stop 110.

Like in the variants in accordance with one of FIGS. 50, 55, 58a, 58b, 59 and 62, provision is made in the variant in accordance with FIG. 48 of a linear movement 111 for inserting the plug 60 into the radiation-transmissive region 26, or for removing it from the latter. To this end, suitable actuators and kinematic systems are selected from the selection described above in accordance with the available installation space and on the basis of the mirror dimensions.

In place of the linear movement 111, provision can also be made of a swiveling movement 112 for the purposes of swiveling the plug 60 or the reflector 65 in or out. Different variants are depicted in an exemplary manner in FIGS. 49a, 49b, 51, 52, 53a, 53b, 54, 56, 60, 63 and 70. Here, swivel joints 113 and positioning elements 25 are depicted in an exemplary manner in the figures.

Even if this does not emerge immediately and clearly from the figures, the joints 113 and the positioning elements 25 are respectively arranged relative to the reflectors 65 and relative to the radiation-transmissive regions 26 in such a way that they do not lead to an obscuration of the reflection surface 64, even in the limited state of the reflector 65.

Figure 53A:
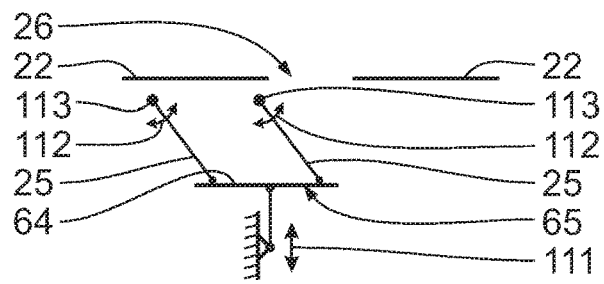
Figure 53B:
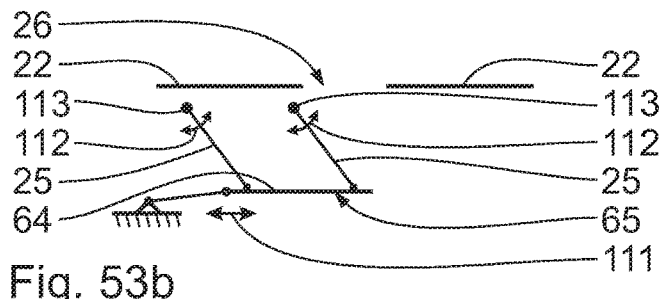
Figure 54:
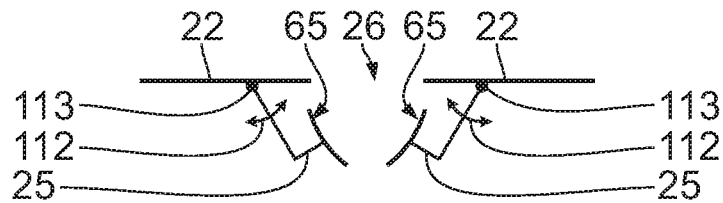
Figure 55:
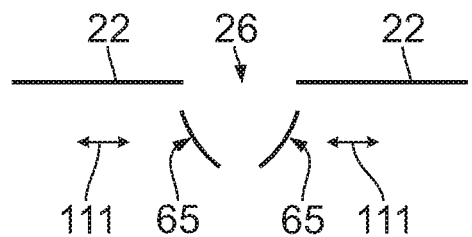
Figure 56:
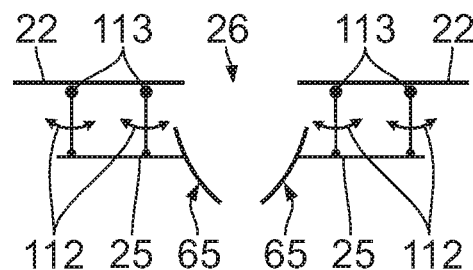
Figure 57:
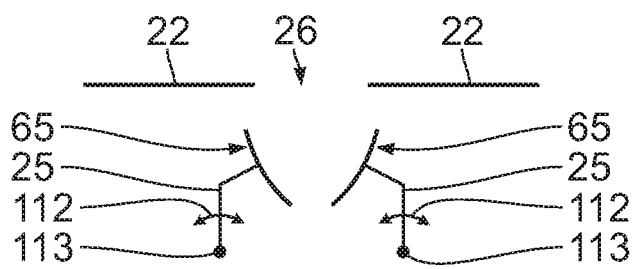
Figure 58A:
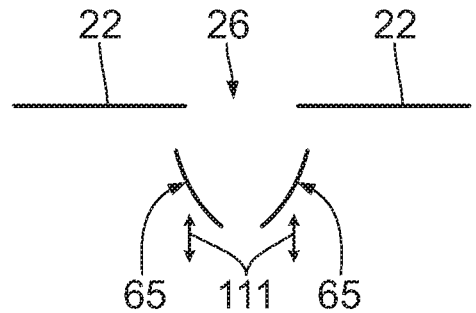
Figure 58B:
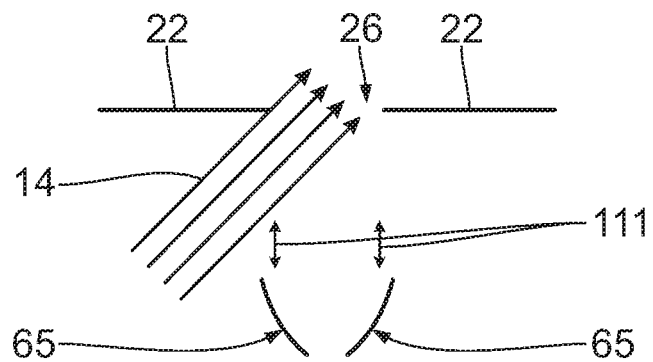

As depicted in an exemplary manner in FIGS. 53a and 53b, a swivel movement 112 can also be actuated by a linear movement 111. As a result of this, an adaptation of the actuator system to the available installation space is possible.

Figure 59:
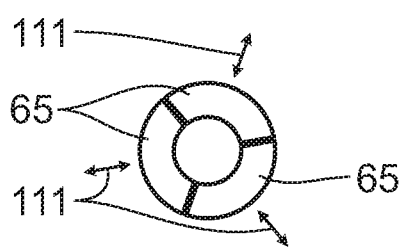

Three reflectors 65 are provided in accordance with the embodiment depicted in FIG. 59. They have a circular-ring-portion-shaped embodiment. They are displaceable in the radial direction. A different subdivision of the circular ring, for example by two, four or more circular ring portions, is likewise possible.

Figure 60:
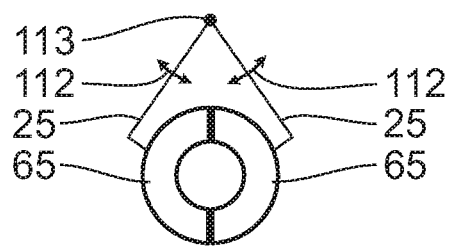

A variant with two circular-ring-portion-shaped reflectors 65 is depicted in FIG. 60 in an exemplary manner. In this variant, the reflectors 65 are swivelably mounted via the swivel joint 113.

Figure 61:
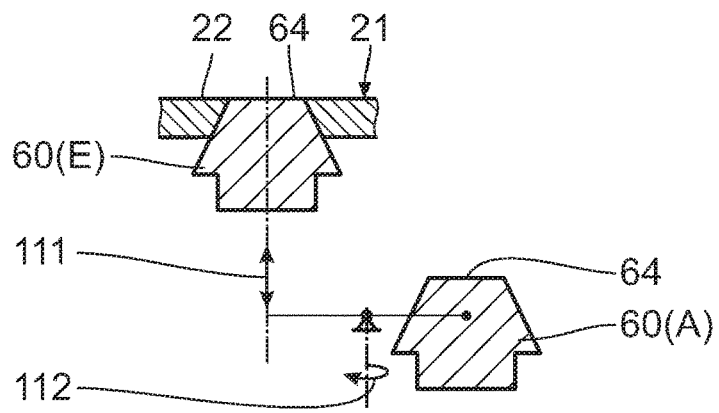
Figure 62:
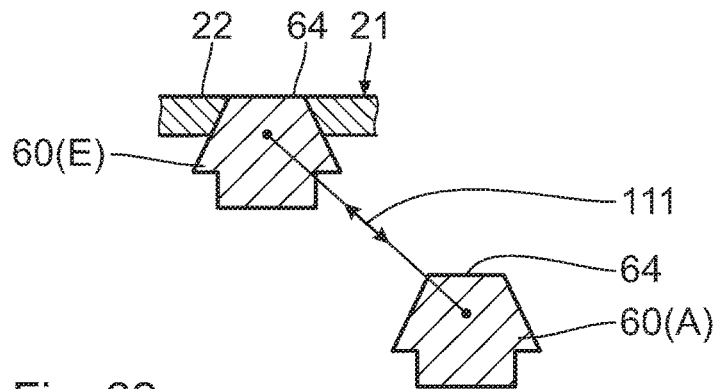
Figure 63:
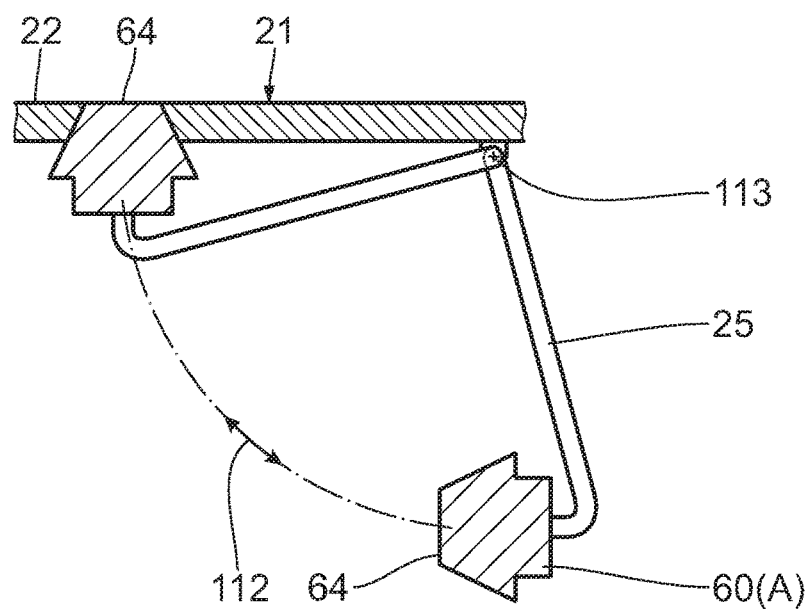

The variant depicted in FIG. 61 substantially corresponds to the variant in accordance with FIG. 42, wherein the plugs 60 are in each case swiveled into the associated radiation-transmissive regions 26 and lowered on an individual basis. A pick-and-place container 92 is dispensed with in this variant. In FIG. 61, the plug 60 is depicted, in an exemplary manner, in both the swiveled-out position (A) and in the swiveled-in position (E).

Figure 64:
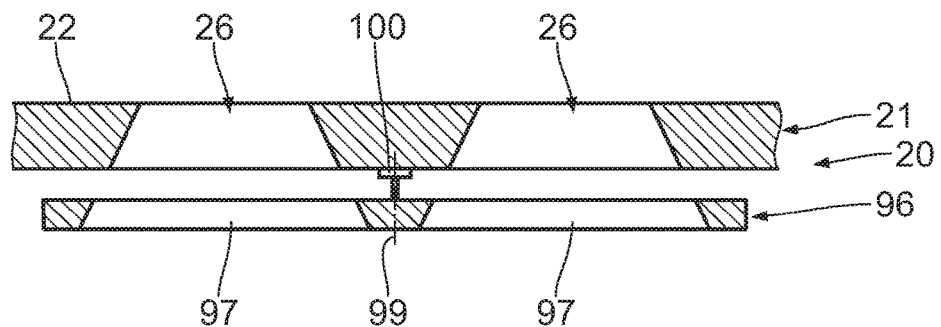

The embodiment in accordance with FIG. 64 substantially corresponds to the one depicted in FIGS. 45a and 45b. In the embodiment in accordance with FIG. 64, the plate 96 has two passage openings 97. These are arrangeable flush with two radiation-transmissive regions in the mirror body 21. In this variant, the actuator system 100 for twisting the plate 96 is arranged on the rear side of the mirror body 21. In particular, it has a mechanical connection with the mirror body 21.

In this variant, the passage openings 97 have a conical embodiment. In particular, they are embodied in such a way that they form a continuation of the passage openings which form the radiation-transmissive regions 26. This is also possible in other variants.

Figure 69:
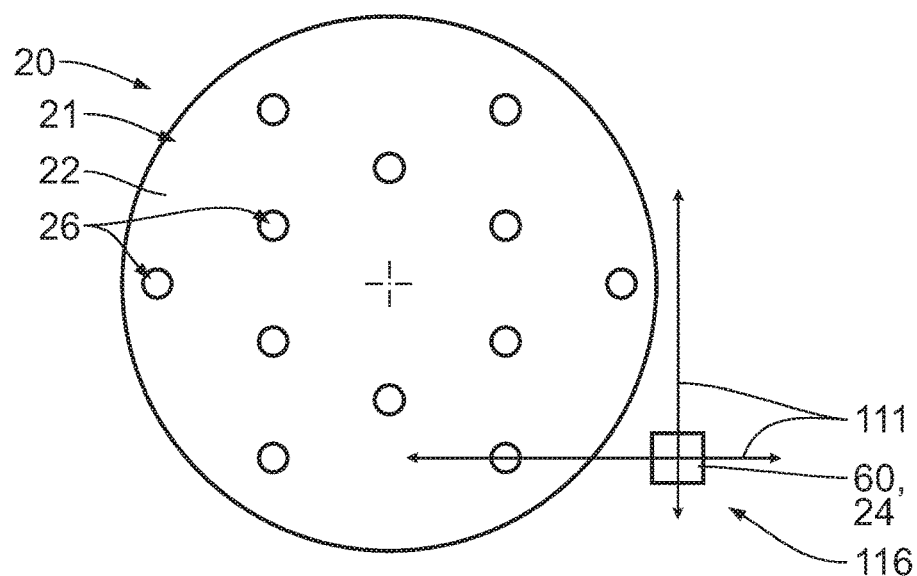
Figure 70:
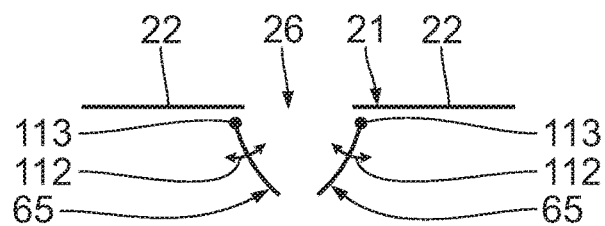

As depicted in an exemplary manner in FIG. 69, provision can also be made of an xyz-displacement table 116 or a plurality of xyz-displacement tables, which contain linear drives in accordance with the description above. These enable the positioning of securely assembled individual mirrors 24 or plugs 60 or reflectors 65, in particular in the radiation-transmissive regions 26, in particular at different positions.

In particular, the xyz-displacement table 116 can be used in place of a robotic arm.

As an alternative thereto, the plugs 60 can be inserted individually into the radiation-transmissive regions 26 in the mirror body 21 via an xyz-displacement table 116. To this end, provision can be made of a gripper, which picks up the plugs 60 and places them at the desired position.

Figure 65:
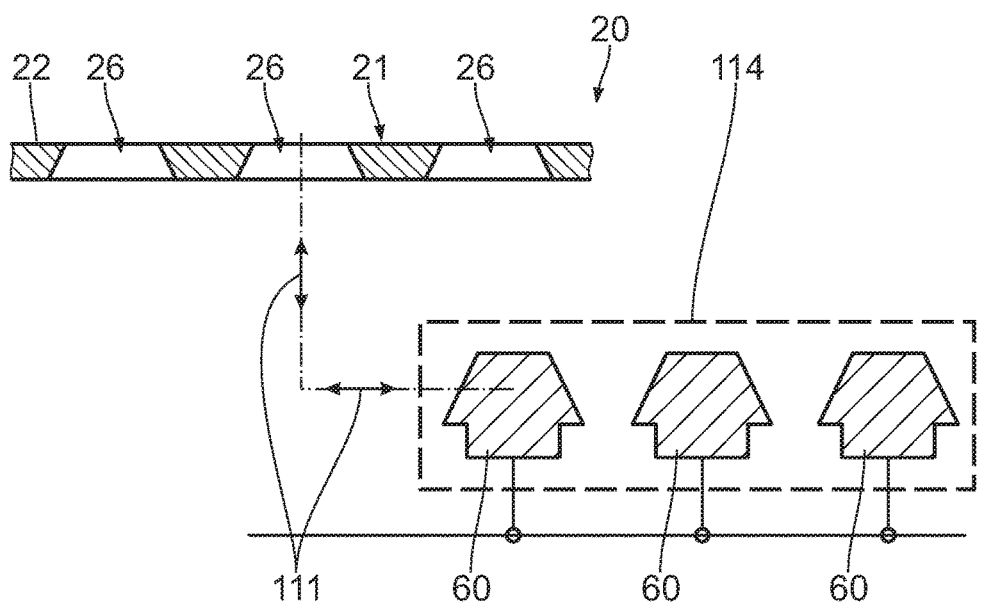

In accordance with the variant depicted in FIG. 65, the plugs 60 are arranged in a cartridge 114. Via a robot not depicted in any more detail, they can be removed from the cartridge 114 and inserted into the radiation-transmissive regions 26 in the mirror body 21. Preferably, the plugs 60 are embodied in such a way that it is possible to latch these in the radiation-transmissive regions 26. In particular, it is possible to latch these in the mirror body 21.

Figure 66:
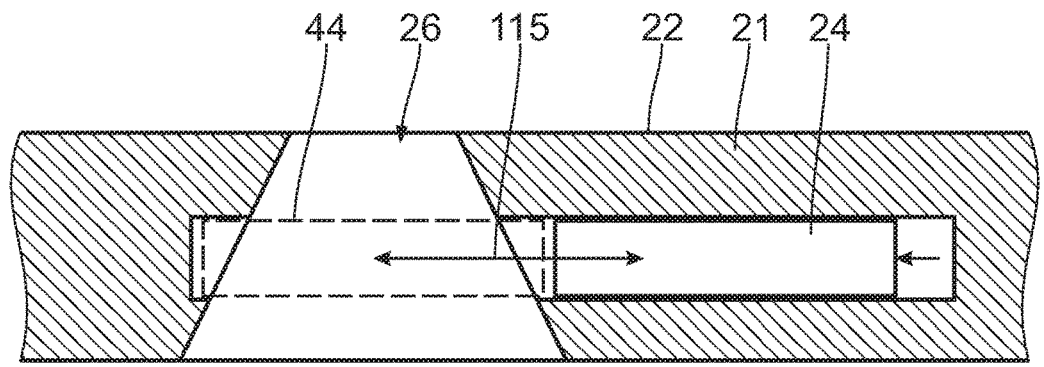

In accordance with the variant depicted in FIG. 66, the individual mirrors 24 are integrated into the mirror body 21. In particular, it is possible to shift these parallel to the reflection surface 22 of the mirror body 21. In particular, an electromagnet can be provided for shifting purposes.

The individual mirrors 24 each have a linear guide 115, which is indicated schematically in FIG. 66.

When arranging the individual mirror 24 in the radiation-transmissive region 26 (depicted by a dashed line), the individual mirror 24 closes the radiation-transmissive region 26. In this position, the reflection surface 44 of the individual mirror 24 is arranged offset to the reflection surface 22 of the mirror body 21.

Figure 67A:
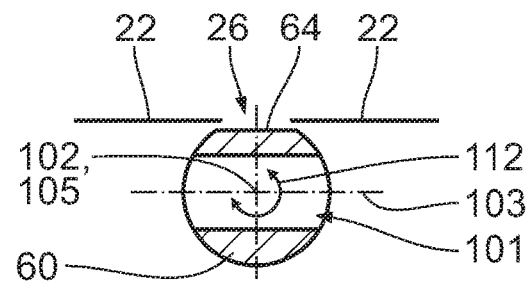
Figure 67B:
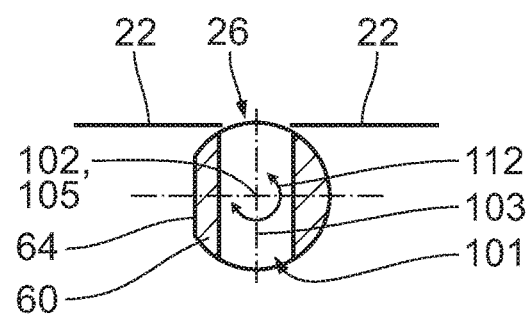

The variant in accordance with FIGS. 67a and 67b substantially corresponds to the variant in accordance with FIGS. 47a and 47b. In the variant in accordance with FIGS. 67a and 67b, the swivel joint 105 is arranged centrally relative to the radiation-transmissive region 26. However, it can also be arranged off-centered. It is possible to dispense with the actuator device 106 in the variant in accordance with FIGS. 67a and 67b.

Figure 68:
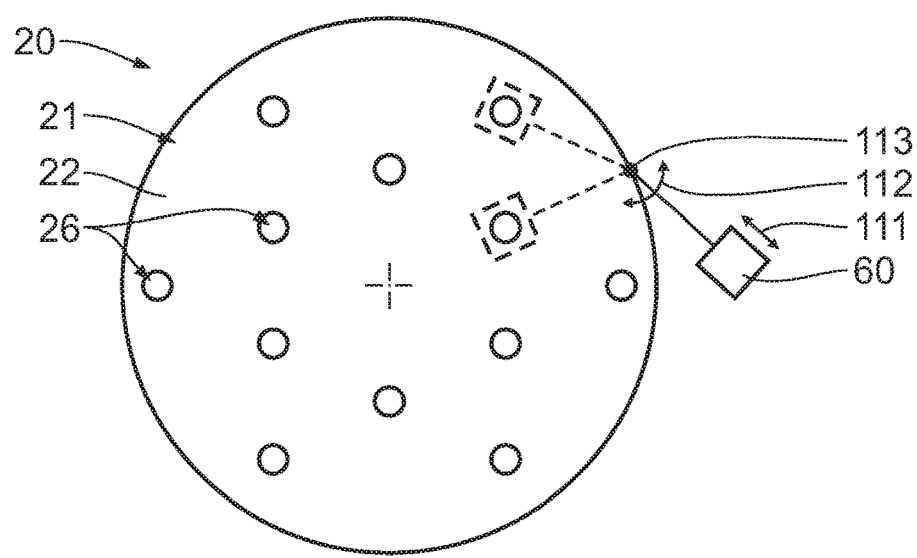

In the variant in accordance with FIG. 68, the plug 60 is swivelable and linearly displaceable. This variant is particularly also suitable for displacing the individual mirrors 24 which are positioned in the region in front of the mirror body 21.

In particular, the swivel joint 113 can also be a multi-axis joint, i.e. a joint with at least two swivel degrees of freedom. In particular, it can enable swiveling of the plug 60 in a plane parallel to the reflection surface 22 of the mirror body 21 and about an axis parallel thereto.

The number of radiation-transmissive regions 26 and plugs 16 depicted in the figures do not correspond to the actual conditions. In this respect, reference should be made to the description above.

Combinations of the variants schematically depicted in the figures are likewise possible.

What is claimed is:

1. An optical component, comprising:
   a multiplicity of variably positionable beam-guiding elements;
   a mechanical guide device; and
   a displaceable positioning element configured to be guided by the guide device to position at least one beam-guiding element,
   wherein:
      along a normal direction is such that an image of the guide device is in a plane without intersection with a circular ring area for a perpendicular projection along the normal direction;
      at least one the beam-guiding element is assigned to the positioning element;
      the at least one beam-guiding element is variably positionable via the positioning element; and
      each beam-guiding element is displaceable into at least one reflection position so that an image of the beam-guiding element in the reflection position at least partly overlaps with the circular ring area for the perpendicular projection along the normal direction.

2. The optical component of claim 1, wherein the beam-guiding element has an adjustable orientation, and a maximum angle between a normal of one of the beam-guiding element and the normal direction is at most 30°.

3. The optical component of claim 1, wherein the guide device comprises a guide rail along which the positioning element is slidable.

4. The optical component of claim 1, wherein:
   the optical component comprises a multiplicity of mechanical guide devices and a multiplicity of displaceable positioning elements;
   each positioning element is configured to be guided by the guide device to position at least one beam-guiding element; and
   each beam-guiding element is assigned to a corresponding positioning element such that the beam-guiding element is variably positionable via the corresponding positioning element.

5. A unit, comprising:
   a facet mirror comprising an optical component according to claim 1,
   wherein the unit is an illumination optical unit.

6. A system, comprising:
   a radiation source; and
   an illumination optical unit comprising a facet mirror,
   wherein the facet mirror comprises an optical component according to claim 1, and the system is a projection exposure illumination system.

7. A unit, comprising:
   an optical component according to claim 1,
   wherein the unit is a projection optical unit.

8. The unit of claim 7, wherein the optical element is near a pupil.

9. An optical system, comprising:
   an illumination optical unit configured to transfer illumination radiation to an object field; and
   a projection optical unit configured to image the object field into an image field,
   wherein the optical system comprises the optical component according to claim 1.

10. An apparatus, comprising:
a radiation source; and
an optical system, comprising:
an illumination optical unit configured to transfer illumination radiation to an object field; and
a projection optical unit configured to image the object field into an image field,
wherein the optical system comprises an optical component according to claim 1.

11. A method of using an optical system comprising an illumination optical unit and a projection optical unit, the method comprising:
using the illumination optical unit to illuminate at least a portion of a reticle; and
using the projection optical unit to project at least a portion of the illuminated onto a light-sensitive material,
wherein the optical system comprises an optical component according to claim 1.

12. A mirror device, comprising:
a mirror comprising reflection surface; and
an optical component according to claim 1 and/or a beam guiding element capable of being placed onto a body of the mirror,
wherein: a maximum distance between the beam-guiding elements in the reflection position and the reflection surface is at most 3 cm in the normal direction.

13. The mirror device of claim 12, wherein a totality of the beam-guiding elements has a total surface area for the perpendicular projection along the normal direction, and a ratio of the total surface area to the reflection surface of the mirror is at most 1:10.

14. The mirror device of claim 12, further comprising an actuator system connecting the beam-guiding elements to the reflection surface.

15. An optical system, comprising:
an illumination optical unit configured to transfer illumination radiation along a first beam path to an object field; and
a projection optical unit configured to image the object field along a second beam path into an image field,
wherein:
the optical system comprises a mirror device according to claim 12;
the beam-guiding elements are in the first beam path; and
the reflection surface is in the second beam path.

16. An apparatus, comprising:
a radiation source; and
an optical system, comprising:
an illumination optical unit configured to transfer illumination radiation along a first beam path to an object field; and
a projection optical unit configured to image the object field along a second beam path into an image field,
wherein the optical system comprises a mirror device according to claim 12;
the beam-guiding elements are in the first beam path; and
the reflection surface is in the second beam path.

17. A method of using an optical system comprising an illumination optical unit and a projection optical unit, the method comprising:
using the illumination optical unit to illuminate at least a portion of a reticle; and
using the projection optical unit to project at least a portion of the illuminated onto a light-sensitive material,
wherein the optical system comprises a mirror device according to claim 12.

18. The optical component of claim 1, wherein the beam-guiding elements comprise mirrors.

19. The optical component of claim 1, wherein each beam-guiding element is positionable independent of the other beam-guiding elements.

* * * * *

UNITED STATES PATENT AND TRADEMARK OFFICE
CERTIFICATE OF CORRECTION

PATENT NO. : 10,133,183 B2  
APPLICATION NO. : 15/257020  
DATED : November 20, 2018  
INVENTOR(S) : Michael Patra et al.

Page 1 of 1

It is certified that error appears in the above-identified patent and that said Letters Patent is hereby corrected as shown below:

In the Specification

Column 1, Line 65, delete "direction" and insert -- direction. --.

Column 2, Line 44, delete "embodiment" and insert -- embodiment. --.

Column 24, Line 33, delete "$32_1$." and insert -- $32_i$. --.

In the Claims

Column 38, Line 18, Claim 1, delete "at least one the" and insert -- at least one --.

Signed and Sealed this  
Second Day of April, 2019

Andrei Iancu  
*Director of the United States Patent and Trademark Office*